US012804901B2

(12) United States Patent
Tokita et al.

(10) Patent No.: US 12,804,901 B2
(45) Date of Patent: Nov. 17, 2026

(54) MULTI-TIER MEMORY DEVICE WITH DIFFERENT WIDTH CENTRAL STAIRCASE REGIONS IN DIFFERENT VERTICAL TIERS AND METHODS FOR FORMING THE SAME

(71) Applicant: Sandisk Technologies, Inc., Milpitas, CA (US)

(72) Inventors: Hirofumi Tokita, Yokkaichi (JP); Akihisa Sai, Yokkaichi (JP)

(73) Assignee: Sandisk Technologies, Inc., Milpitas, CA (US)

( * ) Notice: Subject to any disclaimer, the term of this patent is extended or adjusted under 35 U.S.C. 154(b) by 488 days.

(21) Appl. No.: 18/347,858

(22) Filed: Jul. 6, 2023

(65) Prior Publication Data

US 2024/0121959 A1 Apr. 11, 2024

Related U.S. Application Data

(60) Provisional application No. 63/378,534, filed on Oct. 6, 2022.

(51) Int. Cl.
*H10B 43/27* (2023.01)
*H10B 41/27* (2023.01)

(52) U.S. Cl.
CPC ............. *H10B 43/27* (2023.02); *H10B 41/27* (2023.02)

(58) Field of Classification Search
None
See application file for complete search history.

(56) References Cited

U.S. PATENT DOCUMENTS

| | | | |
|---|---|---|---|
| 5,915,167 | A | 6/1999 | Leedy |
| 10,115,681 | B1 | 10/2018 | Ariyoshi |
| 11,081,443 | B1 | 8/2021 | Mizutani et al. |
| 11,114,459 | B2 | 9/2021 | Iwai et al. |
| 11,132,252 | B2 | 9/2021 | Ito et al. |

(Continued)

OTHER PUBLICATIONS

ISR—Notification of Transmittal of The International Search Report and Written Opinion of the International Searching Authority for International Patent Application No. PCT/US2023/075153, mailed Jan. 19, 2024, 9 pages.

(Continued)

*Primary Examiner* — Sue A Purvis
*Assistant Examiner* — Carnell Hunter, III
(74) *Attorney, Agent, or Firm* — THE MARBURY LAW GROUP PLLC

(57) ABSTRACT

A memory device includes alternating stacks of insulating layers and electrically conductive layers that are laterally spaced apart from each other along a second horizontal direction, laterally extend along the first horizontal direction through an inter-array region, a first memory array region and a second memory array region that is laterally spaced apart along the first horizontal direction from the memory array region by the inter-array region. Each electrically conductive layer within the alternating stacks has a respective bridge region having a respective strip width along the second horizontal direction within the inter-array region, and the strip width of a topmost electrically conductive layer in a first-tier alternating stack is smaller than the strip width of a topmost electrically conductive layer in a second-tier alternating stack which overlies the first-tier alternating stack.

7 Claims, 34 Drawing Sheets

(56) References Cited

U.S. PATENT DOCUMENTS

| | | | | |
|---|---|---|---|---|
| 11,139,237 | B2 | 10/2021 | Shao et al. | |
| 11,322,440 | B2 | 5/2022 | Kubo | |
| 11,342,245 | B2 | 5/2022 | Cui et al. | |
| 11,355,506 | B2 | 6/2022 | Tokita et al. | |
| 11,367,736 | B2 | 6/2022 | Tokita et al. | |
| 11,450,685 | B2 | 9/2022 | Yoshida | |
| 11,532,570 | B2 | 12/2022 | Mizuno et al. | |
| 2021/0057336 | A1 | 2/2021 | Shao et al. | |
| 2021/0134827 | A1 | 5/2021 | Iwai et al. | |
| 2021/0193676 | A1 | 6/2021 | Zhang et al. | |
| 2021/0242128 | A1* | 8/2021 | Ito | H10B 41/10 |
| 2021/0366808 | A1 | 11/2021 | Cui et al. | |
| 2021/0366920 | A1 | 11/2021 | Tokita et al. | |
| 2021/0366924 | A1 | 11/2021 | Tokita et al. | |
| 2022/0102273 | A1 | 3/2022 | Kubo et al. | |
| 2022/0223607 | A1 | 7/2022 | Nakayama et al. | |
| 2022/0223614 | A1 | 7/2022 | Takuma et al. | |
| 2022/0254733 | A1 | 8/2022 | Mizuno et al. | |
| 2022/0285378 | A1 | 9/2022 | Larsen et al. | |
| 2022/0328403 | A1 | 10/2022 | Tobioka | |

OTHER PUBLICATIONS

IPRP—Notification Concerning Transmittal of International Preliminary Report on Patentability and Written Opinion of the International Searching Authority for International Patent Application No. PCT/US2023/075153, mailed Apr. 17, 2025, 8 pages.

Endoh et al., "Novel Ultra High-Density Memory with a Stacked-Surrounding Gate Transistor (S-SGT) Structured Cell," IEDM Proc. (2001) 33-36.

U.S. Appl. No. 17/226,321, filed Apr. 9, 2021, SanDisk Technologies LLC.

U.S. Appl. No. 17/244,258, filed Apr. 29, 2021, SanDisk Technologies LLC.

U.S. Appl. No. 17/244,311, filed Apr. 29, 2021, SanDisk Technologies LLC.

U.S. Appl. No. 17/397,678, filed Aug. 9, 2021, SanDisk Technologies LLC.

U.S. Appl. No. 17/397,777, filed Aug. 9, 2021, SanDisk Technologies LLC.

U.S. Appl. No. 17/397,846, filed Aug. 9, 2021, SanDisk Technologies LLC.

U.S. Appl. No. 17/406,463, filed Aug. 19, 2021, SanDisk Technologies LLC.

U.S. Appl. No. 17/411,689, filed Aug. 25, 2021, SanDisk Technologies LLC.

U.S. Appl. No. 17/411,726, filed Aug. 25, 2021, SanDisk Technologies LLC.

U.S. Appl. No. 17/556,298, filed Dec. 20, 2021, SanDisk Technologies LLC.

U.S. Appl. No. 17/810,097, filed Jun. 30, 2022, SanDisk Technologies LLC.

U.S. Appl. No. 17/810,124, filed Jun. 30, 2022, SanDisk Technologies LLC.

* cited by examiner

MULTI-TIER MEMORY DEVICE WITH DIFFERENT WIDTH CENTRAL STAIRCASE REGIONS IN DIFFERENT VERTICAL TIERS AND METHODS FOR FORMING THE SAME

FIELD

The present disclosure relates generally to the field of semiconductor devices, and particularly to multi-tier memory devices including different width central staircase regions in different vertical tiers and methods for forming the same.

BACKGROUND

A three-dimensional memory device including three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an embodiment of the present disclosure, a multi-tier memory device comprises a substrate and a plurality of tier structures located at multiple-tier levels that are vertically spaced from the substrate by different vertical spacings. Each of the plurality of tier structures comprises backside trench fill structures laterally extending through each of the plurality of tier structures along a first horizontal direction, and are laterally spaced apart from each other along a second horizontal direction, alternating stacks of insulating layers and electrically conductive layers that are laterally spaced apart from each other along the second horizontal direction by the backside trench fill structures, laterally extend along the first horizontal direction through an inter-array region, a first memory array region and a second memory array region that is laterally spaced apart along the first horizontal direction from the first memory array region by the inter-array region, and memory opening fill structures that vertically extend through each of the plurality of tier structures, wherein each of the memory opening fill structures comprises a respective vertical semiconductor channel and vertical stack of memory elements located at levels of the electrically conductive layers. Each of the alternating stacks includes stepped surfaces in the inter-array region, each electrically conductive layer within the alternating stacks has a respective bridge region having a respective strip width along the second horizontal direction within the inter-array region, and has a respective uniform width along the second horizontal direction greater than the strip width in the first memory array region, the second memory array region, and portions of the inter-array region located outside the bridge region, and the strip width of a topmost electrically conductive layer in a first-tier alternating stack is smaller than the strip width of a topmost electrically conductive layer in a second-tier alternating stack which overlies the first-tier alternating stack.

According to another aspect of the present disclosure, a method of forming a semiconductor device comprises forming a plurality of tier structures located at multiple-tier levels that are vertically spaced from the substrate by different vertical spacings. Each of the plurality of tier structures comprises alternating stacks of insulating layers and sacrificial material layers that laterally extend along the first horizontal direction through an inter-array region, a first memory array region and a second memory array region that is laterally spaced apart along the first horizontal direction from the first memory array region by the inter-array region, and memory opening fill structures that vertically extend through each of the plurality of tier structures, wherein each of the memory opening fill structures comprises a respective vertical semiconductor channel and vertical stack of memory elements located at levels of sacrificial material layers. The method also comprises forming backside trenches through the alternating stacks insulating layers and sacrificial material layers, replacing the sacrificial material layers with electrically conductive layers through the backside trenches to convert the alternating stacks of insulating layers and sacrificial material layer into alternating stacks of insulating layers and electrically conductive layers, and filling the backside trenches with backside trench fill structures that laterally extend through each of the plurality of tier structures along a first horizontal direction, and are laterally spaced apart from each other along a second horizontal direction. The electrically conductive layers are laterally spaced apart from each other along the second horizontal direction by the backside trench fill structures, each of the alternating stacks of insulating layers and electrically conductive layers includes stepped surfaces in the inter-array region, each electrically conductive layer within the alternating stacks of insulating layers and electrically conductive layers has a respective bridge region having a respective strip width along the second horizontal direction within the inter-array region, and has a respective uniform width along the second horizontal direction greater than the strip width in the first memory array region, the second memory array region, and portions of the inter-array region located outside the bridge region, and the strip width of a topmost electrically conductive layer in a first-tier alternating stack of insulating layers and electrically conductive layers is smaller than the strip width of a topmost electrically conductive layer in a second-tier alternating stack of insulating layers and electrically conductive layers which overlies the first-tier alternating stack of insulating layers and electrically conductive layers.

BRIEF DESCRIPTION OF THE DRAWINGS

FIG. 8A is a schematic vertical cross-sectional view of the exemplary structure along the vertical plane B-B' of FIG. 8A.

DETAILED DESCRIPTION

Figure 1A:
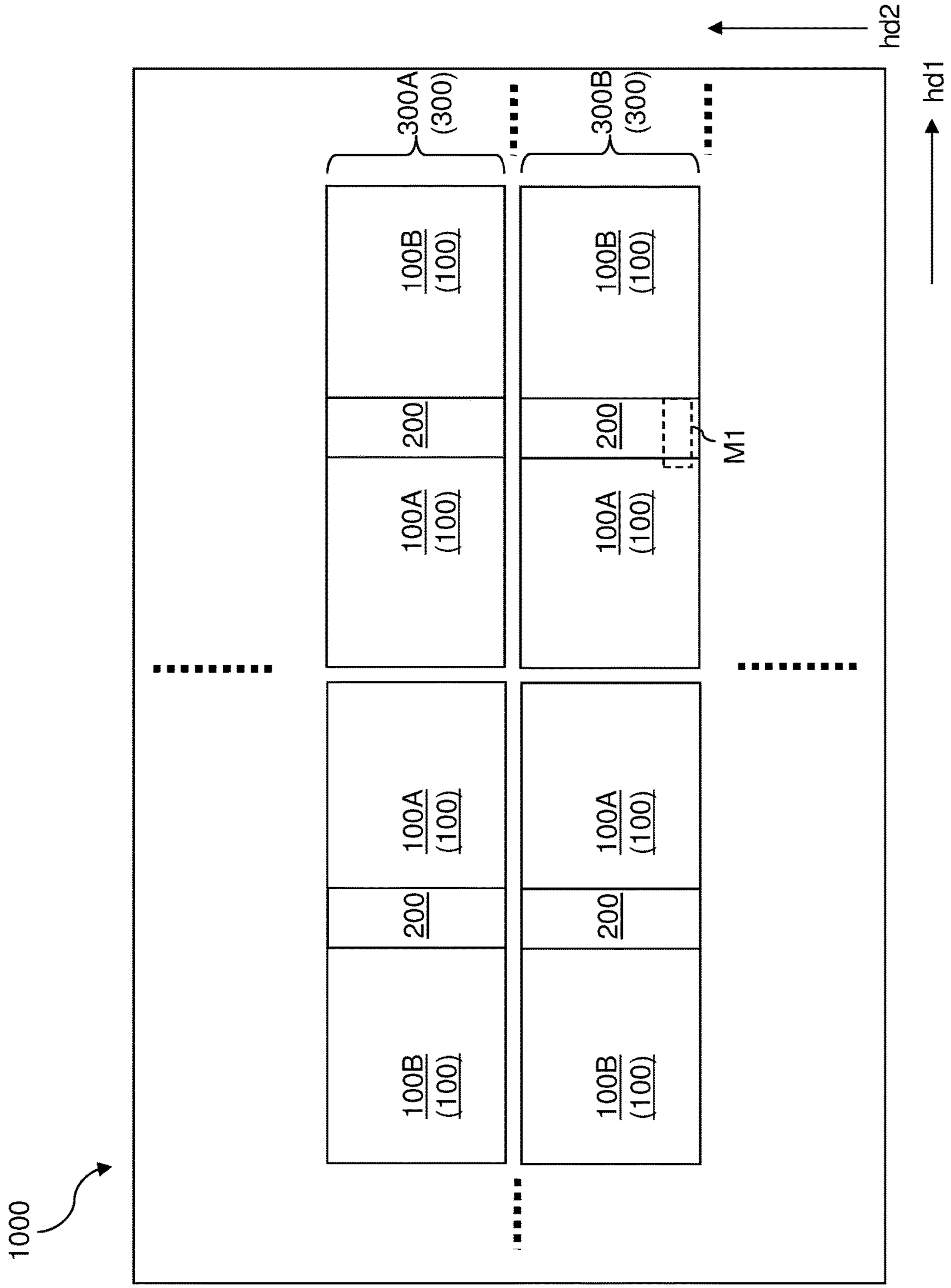
FIG. 1A is a plan view of a configuration of an exemplary semiconductor die including multiple three-dimensional memory array regions according to an embodiment of the present disclosure.
Figure 1B:
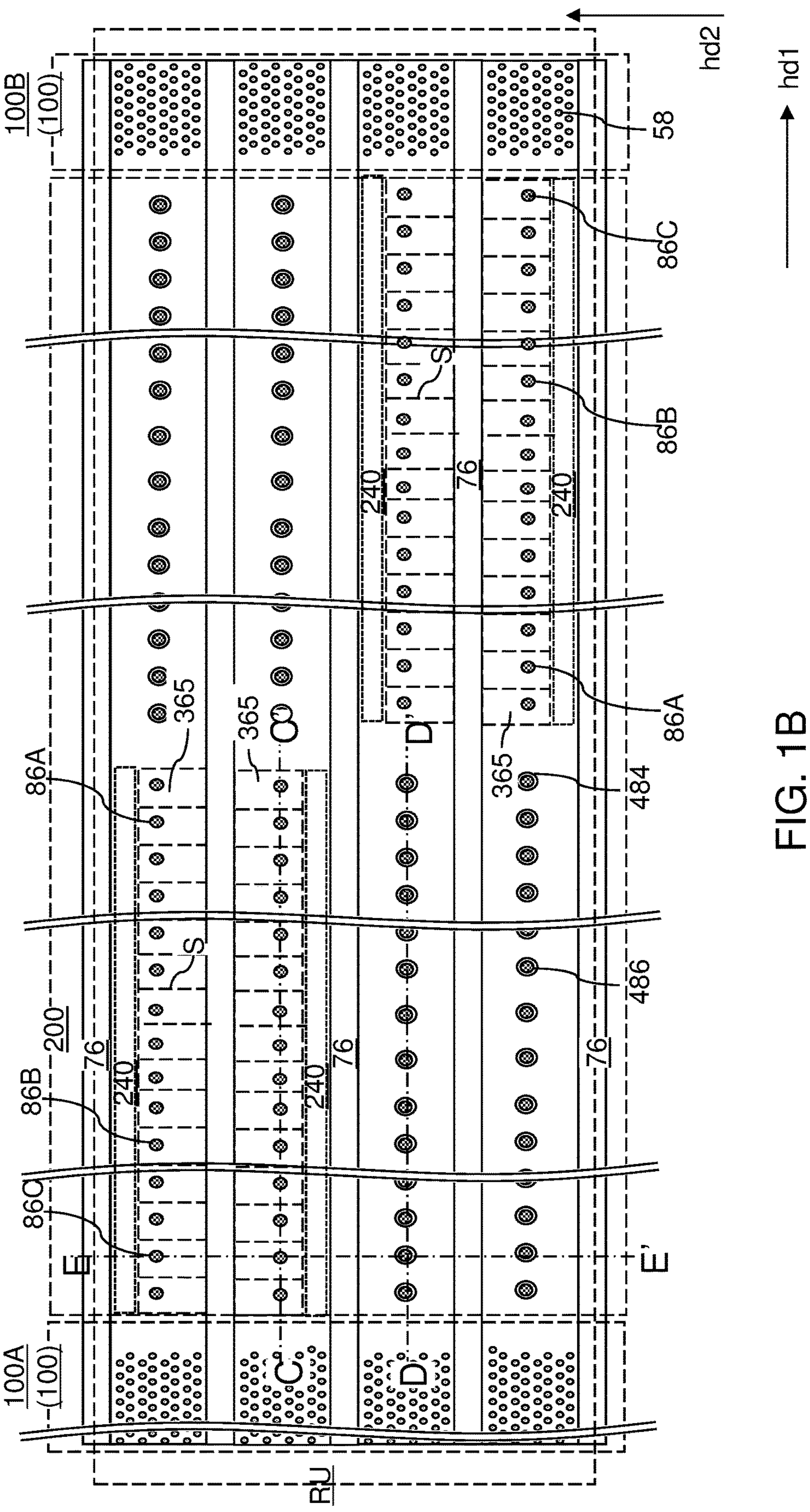
FIG. 1B is a schematic see-through top-down view of region M1 of FIG. 1A.

As discussed above, an embodiments of the present disclosure are directed to multi-tier memory devices in different width central staircase regions in different vertical tiers and methods for forming the same, the various aspects of which are now described in detail.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or from each other, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the first continuous structure. For example, a layer may be located between any pair of horizontal planes between, or at, a top surface and a bottom surface of the first continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0\times10^{-5}$ S/m to $1.0\times10^{5}$ S/m. As used herein, a "semiconductor material" refers to a material having electrical conductivity in the range from $1.0\times10^{-5}$ S/m to 1.0 S/m in the absence of electrical dopants therein, and is capable of producing a doped material having electrical conductivity in a range from 1.0 S/m to $1.0\times10^{7}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^{5}$ S/m. As used herein, an "insulator material" or a "dielectric material" refers to a material having electrical conductivity less than $1.0\times10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0\times10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-5}$ S/m to 1.0×10'S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device.

The various three-dimensional memory devices of the present disclosure include a monolithic three-dimensional NAND string memory device, and may be fabricated using the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many number of external commands as the total number of dies therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation. Referring to FIGS. 1A-1E, an exemplary semiconductor die 1000 according to an embodiment of the present disclosure is illustrated. The exemplary semiconductor die 1000 includes multiple three-dimensional memory array regions and multiple inter-array regions. The exemplary semiconductor die 1000 can include multiple planes 300 (e.g., 300A, 300B), each of which includes two memory array regions 100, such as a first memory array region 100A and a second memory array region 100B that are laterally spaced apart by a respective inter-array region 200. Generally, a semiconductor die 1000 may include a single plane 300 or multiple planes. The total number of planes in the semiconductor die 1000 may be selected based on performance requirements on the semiconductor die 1000. A pair of memory array regions 100 in a plane 300 may be laterally spaced apart along a first horizontal direction hd1 (which may be the word line direction). A second horizontal direction hd2 (which may be the bit line direction) can be perpendicular to the first horizontal direction hd1.

According to an aspect of the present disclosure, the size of the first memory array region 100A may differ from the size of the second memory array region 100B within a given plane. Specifically, the lateral extent of each of the first memory array region 100A and the second memory array region 100B may be the same along the second horizontal direction hd2 within a plane. However, the lateral extent of the first memory array region 100A within the plane 300 long the first horizontal direction hd1 can be greater than the lateral extent of the second memory array region 100B within the same plane 300. In one embodiment, each of the first memory array region 100A and the second memory array region 100B may have a respective rectangular area having a same width along the second horizontal direction hd2, and the lateral extent of the first memory array region 100A along the first horizontal direction hd1 can be greater than the lateral extent of the second memory array region 100B along the first horizontal direction hd1. Thus, the staircase region 200 within each plane 300 can be located off-center of the respective plane 300 along the first horizontal direction hd1 (i.e., the staircase region 200 is located closer to one end than to another end of the respective plane 300). For example, the staircase region 200 in the left plane 300A may be shifted toward the left edge of the die 1000, while the staircase region 200 in the right plane 300B may be shifted toward the right edge of the die 1000.

Each memory array region 100 includes first-tier alternating stacks of first insulating layers 132 and first electrically conductive layers 146 (which function as first word lines), second-tier alternating stacks of second insulating layers 232 and second electrically conductive layers 246 (which function as second word lines), and optionally, third-tier alternating stacks of third insulating layers 332 and third electrically conductive layers 346 (which function as third word lines). Each second-tier alternating stack (232, 246) overlies a respective first-tier alternating stack (132, 146), and each third-tier alternating stack (332, 346), if present, overlies a respective second-tier alternating stack (232, 246). Each combination of a first-tier alternating stack (132, 146), an overlying second-tier alternating stack (232, 246), and an optional overlying third-tier alternating stack (332, 346) may be laterally spaced apart from neighboring combinations of a respective first-tier alternating stack (132, 146), an overlying respective second-tier alternating stack (232, 246), and an overlying optional third-tier alternating stack (332, 346) by backside trench fill structures 76 that laterally extend along the first horizontal direction (e.g., the word line direction) hd1.

As used herein, a "first-tier level" refers to the tier level that is most proximal to a substrate, a "second-tier level" refers to the tier level that is most proximal to the substrate among tier levels that overlie the first-tier level, and a "third-tier level" refers to the tier level that is most proximal to the substrate among tier levels that overlie the second-tier level, etc. A "first-tier" element refers to an element that is located within the first-tier level; a "second-tier" element refers to an element that is located within the second-tier level; a "third-tier" element refers to an element that is located within the second-tier level; etc. Individual tier levels within a structure including multiple tier levels may be labeled as a first tier level, a second tier level, a third tier level, etc. In this case, the first tier level may be any of the multiple tier levels, the second tier level may be a tier level that is different from the first tier level, etc.

The exemplary structure can include an optional semiconductor material layer 110 that includes a single crystalline or polycrystalline semiconductor material, such as single crystalline silicon or polysilicon. In one embodiment, the semiconductor material layer 110 may be a substrate. Optionally, underlying dielectric material layers may be provided underneath the semiconductor material layer 110. In this case, the underlying dielectric material layers are referred to as lower-level dielectric material layers 760.

A first-tier alternating stack of first insulating layers 132 and first electrically conductive layers 146 is located over a substrate (which may include the semiconductor material layer 110 or another structure, such as a silicon wafer that underlies the semiconductor material layer 110) between each neighboring pair of backside trench fill structures 76. A first-tier retro-stepped dielectric material portion 165 overlies, and contacts, first stepped surfaces of the first-tier alternating stack (132, 146). A second-tier alternating stack of second insulating layers 232 and second electrically conductive layers 246 overlies the first-tier alternating stack (132, 146), and overlies a horizontal plane including a planar top surface of the first-tier retro-stepped dielectric material portion 165 between each neighboring pair of backside trench fill structures 76. A second-tier retro-stepped dielectric material portion 265 overlies, and contacts, second stepped surfaces of the second-tier alternating stack (232, 246). A third-tier alternating stack of third insulating layers 332 and third electrically conductive layers 346, if present, overlies the second-tier alternating stack (232, 246), and overlies a horizontal plane including a planar top surface of the second-tier retro-stepped dielectric material portion 265 between each neighboring pair of backside trench fill structures 76. A third-tier retro-stepped dielectric material portion 365 overlies, and contacts, third stepped surfaces of the third-tier alternating stack (332, 346), if present. Vertical steps S of the first stepped surfaces and the second stepped surfaces laterally extend along the second horizontal direction hd2 (e.g., bit line direction).

Memory opening fill structures 58 can be located within each memory array region 100 (which includes a first memory array region 100A and a second memory array region 100B) between each neighboring pair of backside trench fill structures 76. The memory opening fill structures 58 can be located within memory openings that vertically extend through each layer within the first-tier alternating stack (132, 146), the second-tier alternating stack (232, 246), and the optional third-tier alternating stack (332, 346), if present, that are located between a respective neighboring pair of backside trench fill structures 76.

In one embodiment, each of the memory opening fill structures 58 comprises a vertical stack of memory elements (e.g., portions of a memory film or vertically separated, discrete memory elements) located at levels of the electrically conductive layers (146, 246, 346) and a vertical semiconductor channel 60 that is electrically connected to a respective overlying metal interconnect structure (such as a bit line). In one embodiment, the inter-array region 200 is free of any memory stack structure that is electrically contacted by any metal interconnect structure (such as a bit line).

Each memory opening fill structure 58 includes a respective memory stack structure, which includes a respective memory film and a respective vertical semiconductor channel. The memory openings and the memory opening fill structures 58 are formed in region in which each layer of a first-tier alternating stack and each layer of the second-tier alternating stack are present. For each area within which a continuous combination of a first-tier alternating stack (132, 146), a second-tier alternating stack (232, 246), and an optional third-tier alternating stack (332, 346) continuously laterally extends, first memory stack structures can be located within a respective first memory array region 100A and second memory stack structures can be located within a respective second memory array region 100B. The second memory array region 100B can be connected to the first memory array region 100A through a respective inter-array region 200, in which a first-tier retro-stepped dielectric material portion 165, a second-tier retro-stepped dielectric material portion 265, and an optional third-tier retro-stepped dielectric material portion 365 are located.

A first-tier retro-stepped dielectric material portion 165 can be located between each neighboring pair of backside trench fill structures 76. Each first-tier retro-stepped dielectric material portion 165 overlies first stepped surfaces of a respective first-tier alternating stack (132, 146). Each first-tier retro-stepped dielectric material portion 165 can have a sidewall that laterally extends along the first horizontal direction hd1 and contacts a respective backside trench fill structure 76. The first stepped surfaces comprise vertical steps of the first-tier alternating stack (132, 146) that are laterally spaced apart along the first horizontal direction hd1 and vertically offset from each other.

A second-tier retro-stepped dielectric material portion 265 can be located between each neighboring pair of backside trench fill structures 76. Each second-tier retro-stepped dielectric material portion 265 overlies second stepped surfaces of a respective second-tier alternating stack (232, 246). Each second-tier retro-stepped dielectric material portion 265 can have a sidewall that laterally extends along the second horizontal direction hd1 and contacts a respective backside trench fill structure 76. The second stepped surfaces comprise vertical steps of the second-tier alternating stack (232, 246) that are laterally spaced apart along the first horizontal direction hd1 and vertically offset from each other. In one embodiment, each second-tier retro-stepped dielectric material portion 265 overlies, and contacts, a respective one of the first-tier retro-stepped dielectric material portions 165.

A third-tier retro-stepped dielectric material portion 365 can be located between each neighboring pair of backside trench fill structures 76. Each third-tier retro-stepped dielectric material portion 365 overlies third stepped surfaces of a respective third-tier alternating stack (332, 346). Each third-tier retro-stepped dielectric material portion 365 can have a sidewall that laterally extends along the second horizontal direction hd2 and contacts a respective backside trench fill structure 76. The third stepped surfaces comprise vertical steps of the third-tier alternating stack (332, 346) that are laterally spaced apart along the second horizontal direction hd2 and vertically offset from each other. In one embodiment, each third-tier retro-stepped dielectric material portion 365 overlies, and contacts, a respective one of the second-tier retro-stepped dielectric material portions 265.

Backside trenches can laterally extend along the first horizontal direction hd1. Each backside trench can be filled with a backside trench fill structure 76, which may include a combination of a backside contact via structure and an insulating spacer that laterally surround the backside contact via structure. Alternatively, each backside trench fill structure 76 may consist of an insulating fill structure. Each vertical stack of a first-tier alternating stack (132, 146), a second-tier alternating stack (232, 246), and an optional third-tier alternating stack (332, 346) can be located between a neighboring pair of backside trench fill structure 76.

Figure 1C:
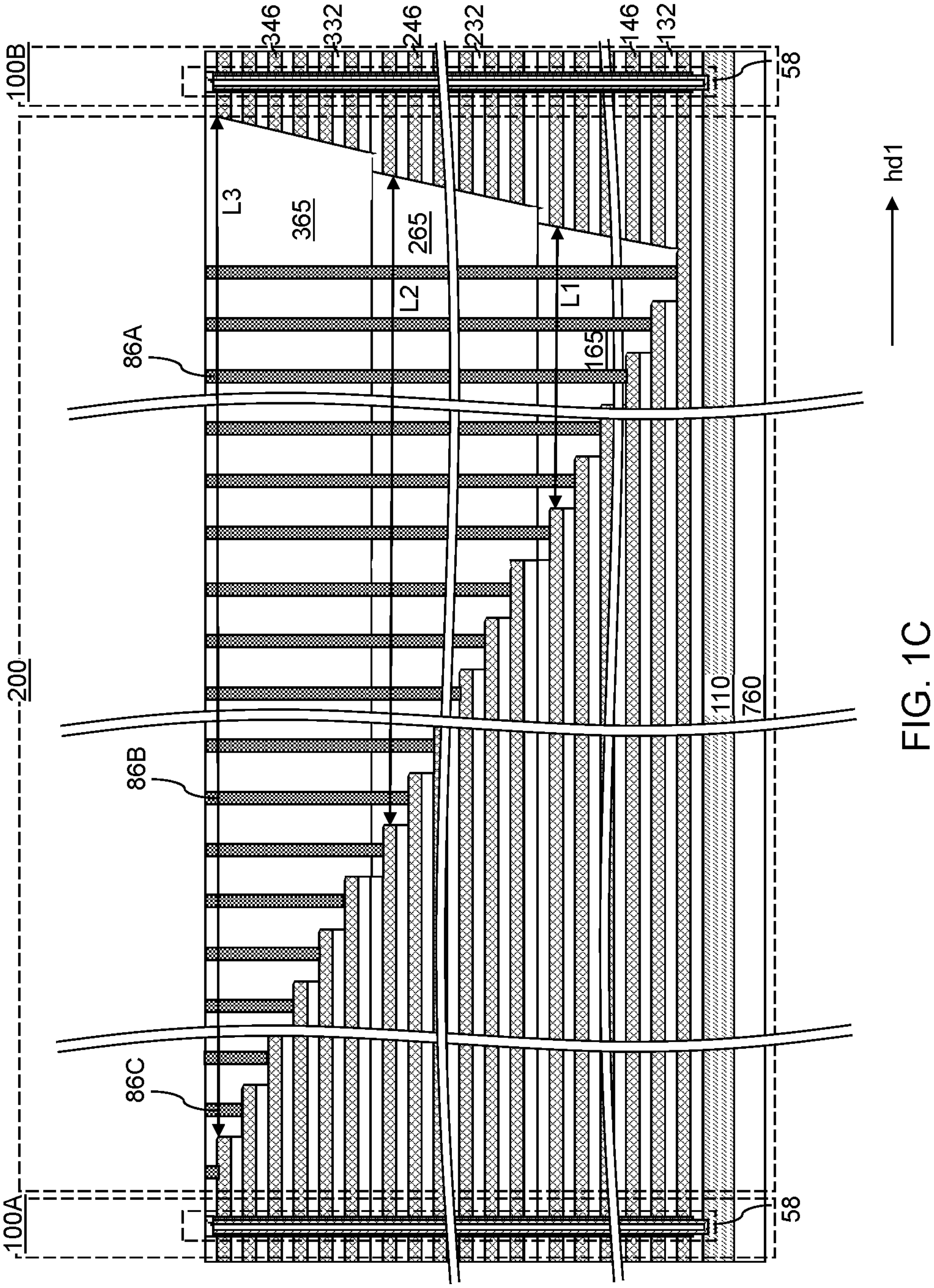
FIG. 1C is a schematic vertical cross-sectional view of a region of the exemplary semiconductor die along the vertical plane C-C' of FIG. 1B.
Figure 1D:
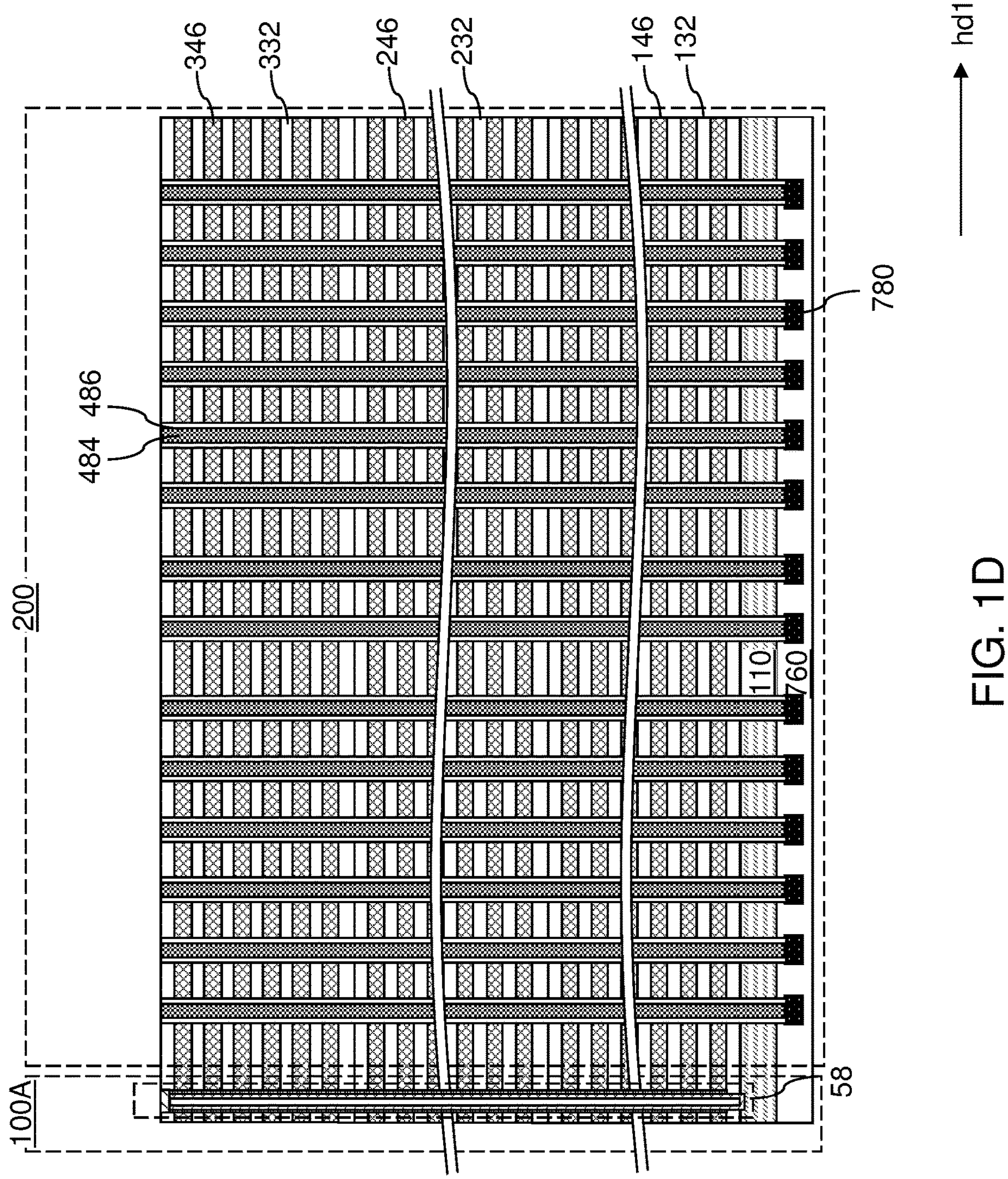
FIG. 1D is a schematic vertical cross-sectional view of a region of the exemplary semiconductor die along the vertical plane D-D' of FIG. 1B.
Figure 1E:
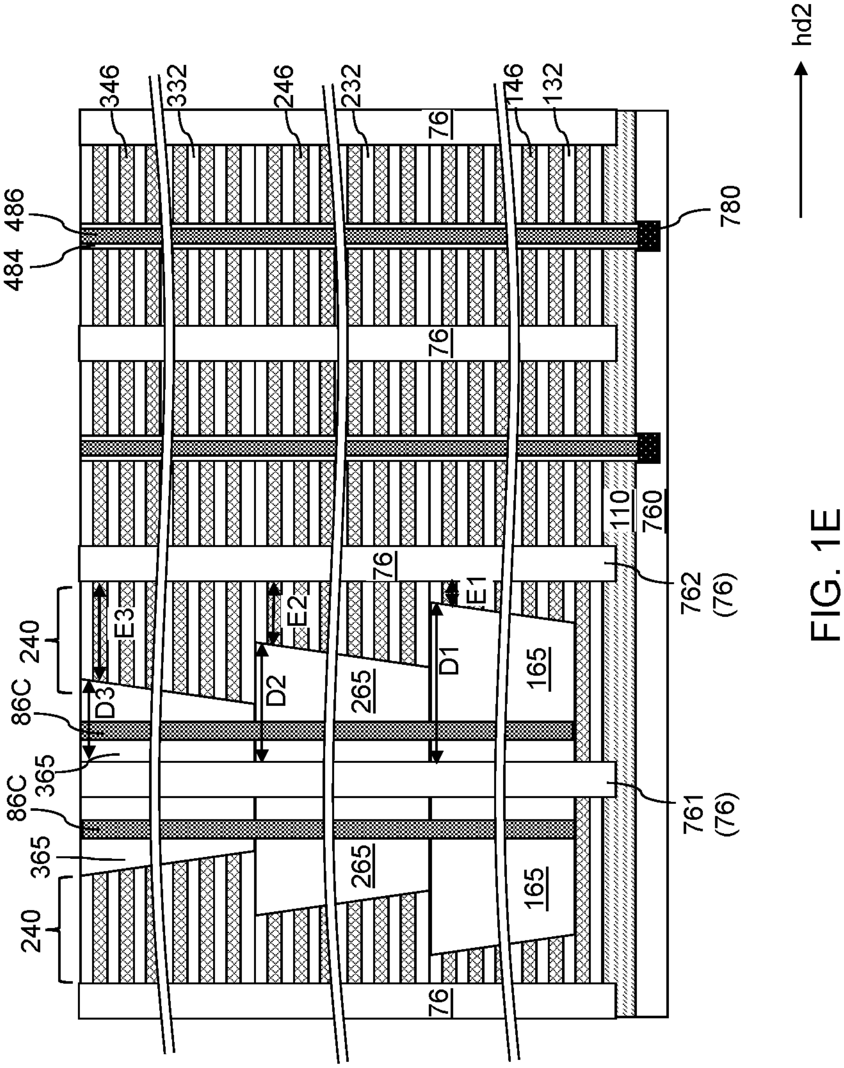
FIG. 1E is a schematic vertical cross-sectional view of a region of the exemplary semiconductor die along the vertical plane E-E' of FIG. 1B.

For each vertical stack of a first-tier alternating stack (132, 146), a second-tier alternating stack (232, 246), and an optional third-tier alternating stack (332, 346), a respective first backside trench fill structure 761 laterally extends along the first horizontal direction hd1 (e.g., word line direction), and may, or may not, contact first sidewalls of the first-tier alternating stack (132, 146), first sidewalls of the second-tier alternating stack (232, 246), and first sidewalls of the third-tier alternating stack (332, 346), if present; and a second backside trench fill structure 762 laterally extends along the first horizontal direction hd1, and may, or may not, second sidewalls of the first-tier alternating stack (132, 146), second sidewalls of the second-tier alternating stack (232, 246), and second sidewalls of the third-tier alternating stack (332, 346), if present, as illustrated in FIG. 1E. The first backside trench fill structure 761 and the second backside trench fill structure 762 are neighboring pairs of backside trench fill structures 76. Generally, at least one of the first backside trench fill structure 761 and the second backside trench fill structure 762 is in direct contact with each layer within the first-tier alternating stack (132, 146); at least one of the first backside trench fill structure 761 and the second backside trench fill structure 762 is in direct contact with each layer within the second-tier alternating stack (232, 246); and at least one of the first backside trench fill structure 761 and the second backside trench fill structure 762 is in direct contact with each layer within the third-tier alternating stack (332, 346) in case the third-tier alternating stack (332, 346) is present.

According to various embodiments, various configurations of the exemplary structure are provided in which one or both of the first backside trench fill structure 761 and the second backside trench fill structure 762 is/are in direct contact with each layer within the first-tier alternating stack (132, 146). Furthermore, one or both of the first backside trench fill structure 761 and the second backside trench fill structure 762 is/are in direct contact with each layer within the second-tier alternating stack (232, 246). Furthermore, one or both of the first backside trench fill structure 761 and the second backside trench fill structure 762 is/are in direct contact with each layer within the third-tier alternating stack (332, 346) (if present). While FIGS. 1A-1E illustrate a configuration in which a first backside trench fill structure 761 is not in direct contact with the first-tier alternating stack (132, 146), the second-tier alternating stack (232, 246), or the third-tier alternating stack (332, 346), and a second backside trench fill structure 762 is in direct contact with each layer within the first-tier alternating stack (132, 146), with each layer within the second-tier alternating stack (232, 246), and with each layer within the third-tier alternating stack (332, 346), embodiments are expressly contemplated herein in which different combinations in which the first backside trench fill structure 761 and the second backside trench fill structure 762 contact or do not contact each of the first-tier alternating stack (132, 146), the second-tier alternating stack (232, 246), and the third-tier alternating stack (332, 346).

In one embodiment, first contact via structures 86A vertically extend through a second-tier retro-stepped dielectric material portion 265 and a first-tier retro-stepped dielectric material portion 165, and contact a respective one of the first electrically conductive layers 146. Second contact via structures 86B vertically extend through a second-tier retro-stepped dielectric material portion 265 and contact a respective one of the second electrically conductive layers 246.

The inter-array region 200 includes strips of the first insulating layers 132, the first electrically conductive layers 146, the second insulating layers 232, the second electrically conductive layers 246, the third insulating layers 332, and the third electrically conductive layers 346 located between each laterally neighboring pair of backside trench fill structures 76. Such strips are located in a respective strip-shaped connection regions 240 (i.e., bridge regions) of the inter-array regions 200, which are located adjacent to a respective first-tier retro-stepped dielectric material portion 165, a respective second-tier retro-stepped dielectric material portion 265, or a respective third-tier retro-stepped dielectric material portions 365. The strips have a narrower width along the second horizontal direction hd2 than portions of the alternating stacks (132, 146, 232, 246, 332, 346) located in the memory array regions 100, and portions of the strips located in the remaining portions of the inter array regions 200 outside of the respective strip-shaped connection regions 240.

For each vertical stack of a first-tier alternating stack (132, 146), a second-tier alternating stack (232, 246), and an optional third-tier alternating stack (332, 346), first memory opening fill structures 58 can be located within a first memory array region 100A in which each layer of the first-tier alternating stack (132, 1446), the second-tier alternating stack (232, 246), and the optional third-tier alternating stack (332, 346) is present. Second memory opening fill structures 58 can be located within a second memory array region 100B that is laterally offset along the first horizontal direction hd1 from the first memory array region 100A by the first-tier retro-stepped dielectric material portion 165, the second-tier retro-stepped dielectric material portion 265, and the optional third-tier retro-stepped dielectric material portion 365. Each layer of the first-tier alternating stack (132, 1446), the second-tier alternating stack (232, 246), and the optional third-tier alternating stack (332, 346) is present within the second memory array region 100B. Each of the electrically conductive layers (146, 246, 346) within the vertical stack may continuously extend from the first memory array region 100A to the second memory array region 100B through a strip-shaped connection region 240 (which is also referred to as a bridge region). Each strip-shaped connection region 240 is located within an inter-array region 200, and may be located between the backside trench fill structure 76 and the first-tier retro-stepped dielectric material portion 165 at the level of the first-tier alternating stack (132, 146), or between a backside trench fill structures 76 and the second-tier retro-stepped dielectric material portion 265 at the level of the second-tier alternating stack (232, 246), or between a backside trench fill structures 76 and the third-tier retro-stepped dielectric material portion 365 at the level of the third-tier alternating stack (332, 346).

Staircases including first stepped surfaces of a first-tier alternating stack (132, 146), second stepped surfaces of a second-tier alternating stack (232, 246), and optionally, third stepped surfaces of a third-tier alternating stack (332, 346) can ascend (i.e., rise) from the substrate along the first horizontal direction hd1, or along the opposite direction of the first horizontal direction hd1. In one embodiment, the direction of rise of the staircases can change for every other pair of vertical stacks of a respective first-tier alternating stack (132, 146), a respective second-tier alternating stack (232, 246), and a respective third-tier alternating stack (332, 346). In other words, the direction of rise is staggered in adjacent alternating stacks that are separated along the second horizontal direction. For example, upon sequentially numbering each vertical stack of a respective first-tier alternating stack (132, 146), a respective second-tier alternating stack (232, 246), and a respective third-tier alternating stack (332, 346) with positive integers N starting with 1, each (4N+1)-th combination and each (4N+2)-th vertical stack {(132, 146), (232, 246), (332, 246)} can have stairs that rise along the first horizontal direction hd1, and each (4NB+3)-th combination and each (4N+4)-th vertical stack {(132, 146), (232, 246), (332, 246)} can have stairs that rise along the opposite direction of the first horizontal direction hd1. In this embodiment, a vertical distance between the first stepped surfaces and the substrate increases along the first horizontal direction hd1, a vertical distance between the second stepped surfaces and the substrate increases along the first horizontal direction hd1, a vertical distance between the additional first stepped surfaces and the substrate decreases along the first horizontal direction hd1, and a vertical distance between the additional second stepped surfaces and the substrate decreases along the first horizontal direction hd1.

In an alternative embodiment, the direction of rise of the staircases does not change for every other pair of combinations of a respective first-tier alternating stack (132, 146), a respective second-tier alternating stack (232, 246), and a respective third-tier alternating stack (332, 246). In other words, the direction of rise is the same (i.e., non-staggered) in adjacent alternating stacks that are separated along the second horizontal direction.

Laterally-isolated vertical interconnection structures (484, 486) can be formed through the inter-array region 200. Each laterally-isolated vertical interconnection structure (484, 486) can include a through-memory-level conductive via structure 486 and a tubular insulating spacer 484 that laterally surrounds the conductive via structure 486. Each through-memory-level conductive via structure 486 can contact a lower-level metal interconnect structure 780 located in the lower-level dielectric material layers 760, as shown in FIGS. 1D and 1E. The lower-level metal interconnect structures 780 can be embedded in the lower-level dielectric material layers 760, which are located between the first-tier alternating stack (132, 146) and a substrate (not shown) that can be provided underneath the lower-level dielectric material layers 760. The laterally-isolated vertical interconnection structures (484, 486) vertically extend through the strip portions of the first-tier alternating stack (132, 146), the second-tier alternating stack (232, 246), and the third-tier alternating stack (332, 346), and contact a respective one of the lower-level metal interconnect structures 780.

Drain contact via structures (not illustrated) can contact an upper portion of a respective memory opening fill structure 58 (such as a drain region within the respective memory opening fill structure 58). Bit lines (not illustrated) can laterally extend along the second horizontal direction hd2, and can contact top surfaces of a respective subset of the drain contact via structures. Additional metal interconnect structures embedded in overlying dielectric material layers (not shown) may be employed to provide electrical connection among the various nodes of the three-dimensional memory device located in the semiconductor die 1000.

Each backside trench fill structure 76 includes an insulating material portion. In one embodiment, each insulating material portion may comprise an insulating spacer that laterally surrounds a contact via structure such as a backside contact via structure (not expressly shown). In another embodiment, each insulating material portion may comprise a dielectric wall structure which takes up the entire volume of the respective backside trench fill structure 76. In one embodiment, each sidewall of the first alternating stacks (132, 146) can be contacted by a sidewall of an insulating material portion of a respective one of the backside trench fill structures 76.

According to various embodiments of the present disclosure, the various retro-stepped dielectric material portions (165, 265, 365) may be formed in various configurations, and may or may not contact a neighboring backside trench fill structure 76. In one embodiment, upon sequentially numbering the backside trench fill structures 76 along the second horizontal direction (e.g., bit line direction) hd2 with positive integers, each odd-numbered backside trench fill structure 76 may contact a respective pair of first-tier retro-stepped dielectric material portions 165, and each even-numbered backside trench fill structure 76 does not contact any of the first-tier retro-stepped dielectric material portions 165. Alternatively, the backside trench fill structures 76 may not contact any of the first-tier retro-stepped dielectric material portions 165, and the first-tier retro-stepped dielectric material portions 165 may be laterally spaced from each neighboring pair of backside trench fill structures 76. For each configuration for the first-tier retro-stepped dielectric material portions 165, each odd-numbered backside trench fill structure 76 may contacts a respective pair of second-tier retro-stepped dielectric material portions 265, and each even-numbered backside trench fill structure 76 does not contact any of the second-tier retro-stepped dielectric material portions 265. Alternatively, each even-numbered backside trench fill structure 76 may contact a respective pair of second-tier retro-stepped dielectric material portions 265, and each odd-numbered backside trench fill structure 76 does not contact any of the second-tier retro-stepped dielectric material portions 265. Yet alternatively, the backside trench fill structures 76 may not contact any of the second-tier retro-stepped dielectric material portions 265, and the second-tier retro-stepped dielectric material portions 265 may be laterally spaced from each neighboring pair of backside trench fill structures 76. For each configuration for the first-tier retro-stepped dielectric material portions 165 and for each configuration for the second-tier retro-stepped dielectric material portions 265, each odd-numbered backside trench fill structure 76 may contact a respective pair of third-tier retro-stepped dielectric material portions 365, and each even-numbered backside trench fill structure 76 does not contact any of the third-tier retro-stepped dielectric material portions 365. Alternatively, each even-numbered backside trench fill structure 76 may contact a respective pair of third-tier retro-stepped dielectric material portions 365, and each odd-numbered backside trench fill structure 76 does not contact any of the third-tier retro-stepped dielectric material portions 365. Yet alternatively, the backside trench fill structures 76 may not contact any of the third-tier retro-stepped dielectric material portions 365, and the third-tier retro-stepped dielectric material portions 365 may be laterally spaced from each neighboring pair of backside trench fill structures 76.

In one embodiment, each plane 300 within the exemplary semiconductor die 100 includes a three-dimensional memory device, which includes alternating stacks of insulating layers (132, 232, 332) and electrically conductive layers (146, 246, 346). Each of the alternating stacks {(132, 146), (232, 246), (332, 346)} laterally extends along a first horizontal direction hd1 through a first memory array region 100A and a second memory array region 100B that are laterally spaced apart by an inter-array region 200. Each of the alternating stacks {(132, 146), (232, 246), (332, 346)} includes a set of stepped surfaces (i.e., a staircase) in the inter-array region 200. Each plane 300 within the exemplary semiconductor die 1000 includes retro-stepped dielectric material portions (165, 265, 365) overlying a respective set of stepped surfaces of the alternating stacks {(132, 146), (232, 246), (332, 346)}. Each plane 300 within the exemplary semiconductor die 1000 includes clusters of memory stack structures located within memory opening fill structures 58. Each of the memory stack structures vertically extends through a respective one of the alternating stacks {(132, 146), (232, 246), (332, 346)} and is located within the first memory array region 100A or the second memory array region 100B. Each memory stack structure can include a respective vertical semiconductor channel and a vertical stack of memory elements (e.g., a memory film) located at levels of the electrically conductive layers (146, 246, 346).

The three-dimensional memory device can comprise layer contact via structures (e.g., word line contact via structures) (86A, 86B, 86C) vertically extending through a respective one of the retro-stepped dielectric material portions (165, 265, 365) and contacting a respective one of the electrically conductive layers (146, 246, 346). In one embodiment, for each pair of electrically conductive layers (146, 246, or 346) located within a same alternating stack, a layer contact via structure (86A, 86B, 86C) that contacts an overlying electrically conductive layer is more proximal to the first memory array region 100A than a layer contact via structure that contacts an underlying electrically conductive layer is to the first memory array region 100A. In other words, the higher the bottom surface of a layer contact via structure (86A, 86B, 86C) is from a substrate (110, 760), the closer the layer contact via structure (86A, 86B, 86C) is to the first memory array region 100A. In other words, the staircases generally ascend (i.e., rise up) from the shorter second memory array region 100B towards the longer first memory array region 300 in each plane 300.

Electrical connection between each layer contact via structure (86A, 86B, 86C) and a portion of each electrically conductive layer (146, 246, or 346) within the second memory array region 100B is provided by a strip portion of the electrically conductive layer (146, 246, or 346) located in the bridge region 240 adjacent to and laterally offset along the second horizontal direction from a respective retro-stepped dielectric material portion (165, 265, 365). The strip portion has a lesser width (i.e., narrower width) than the portions of the electrically conductive layer (146, 246, or 346) located in the first memory array region 100A or in the second memory array region 100B. The portions of the electrically conductive layer (146, 246, or 346) located in the first memory array region 100A or in the second memory array region 100B have a width along the second horizontal direction hd2 that is the same as a lateral distance between a neighboring pair of backside trench fill structures 76.

In contrast, each strip portion of the electrically conductive layer (146, 246, or 346) in the bridge region 240 has a width along the second horizontal direction hd2 that is the same as the difference between the lateral distance between a neighboring pair of backside trench fill structures 76 and the width of an adjoining retro-stepped dielectric material portion (165 or 265) along the second horizontal direction hd2. Each electrical connection between a layer contact via structure (86A, 86B, 86C) and a most proximal portion of the second memory array region 100B includes a narrow strip portion of an electrically conductive layer (146, 246, 346) in the bridge region 240, while electrical connection between the layer contact via structure (86A, 86B, 86C) and a most proximal portion of the first memory array region 100A does not include any narrow strip portion of the electrically conductive layer (146, 246, 346) because the first memory array region 100A is not separated from the layer contact via structures (86A, 86B, 86C) by the bridge region 240.

In one embodiment, the alternating stacks {(132, 146), (232, 246), (332, 346)} are laterally spaced apart along the second horizontal direction hd2 by line trenches (such as backside trenches) that laterally extend along the first horizontal direction hd1. The line trenches are filled with backside trench fill structures 76 having dielectric surfaces (such as surfaces of insulating spacers or dielectric wall structures) that contact sidewalls of the alternating stacks {(132, 146), (232, 246), (332, 346)}. In one embodiment, upon sequentially numbering the backside trench fill structures 76 with positive integers along the second horizontal direction hd2, odd-numbered backside trench fill structures may contact a respective pair of retro-stepped dielectric material portions (165, 265, 365) (which are located on either side of a respective odd-numbered backside trench fill structure 76), and even-numbered backside trench fill structures do not contact any retro-stepped dielectric material portion (165, 265, 365), or even-numbered backside trench fill structures may contact a respective pair of retro-stepped dielectric material portions (165, 265, 365) and odd-numbered backside trench fill structures do not contact any retro-stepped dielectric material portion (165, 265, 365).

In one embodiment, strip widths of the first electrically conductive layers 146 decrease with a respective vertical distance from the substrate (760, 110). Strip widths of the second electrically conductive layers 246 decrease with a respective vertical distance from the substrate (760, 110). Strip widths of the third electrically conductive layers 346 decrease with a respective vertical distance from the substrate (760, 110). A bottommost second electrically conductive layer 246 within the second-tier alternating stack (232, 246) has a greater strip width than a topmost first electrically conductive layer 146 within the first-tier alternating stack (132, 146). A bottommost third electrically conductive layer 346 within the third-tier alternating stack (332, 346) has a greater strip width than a topmost second electrically conductive layer 246 within the second-tier alternating stack (232, 246).

According to an aspect of the present disclosure shown in FIG. 1E, a set of a first-tier retro-stepped dielectric material portion 165, a second-tier retro-stepped dielectric material portion 265, and a third-tier retro-stepped dielectric material portion 365 can be formed between a neighboring pair of backside trench fill structures 76, which are herein referred to as a first backside trench fill structure 761 and a second backside trench fill structure 762. A top surface of the first-tier retro-stepped dielectric material portion 165 may have a first width D1 along the second horizontal direction hd2 that is less than a lateral spacing between the neighboring pair of backside trench fill structures (761, 762). A top surface of the second-tier retro-stepped dielectric material portion 265 may have a second width D2 along the second horizontal direction hd2 that is less than the first width D1. A top surface of the third-tier retro-stepped dielectric material portion 365 may have a third width D3 along the second horizontal direction hd2 that is less than the second width D1.

The widths of each strip of an electrically conductive layer (146, 246, 346) along the second horizontal direction in the bridge region 240 is herein referred to as a strip width or a bridge width. Generally, embedding of the retro-stepped dielectric material portions (165, 265, 365) in alternating stacks of insulating layers (132, 232, 332) and electrically conductive layers (146, 246, 346) may induce cracking due to voids formed in the retro-stepped dielectric material portions (165, 265, 365) and/or due to incline of the alternating stacks into the backside trenches due to unbalanced electrically conductive layer material filling.

According to an aspect of the present disclosure, the bridge widths are different at different tier levels in the bridge region 240. For example, a strip portion of the topmost first electrically conductive layers 146 in each first-tier alternating stack (132, 146) may have a first lateral extent (i.e., first width) E1 along the second horizontal direction hd2, a strip portion of the topmost second electrically conductive layers 246 in each second-tier alternating stack (232, 242) may have a second lateral extent (i.e., second width) E2 along the second horizontal direction hd2, and a strip portion of the topmost third electrically conductive layers 346 in each third-tier alternating stack (332, 342) may have a third lateral extent (i.e., third width) E3 along the second horizontal direction hd2. The first lateral extent E1 is less than the second lateral extent E2, and the second lateral extent E2 is less than the third lateral extent E3. In other words, the first width in the lower tier is smaller than the second width in the overlying second tier, and the second width is smaller than the third width in the overlying third tier (if present). Thus, the voids formed in the retro-stepped dielectric material portions (165, 265, 365) may be reduced or avoided due to the larger space between the strips in the lower tier in the bridge region 240 and/or incline of the alternating stacks into the backside trenches may be reduced or avoided due to a more balanced electrically conductive layer material filling, as will be described below.

Furthermore, referring to FIG. 1C, for a three-tier memory device, the length of the bridge region 240 in the first horizontal direction hd1 at the top of the first-tier structure may be L1, the length of the bridge region 240 in the first horizontal direction at the top of the second-tier structure may be L2, and the length of the bridge region 240 in the first horizontal direction at the top of the third-tier structure may be L3. In one embodiment, if L3 equals to a length X, then L2=2/3X and L1=1/3X, and if E3 equals to a width Y, then E2=2/3Y and E1=1/3Y. Likewise, for a two-tier memory device embodiment, if L2 equals to a length X, then L1=1/2, and if E2 equals to a width Y, then E1=1/2Y. In these embodiments, the electrical resistance of the electrically conductive layers (146, 246, 346) in the bridge region 240 in all three tiers may be similar (e.g., differ by 10% or less), since the longer electrically conductive layers 346 have a greater width than the shorter electrically conductive layers 146 in the same bridge region 240.

In one embodiment, a first-tier structure may embed first-tier retro-stepped dielectric material portions 165 having a first length along the first horizontal direction hd1 and having a first width D1 along the second horizontal direction hd2. A second-tier structure may embed second-tier retro-stepped dielectric material portions 265 having a second length that is greater than the first length along the first horizontal direction hd1 and having a second width D2 that is lesser than the first width D1 along the second horizontal direction hd2. A third-tier structure may embed third-tier retro-stepped dielectric material portions 365 having a third length that is greater than the second length along the first horizontal direction hd1 and having a third width D3 that is lesser than the second width D2 along the second horizontal direction hd2. Accordingly, the average bridge width (i.e., the average strip width) of the third electrically conductive layers 346 along the second horizontal direction hd2 is greater than the average bridge width of the second electrically conductive layers 246 along the second horizontal direction hd2, which is greater than the average bridge width of the first electrically conductive layers 146 along the second horizontal direction hd2.

In some embodiments, the various tier structures may be constructed with a mirror symmetry with respective to a vertical plane extending along the first horizontal direction through a backside trench fill structure 76 (such as a first backside trench fill structure 761). According to an aspect of the present disclosure, conformal fill of the dielectric material in retro-stepped trenches during formation of the first-tier retro-stepped dielectric material portions 165 may be facilitated by increasing the width of the retro-stepped trenches along the second horizontal direction hd2, which accompanies an increase in the first width D1 of each first-tier retro-stepped dielectric material portion 165. This reduces cracks and tilting while forming symmetric structures around each backside trench that is located between pairs of a respective stack of retro-stepped dielectric material portions (165, 265, 365).

While the illustrated configuration of the exemplary structure illustrated in FIGS. 1A-1E employ three tier levels, embodiments are expressly contemplated herein in which two tier levels, or four or more tier levels are employed in an alternative configuration.

Figure 2A:
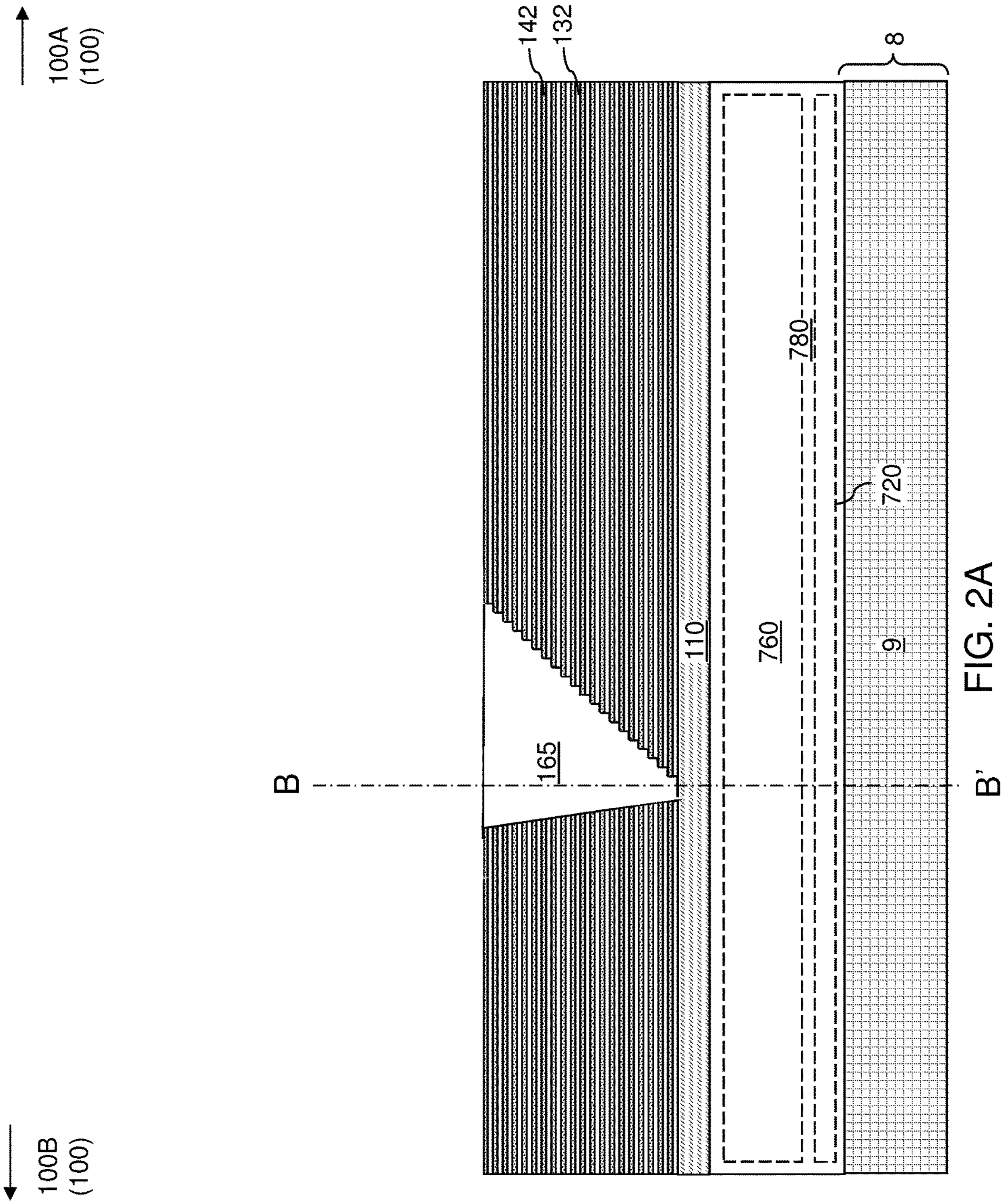
FIG. 2A is a schematic vertical cross-sectional view of an exemplary structure for forming a semiconductor die after formation of optional semiconductor devices, optional lower level dielectric layers, optional lower metal interconnect structures, a semiconductor material layer, and a first vertically alternating sequence of first continuous insulating layers and first continuous sacrificial material layers, and a first-tier retro-stepped dielectric material portion according to an embodiment of the present disclosure.
Figure 2B:
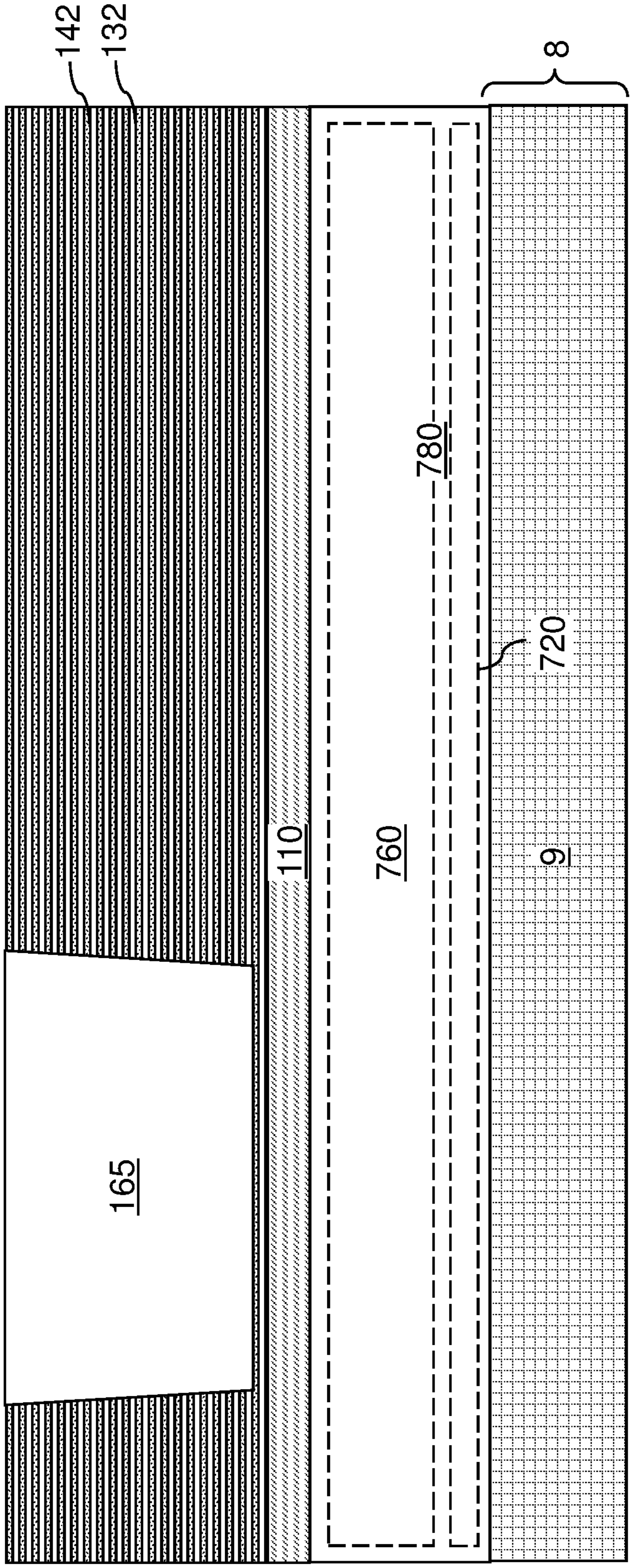
FIG. 2B is a schematic vertical cross-sectional view of the exemplary structure along the vertical plane B-B' of FIG. 2A
Figure 2C:
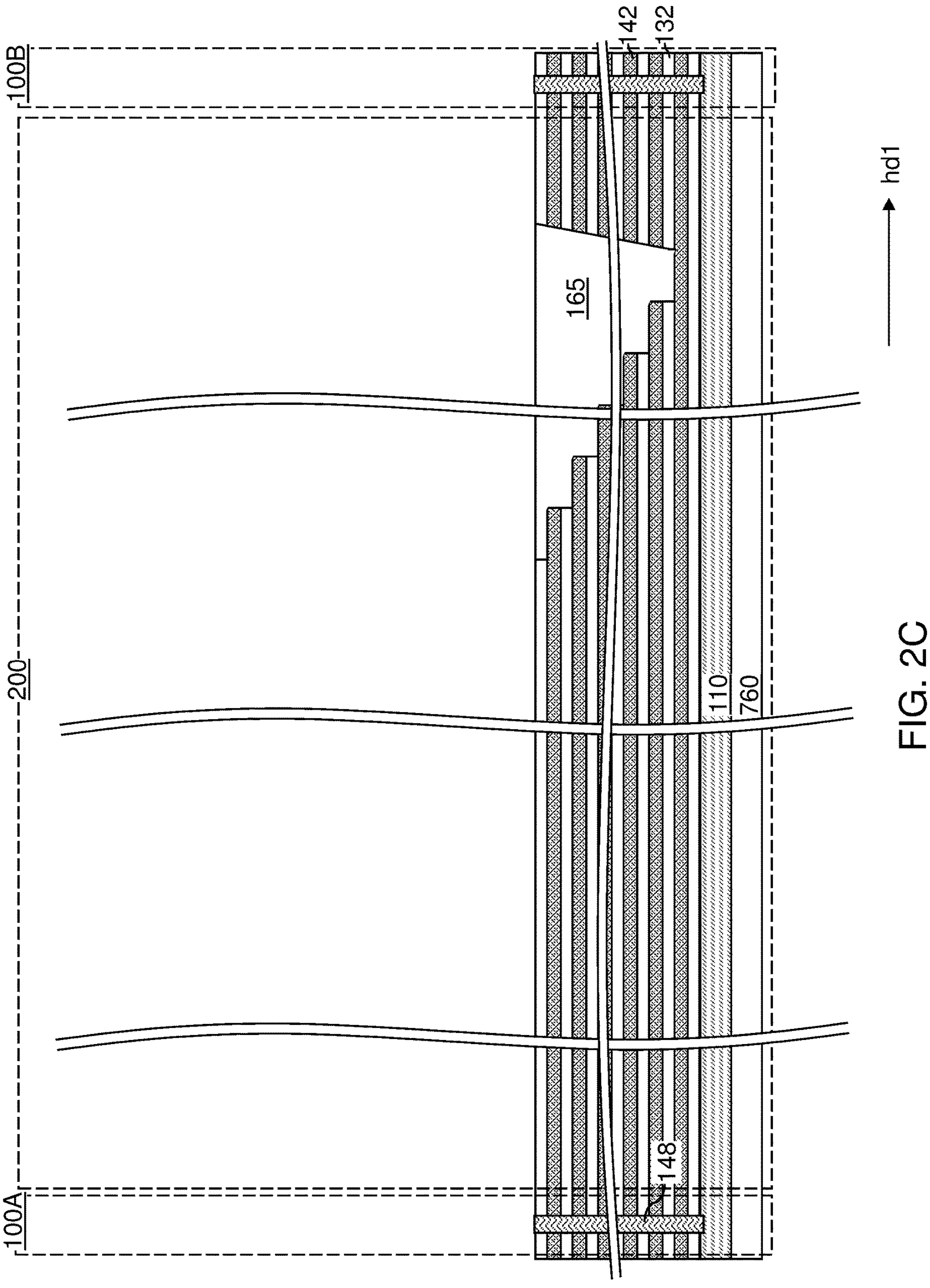
FIG. 2C is another schematic vertical cross-sectional view of the exemplary structure of FIGS. 2A and 2B.

The exemplary semiconductor die 1000 of FIGS. 1A-1E can be manufactured employing a sequence of processing steps. Referring to FIGS. 2A-2C, an exemplary structure for formation of the structure of FIGS. 1A-1E is illustrated after formation of semiconductor devices 720 on a substrate semiconductor layer 9 (which is provided at least within an upper portion of a substrate 8), lower level dielectric layers 760, lower-level metal interconnect structures 780 (schematically represented by a dotted area including physical implementations of the lower level metal interconnect structures) that are embedded in the lower-level dielectric layers 760, a semiconductor material layer 110, and a first vertically alternating sequence of first insulating layers 132 and first sacrificial material layers 142. The substrate semiconductor layer 9 may comprise a top portion (e.g., a doped well) of a substrate 8, such as silicon wafer, or a semiconductor layer located over a substrate, such as a silicon on insulator substrate or a semiconductor substrate. The semiconductor devices 720 may include field effect transistors that are formed over a top surface of the substrate 8. The lower-level dielectric layers 760 may be interconnect-level dielectric material layers that embed the lower-level metal interconnect structures 780.

As used herein, a vertically alternating sequence refers to a sequence of multiple instances of a first element and multiple instances of a second element that is arranged such that an instance of a second element is located between each vertically neighboring pair of instances of the first element, and an instance of a first element is located between each vertically neighboring pair of instances of the second element.

The first insulating layers 132 can be composed of the first material, and the first sacrificial material layers 142 can be composed of the second material, which is different from the first material. Each of the first insulating layers 132 is an insulating layer that continuously extends over the entire area of the substrate 8, and may have a uniform thickness throughout. Each of the first sacrificial material layers 142 includes is a sacrificial material layer that includes a dielectric material and continuously extends over the entire area of the substrate 8, and may have a uniform thickness throughout. Insulating materials that may be used for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 may be silicon oxide.

The second material of the first sacrificial material layers 142 is a dielectric material, which is a sacrificial material that may be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The second material of the first sacrificial material layers 142 may be subsequently replaced with electrically conductive electrodes which may function, for example, as control gate electrodes of a vertical NAND device. In one embodiment, the first sacrificial material layers 142 may be material layers that comprise silicon nitride.

Generally, a vertically alternating sequence of unit layer stacks over a substrate. Each of the unit layer stacks comprises a first insulating layer (such as a first insulating layer 132) and a first spacer material layer (such as a first sacrificial material layer 142). Generally, the first spacer material layers are formed as, or are subsequently replaced with, first electrically conductive layers. While the present disclosure is described employing an embodiment in which the first spacer material layers are formed as first sacrificial material layers 142 that are subsequently replaced with first electrically conductive layers, embodiments are expressly contemplated herein in which the first spacer material layers are formed as first electrically conductive layers. In such embodiments, steps for replacing the material of the first spacer material layers with an electrically conductive material can be omitted.

First stepped surfaces can be formed within the staircase regions of the inter-array region 200 which will be filled with the first-tier retro-stepped dielectric material portions 165. For example, a combination of a sacrificial hard mask layer and a trimming mask layer may be employed to form the first stepped surfaces. In one embodiment, a row of multiple first staircase regions can be formed within each area that corresponds to a combination of the area of a laterally-neighboring pair of first-tier retro-stepped dielectric material portions 165 and an intervening area. In this case, the multiple first staircase regions can be subsequently vertically offset by different depths by subsequently performing area recess etch processes.

In an illustrative example, $2^M$ sets of first stepped surfaces can be formed within a combination of the area of a laterally-neighboring pair of first-tier retro-stepped dielectric material portions 165 and an intervening area. M can be an integer in a range from 1 to 8. Each set of first stepped staircases may include P steps such that sidewalls of P first continuous spacer material layers are physically exposed with lateral offsets. P may be an integer from 2 to 64. M area recess etch processes can be performed such that each area recess etch process vertically recesses P times $2^i$ sets of a first insulating layer 132 and a first sacrificial material layer 142, in which i is a different integer from 0 to (M−1). A total of up to 2 M×P stepped surfaces can be formed for the first vertically alternating sequence of the first insulating layers 132 and the first sacrificial material layers 142. The total number of the stepped surfaces within each continuous cavity overlying the first stepped surfaces can be the same as the total number of the first sacrificial material layers 142 in the first vertically alternating sequence (132, 142).

A first dielectric fill material (such as undoped silicate glass (i.e., silicon oxide) or a doped silicate glass) can be deposited in each first continuous retro-stepped cavity. The first dielectric fill material can be planarized to remove excess portions of the first dielectric fill material from above the horizontal plane including the topmost surface of the first vertically alternating sequence (132, 142). Each remaining portion of the first dielectric fill material that fills a respective first continuous retro-stepped cavity constitutes a first-tier retro-stepped dielectric material portion 165. Generally, the first-tier retro-stepped dielectric material portions 165 can be formed in inter-array regions 200 located between a respective first memory array region 100A and a respective second memory array region 100B that are laterally spaced apart along the first horizontal direction hd1.

Various first-tier openings may be formed through the first vertically alternating sequence (132, 142) and into the semiconductor material layer 110. A photoresist layer (not shown) may be applied over the first vertically alternating sequence (132, 142), and may be lithographically patterned to form various openings therethrough. The pattern of openings in the photoresist layer may be transferred through the first vertically alternating sequence (132, 142) and into the semiconductor material layer 110 by a first anisotropic etch process to form the various first-tier openings concurrently, i.e., during the first isotropic etch process. The various first-tier openings may include first-tier memory openings formed in the memory array regions 100 and first-tier support openings formed in the inter-array region 200. Each cluster of first-tier memory openings may be formed as a two-dimensional array of first-tier memory openings. The first-tier support openings are openings that are formed in the inter-array region 200, and are subsequently employed to form support pillar structures. A subset of the first-tier support openings may be formed through a respective horizontal surface of the first stepped surfaces.

Sacrificial first-tier opening fill portions may be formed in the various first-tier openings. For example, a sacrificial first-tier fill material is deposited concurrently deposited in each of the first-tier openings. The sacrificial first-tier fill material includes a material that may be subsequently removed selective to the materials of the first insulating layers 132 and the first sacrificial material layers 142. In one embodiment, the sacrificial first-tier fill material may include a semiconductor material such as silicon (e.g., a-Si or polysilicon), a silicon-germanium alloy, germanium, a III-V compound semiconductor material, or a combination thereof. Optionally, a thin etch stop liner (such as a silicon oxide layer or a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In another embodiment, the sacrificial first-tier fill material may include a silicon oxide material having a higher etch rate than the materials of the first insulating layers 132. For example, the sacrificial first-tier fill material may include borosilicate glass or porous or non-porous organosilicate glass having an etch rate that is at least 100 times higher than the etch rate of densified TEOS oxide (i.e., a silicon oxide material formed by decomposition of tetraethylorthosilicate glass in a chemical vapor deposition process and subsequently densified in an anneal process) in a 100:1 dilute hydrofluoric acid. In this case, a thin etch stop liner (such as a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In yet another embodiment, the sacrificial first-tier fill material may include carbon-containing material (such as amorphous carbon or diamond-like carbon) that may be subsequently removed by ashing, or a silicon-based polymer that may be subsequently removed selective to the materials of the first vertically alternating sequence (132, 142).

Portions of the deposited sacrificial first-tier fill material may be removed from above the topmost layer of the first vertically alternating sequence (132, 142), such as from above the topmost first insulating layer 132. For example, the sacrificial first-tier fill material may be recessed to a top surface of the topmost first insulating layer 132 using a planarization process. The planarization process may include a recess etch, chemical mechanical planarization (CMP), or a combination thereof. The top surface of the topmost first insulating layer 132 may be used as an etch stop layer or a planarization stop layer.

Remaining portions of the sacrificial first-tier fill material comprise sacrificial first-tier opening fill portions. Specifically, each remaining portion of the sacrificial first-tier fill material in a first-tier memory opening constitutes a sacrificial first-tier memory opening fill portion 148. Each remaining portion of the sacrificial first-tier fill material in a first-tier support opening constitutes a sacrificial first-tier support opening fill portion (not illustrated). The various sacrificial first-tier opening fill portions are concurrently formed, i.e., during a same set of processes including the deposition process that deposits the sacrificial first-tier fill material and the planarization process that removes the first-tier deposition process from above the first vertically alternating sequence (132, 142) (such as from above the top surface of the topmost first insulating layer 132). The top surfaces of the sacrificial first-tier opening fill portions may be coplanar with the top surface of the topmost first insulating layer 132. Each of the sacrificial first-tier opening fill portions may, or may not, include cavities therein. The set of all structures located between the bottommost surface of the first vertically alternating sequence (132, 142) and the topmost surface of the first vertically alternating sequence (132, 142) or embedded within the first vertically alternating sequence (132, 142) constitutes a first-tier structure.

Figure 3A:
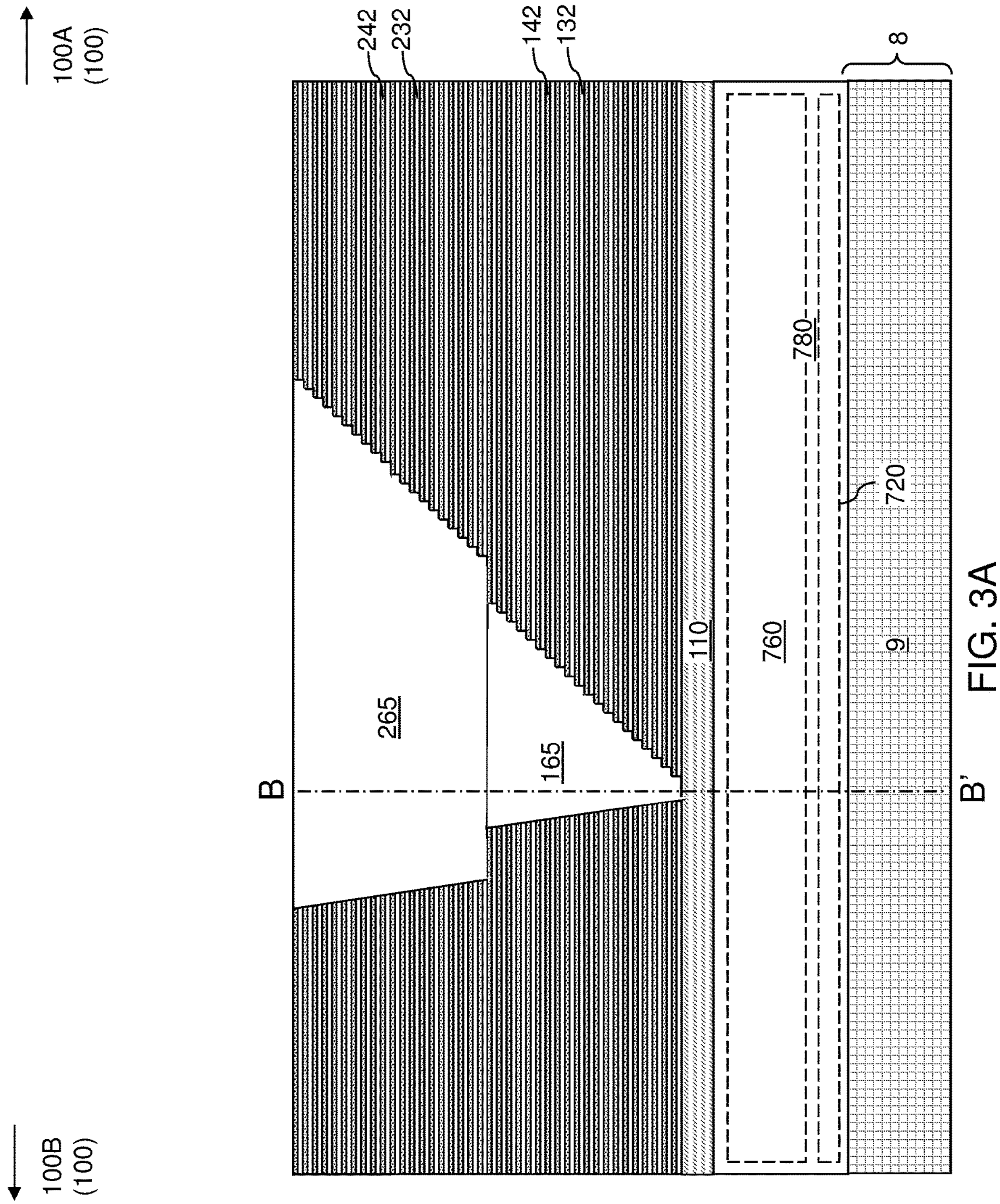
FIG. 3A is a schematic vertical cross-sectional view of the exemplary structure after formation of a second vertically alternating sequence of second continuous insulating layers and second continuous sacrificial material layers and a second-tier retro-stepped dielectric material portion according to an embodiment of the present disclosure.
Figure 3B:
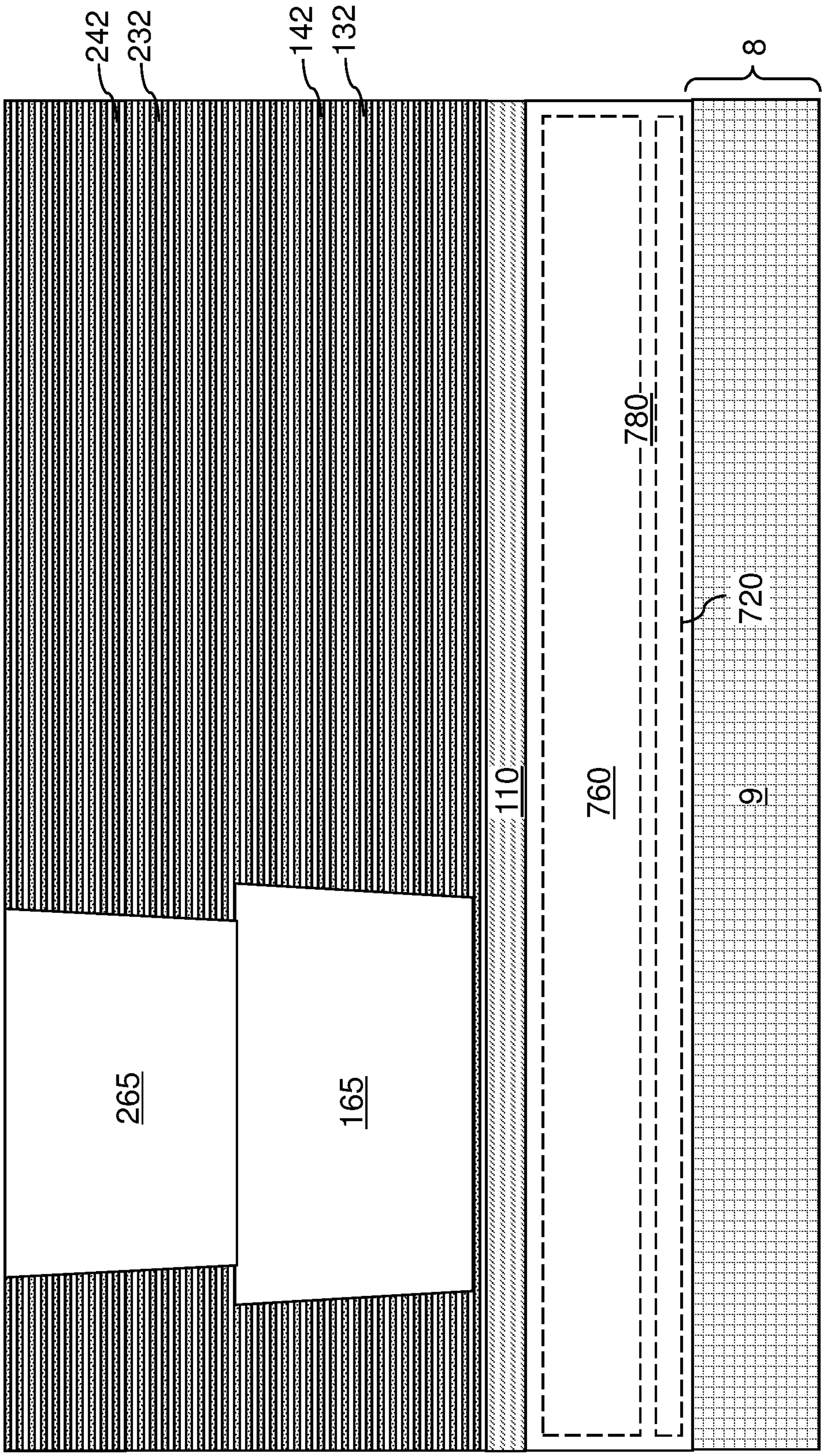
FIG. 3B is a schematic vertical cross-sectional view of the exemplary structure along the vertical plane B-B' of FIG. 3A.
Figure 3C:
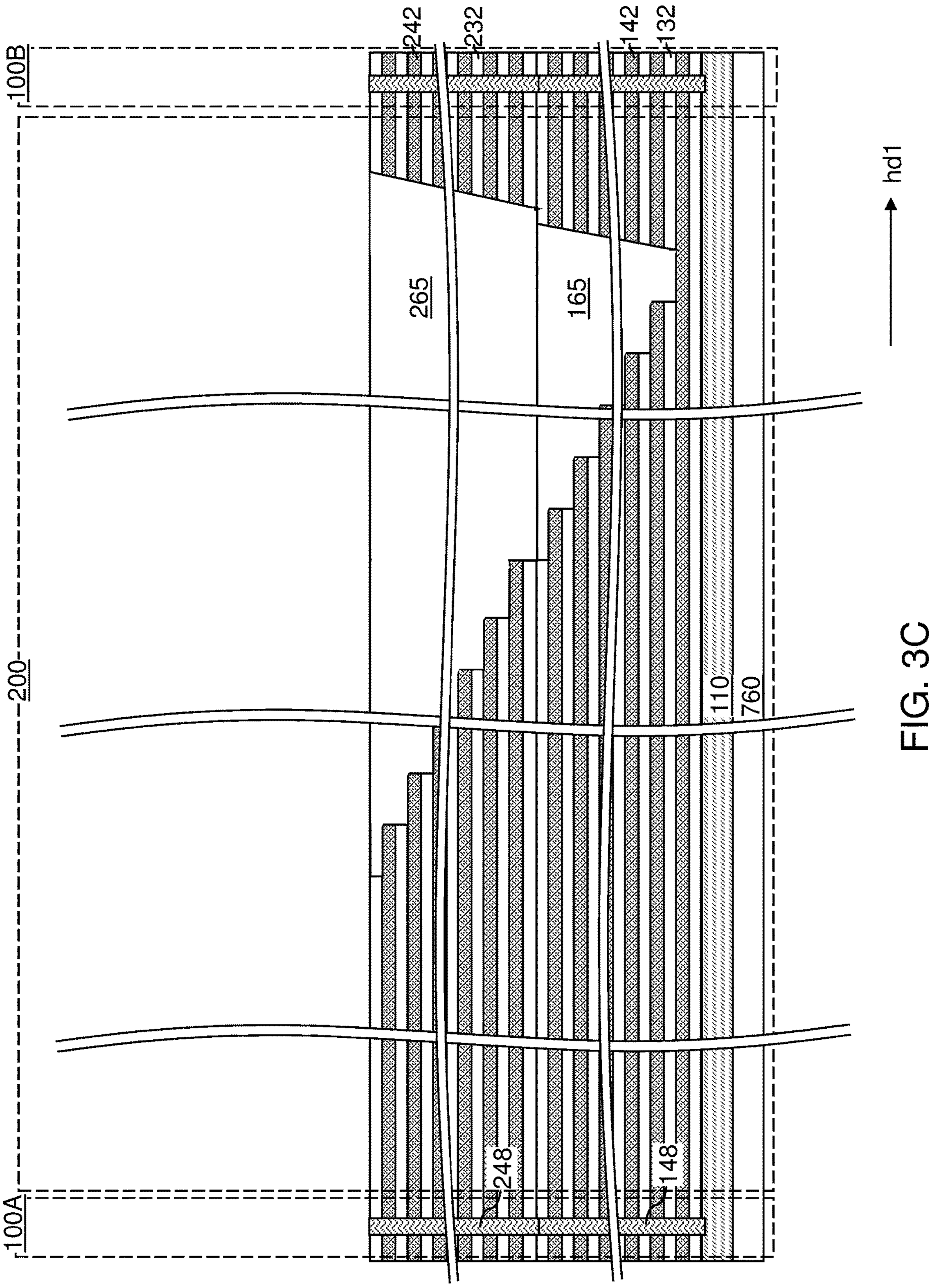
FIG. 3C is another schematic vertical cross-sectional view of the exemplary structure of FIGS. 3A and 3B.

Referring to FIGS. 3A-3C, a second vertically alternating sequence of second insulating layers 232 and second sacrificial material layers 242 can be formed. Each of the second insulating layers 232 is an insulating layer that continuously extends over the entire area of the substrate 8, and may have a uniform thickness throughout. Each of the second sacrificial material layers 242 includes is a sacrificial material layer that includes a dielectric material and continuously extends over the entire area of the substrate 8, and may have a uniform thickness throughout. The second insulating layers 232 can have the same material composition and the same thickness as the first insulating layers 132. The second sacrificial material layers 242 can have the same material composition and the same thickness as the first sacrificial material layers 142.

Generally, at least one additional vertically alternating sequence of additional insulating layers and additional sacrificial material layers can be optionally formed over the first vertically alternating sequence (132, 142) and the first-tier retro-stepped dielectric material portions 165.

Second stepped surfaces can be formed within the staircase regions of the inter-array region 200 which will be filled with the second-tier retro-stepped dielectric material portions 265. For example, a combination of a sacrificial hard mask layer and a trimming mask layer may be employed to form the second stepped surfaces. In one embodiment, a row of multiple second staircase regions can be formed within each area that corresponds to a combination of the area of a laterally-neighboring pair of second-tier retro-stepped dielectric material portions 265 and an intervening area. In this case, the multiple second staircase regions can be subsequently vertically offset by different depths by subsequently performing area recess etch processes.

In an illustrative example, $2^N$ sets of second stepped surfaces can be formed within a combination of the area of a laterally-neighboring pair of second-tier retro-stepped dielectric material portions 265 and an intervening area. N can be an integer in a range from 2 to 8. Each set of second stepped staircases may include P steps such that sidewalls of Q second continuous spacer material layers are physically exposed with lateral offsets. Q may be an integer from 2 to 64. M area recess etch processes can be performed such that each area recess etch process vertically recesses Q times $2^j$ sets of a second insulating layer 232 and a second sacrificial material layer 242, in which j is a different integer from 0 to (N−1). A total of up to 2 N×Q stepped surfaces can be formed for the second vertically alternating sequence of the second insulating layers 232 and the second sacrificial material layers 242. The total number of the stepped surfaces within each continuous cavity overlying the second stepped surfaces can be the same as the total number of the second sacrificial material layers 242 in the second vertically alternating sequence (132, 242).

A second dielectric fill material (such as undoped silicate glass (i.e., silicon oxide) or a doped silicate glass) can be deposited in each second continuous retro-stepped cavity. The second dielectric fill material can be planarized to remove excess portions of the second dielectric fill material from above the horizontal plane including the topmost surface of the second vertically alternating sequence (232, 242). Each remaining portion of the second dielectric fill material that fills a respective second continuous retro-stepped cavity constitutes a second-tier retro-stepped dielectric material portion 265.

Generally, a second-tier structure is formed, which comprises a second vertically alternating sequence of second insulating layers 232 and second sacrificial material layers 242 and second-tier retro-stepped dielectric material portions 265 overlying second stepped surfaces of the second vertically alternating sequence that are located in the inter-array regions 200.

Various second-tier openings may be formed through the second vertically alternating sequence (232, 242) and over the sacrificial first-tier opening fill portions. A photoresist layer (not shown) may be applied over the second vertically alternating sequence (232, 242), and may be lithographically patterned to form various openings therethrough. The pattern of openings in the photoresist layer may be transferred through the second vertically alternating sequence (232, 242) to form the various second-tier openings concurrently, i.e., during the second isotropic etch process.

The various second-tier openings may include second-tier memory openings formed in the memory array regions 100 and second-tier support openings formed in the inter-array region 200. Each second-tier opening may be formed within the area of a respective one of the sacrificial first-tier opening fill portions. Thus, a top surface of a sacrificial first-tier opening fill portion can be physically exposed at the bottom of each second-tier opening. Specifically, each second-tier memory openings can be formed directly over a respective sacrificial first-tier memory opening fill portion 148, and each second-tier support opening can be formed directly over a respective sacrificial first-tier support opening fill portion. Each cluster of second-tier memory openings may be formed as a two-dimensional array of second-tier memory openings. The second-tier support openings are openings that are formed in the inter-array region 200, and are subsequently employed to form support pillar structures. A subset of the second-tier support openings may be formed through a respective horizontal surface of the second stepped surfaces.

Sacrificial second-tier opening fill portions may be formed in the various second-tier openings. For example, a sacrificial first-tier fill material is deposited concurrently deposited in each of the second-tier openings. The sacrificial second-tier fill material can include any material that may be employed for the sacrificial first-tier fill material. Portions of the deposited sacrificial second-tier fill material may be removed from above the topmost layer of the second vertically alternating sequence (232, 242). Remaining portions of the sacrificial second-tier fill material comprise sacrificial second-tier opening fill portions. Specifically, each remaining portion of the sacrificial second-tier fill material in a second-tier memory opening constitutes a sacrificial second-tier memory opening fill portion 248. Each remaining portion of the sacrificial second-tier fill material in a first-tier support opening constitutes a sacrificial second-tier support opening fill portion (not illustrated). The top surfaces of the sacrificial second-tier opening fill portions may be coplanar with the top surface of the topmost second insulating layer 232. Each of the sacrificial second-tier opening fill portions may, or may not, include cavities therein. The set of all structures located between the bottommost surface of the second vertically alternating sequence (232, 242) and the topmost surface of the second vertically alternating sequence (232, 242) or embedded within the second vertically alternating sequence (232, 242) constitutes a second-tier structure.

Figure 4A:
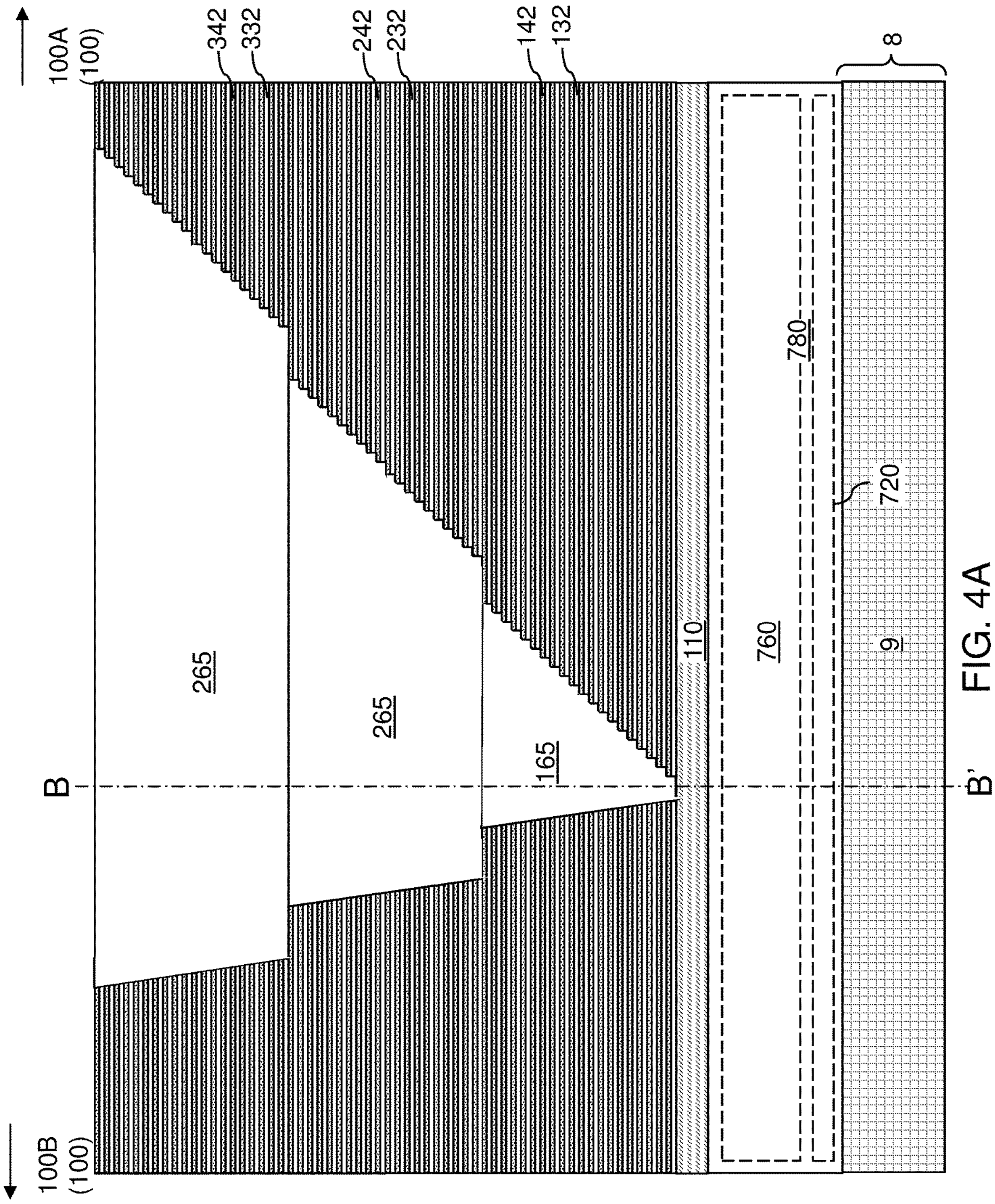
FIG. 4A is a schematic vertical cross-sectional view of the exemplary structure after formation of a third vertically alternating sequence of third continuous insulating layers and third continuous sacrificial material layers and a third-tier retro-stepped dielectric material portion according to an embodiment of the present disclosure.
Figure 4B:
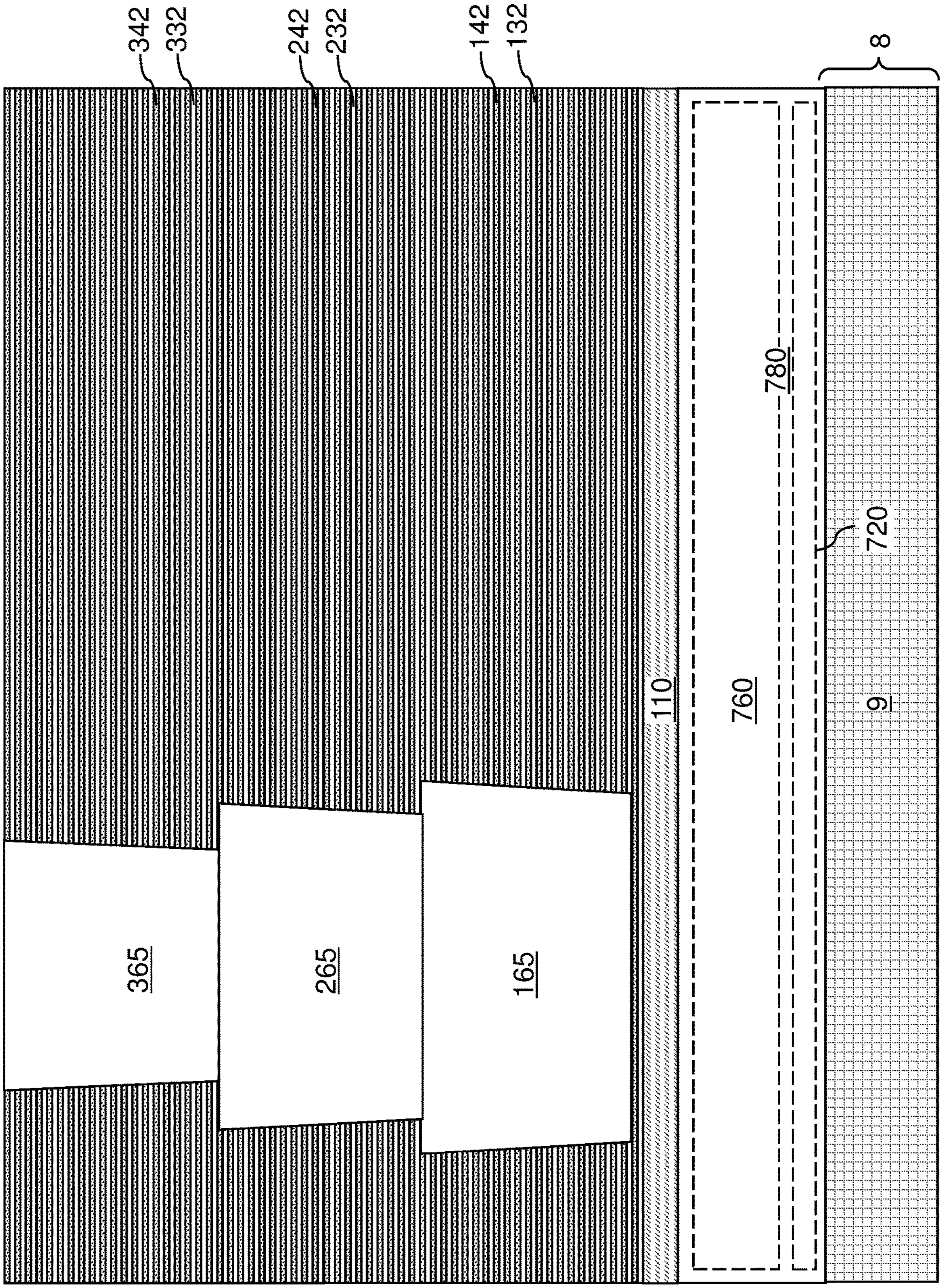
FIG. 4B is a schematic vertical cross-sectional view of the exemplary structure along the vertical plane B-B' of FIG. 4A FIGS. 5A-5E are vertical cross-sectional view of various configurations of the exemplary structure after formation of a third-tier structure according to an embodiment of the present disclosure.

Referring to FIGS. 4A and 4B, a third vertically alternating sequence of third insulating layers 332 and third sacrificial material layers 342 can be formed. Each of the third insulating layers 332 is an insulating layer that continuously extends over the entire area of the substrate 8, and may have a uniform thickness throughout. Each of the third sacrificial material layers 342 includes is a sacrificial material layer that includes a dielectric material and continuously extends over the entire area of the substrate 8, and may have a uniform thickness throughout. The third insulating layers 332 can have the same material composition and the same thickness as the first insulating layers 132. The third sacrificial material layers 342 can have the same material composition and the same thickness as the first sacrificial material layers 142.

Generally, at least one additional vertically alternating sequence of additional insulating layers and additional sacrificial material layers can be optionally formed over the first vertically alternating sequence (132, 142) and the first-tier retro-stepped dielectric material portions 165.

Third stepped surfaces can be formed within the staircase regions of the inter-array region 200 which will be filled with the third-tier retro-stepped dielectric material portions 365. For example, a combination of a sacrificial hard mask layer and a trimming mask layer may be employed to form the third stepped surfaces. In one embodiment, a row of multiple third staircase regions can be formed within each area that corresponds to a combination of the area of a laterally-neighboring pair of third-tier retro-stepped dielectric material portions 365 and an intervening area. In this case, the multiple third staircase regions can be subsequently vertically offset by different depths by subsequently performing area recess etch processes.

A third dielectric fill material (such as undoped silicate glass (i.e., silicon oxide) or a doped silicate glass) can be deposited in each third continuous retro-stepped cavity. The third dielectric fill material can be planarized to remove excess portions of the third dielectric fill material from above the horizontal plane including the topmost surface of the third vertically alternating sequence (332, 342). Each remaining portion of the third dielectric fill material that fills a respective third continuous retro-stepped cavity constitutes a third-tier retro-stepped dielectric material portion 365.

Generally, a third-tier structure is formed, which comprises a third vertically alternating sequence of third insulating layers 332 and third sacrificial material layers 342 and third-tier retro-stepped dielectric material portions 365 overlying third stepped surfaces of the third vertically alternating sequence that are located in the inter-array regions 200.

FIGS. 5A-5E are vertical cross-sectional view of various configurations of the exemplary structure after formation of a third-tier structure according to an embodiment of the present disclosure. The widths of the vertical cross-sectional views illustrated in FIGS. 5A-5E correspond to a lateral extent along the second horizontal direction hd2 of three neighboring backside trench fill structures 76 to be subsequently formed in various configurations of the exemplary structure. In other words, three neighboring backside trench fill structures 76 can be subsequently formed within the lateral extent of each of the illustrated areas of the various illustrated configurations of the exemplary structure.

Figure 5A:
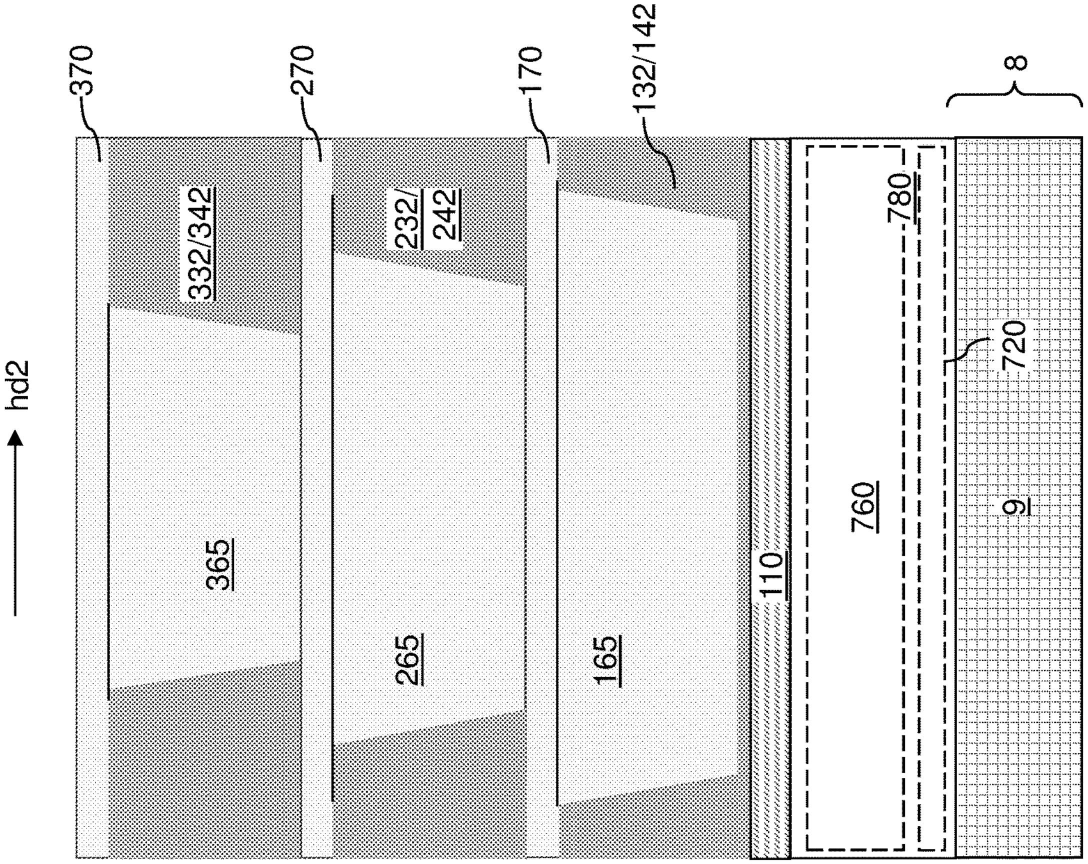
Figure 5B:
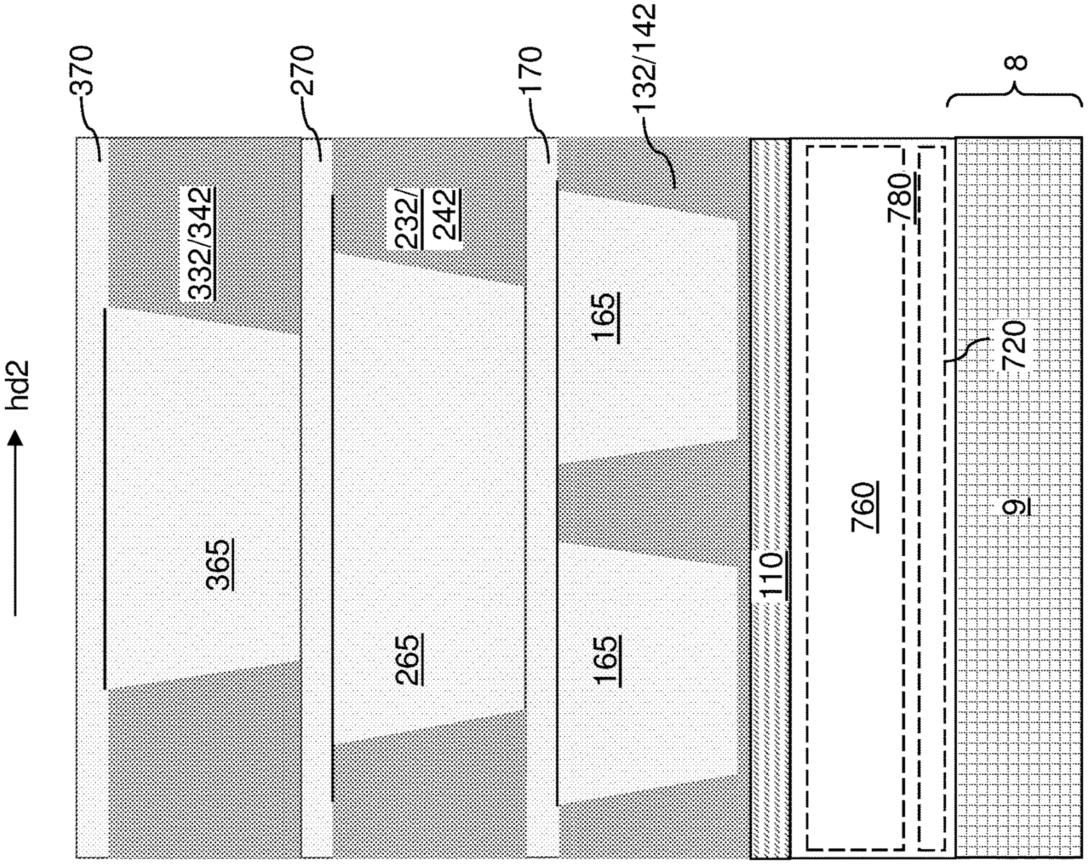
Figure 5C:
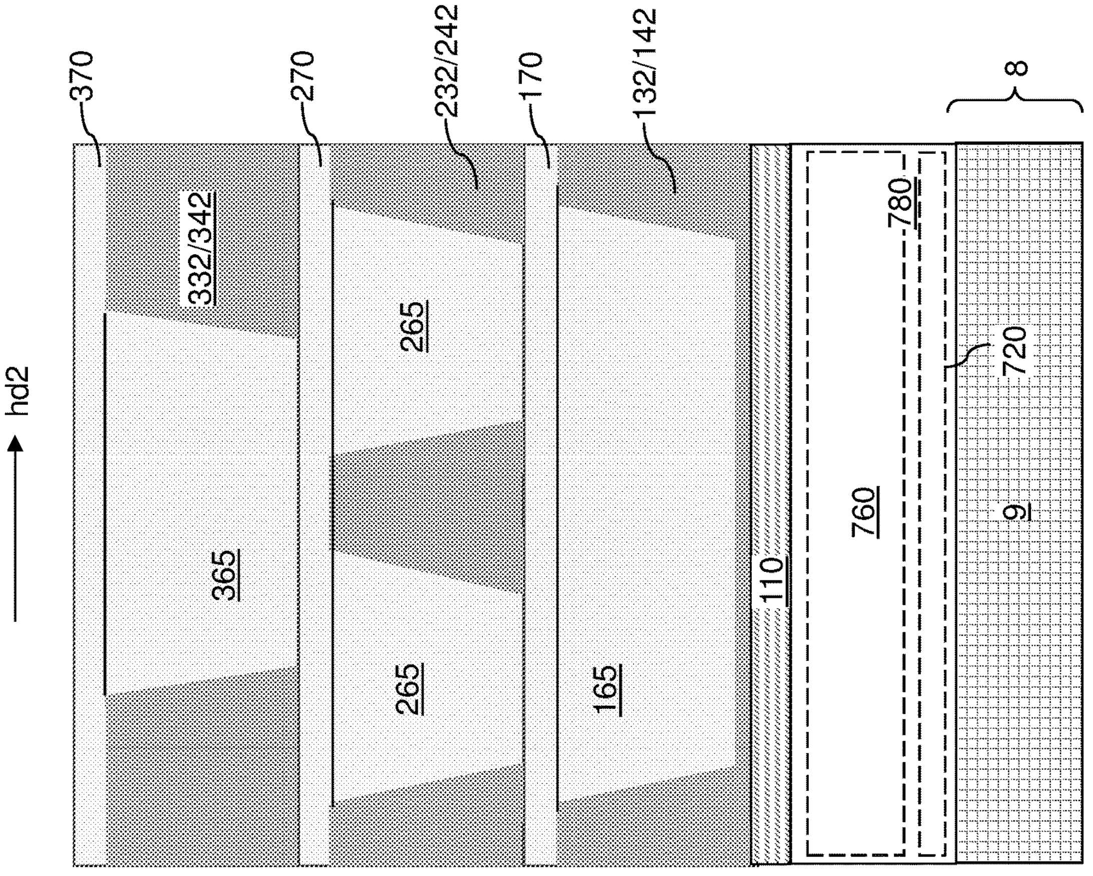
Figure 5D:
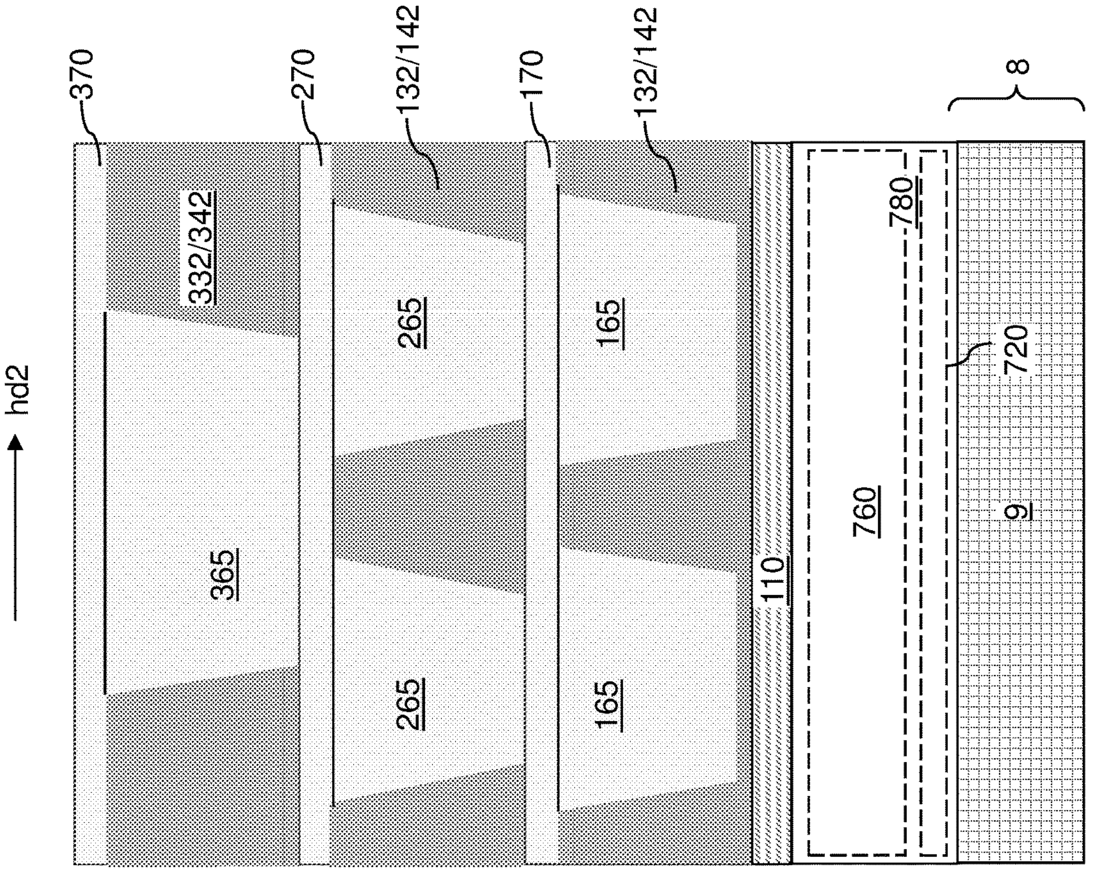
Figure 5E:
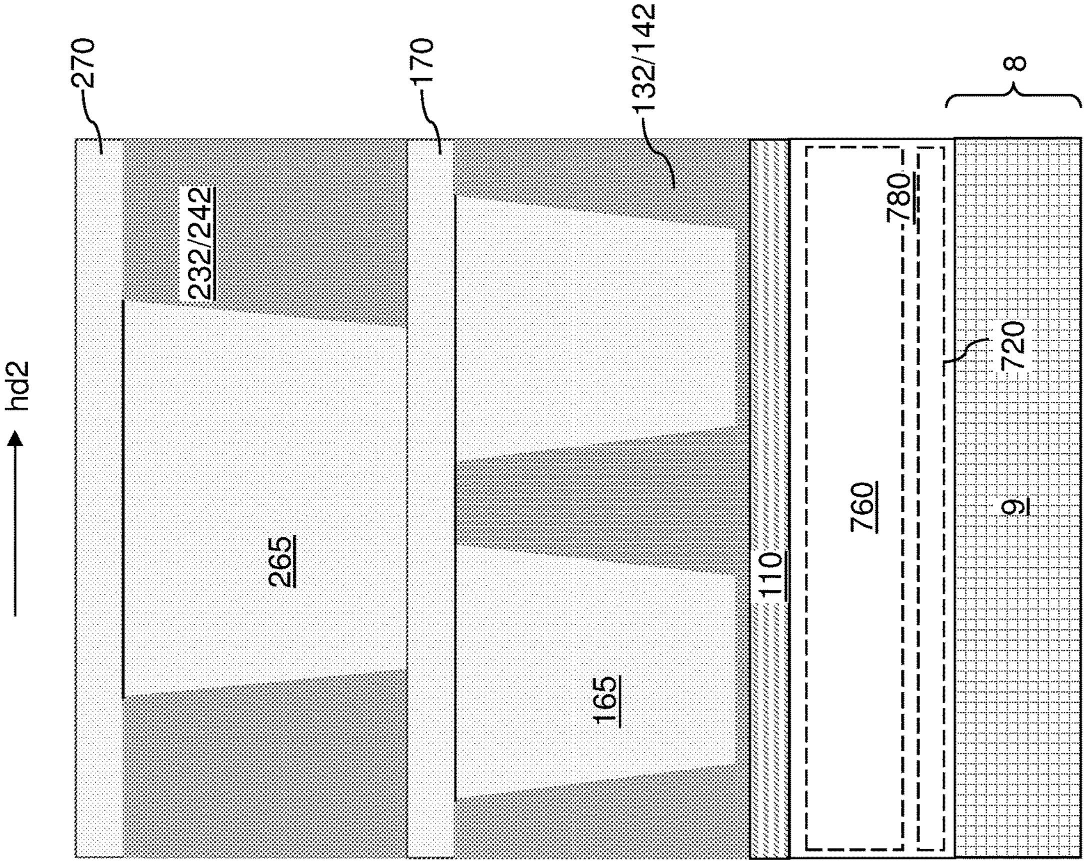

The configurations illustrated in FIGS. 5A-5D employ three tiers, and the configurations illustrated in FIG. 5E employ two tiers. The various illustrated configuration of the exemplary structure in FIGS. 5A-5E employ optional layers that may or may not be formed over a respective vertically alternating sequence of insulating layers (132, 232, 332) and sacrificial material layers (142, 242, 342). The optional layers are herein referred to as a first insulating cap layer 170, a second insulating cap layer 270, and a third insulating cap layer 370. Each of the insulating cap layers (170, 270, 370) comprises an insulating material such as silicon oxide, and may have a thickness in a range from 30 nm to 600 nm, such as from 60 nm to 300 nm, although lesser and greater thicknesses may also be employed.

Referring to FIG. 5A, a first configuration of the exemplary structure is illustrated, which includes a stack of a first retro-stepped dielectric material portion 165, a second retro-stepped dielectric material portion 265 having a lesser lateral extent along the second horizontal direction hd2 than the first retro-stepped dielectric material portion 165, and a third retro-stepped dielectric material portion 365 having a lesser lateral extent along the second horizontal direction hd2 than the second retro-stepped dielectric material portion 265.

Referring to FIG. 5B, a second configuration of the exemplary structure is illustrated, which includes a stack of two first retro-stepped dielectric material portion 165 that are laterally spaced from each other along the second horizontal direction hd2, a second retro-stepped dielectric material portion 265 having a lesser lateral extent along the second horizontal direction hd2 than the two first retro-stepped dielectric material portions 165, and a third retro-stepped dielectric material portion 365 having a lesser lateral extent along the second horizontal direction hd2 than the second retro-stepped dielectric material portion 265.

Referring to FIG. 5C, a third configuration of the exemplary structure is illustrated, which includes a stack of a first retro-stepped dielectric material portion 165, two second retro-stepped dielectric material portions 265, and a third retro-stepped dielectric material portion 365 having a lesser lateral extent along the second horizontal direction hd2 than the two second retro-stepped dielectric material portions 265.

Referring to FIG. 5D, a fourth configuration of the exemplary structure is illustrated, which includes a stack of two first retro-stepped dielectric material portion 165 that are laterally spaced from each other along the second horizontal direction hd2, two second retro-stepped dielectric material portions 265 having a lesser lateral extent along the second horizontal direction hd2 than the two first retro-stepped dielectric material portions 165, and a third retro-stepped dielectric material portion 365 having a lesser lateral extent along the second horizontal direction hd2 than the two second retro-stepped dielectric material portions 265.

Referring to FIG. 5E, a fifth configuration of the exemplary structure is illustrated, which includes a stack of two first retro-stepped dielectric material portion 165 that are laterally spaced from each other along the second horizontal direction hd2, a second retro-stepped dielectric material portion 265 having a lesser lateral extent along the second horizontal direction hd2 than the two first retro-stepped dielectric material portions 165.

In one embodiment, a plurality of tier structures that are vertically stacked can be formed over a substrate 8. Each tier structure within the plurality of tier structures comprises a respective vertically alternating sequence of continuous insulating layers (132, 232, 332) and continuous sacrificial material layers (142, 242, 342). In one embodiment, the first tier structure of the plurality of tier structures may comprise a pair of first retro-stepped dielectric material portions (such as first-tier retro-stepped dielectric material portions 165) that overlies a first vertically alternating sequence of first continuous insulating layers (132, 232, 332) and first continuous sacrificial material layers (142, 242, 342) as illustrated in FIGS. 5B, 5D and 5E. Further, a second tier structure of the plurality of tier structures overlies the first tier level and comprises a second retro-stepped dielectric material portion (265 and/or 365) having a partial areal overlap with each of the pair of first retro-stepped dielectric material portions 165 in a plan view along a vertical direction that is perpendicular to a top surface of the substrate 8 as illustrated in FIGS. 5B-5F.

Figure 6A:
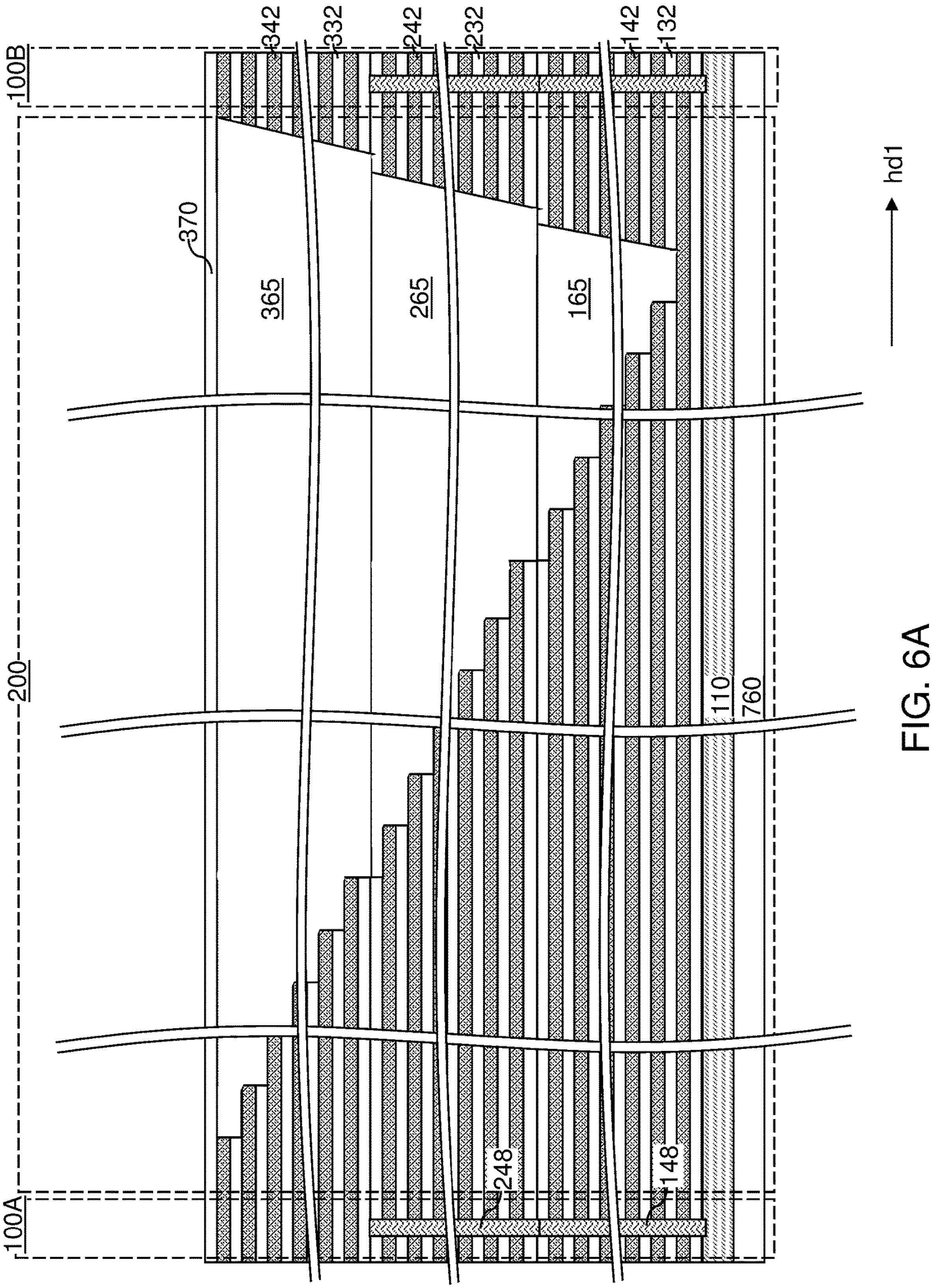
FIGS. 6A-6C are sequential vertical cross-sectional views of the exemplary structure during formation of inter-tier memory openings according to an embodiment of the present disclosure.
Figure 6B:
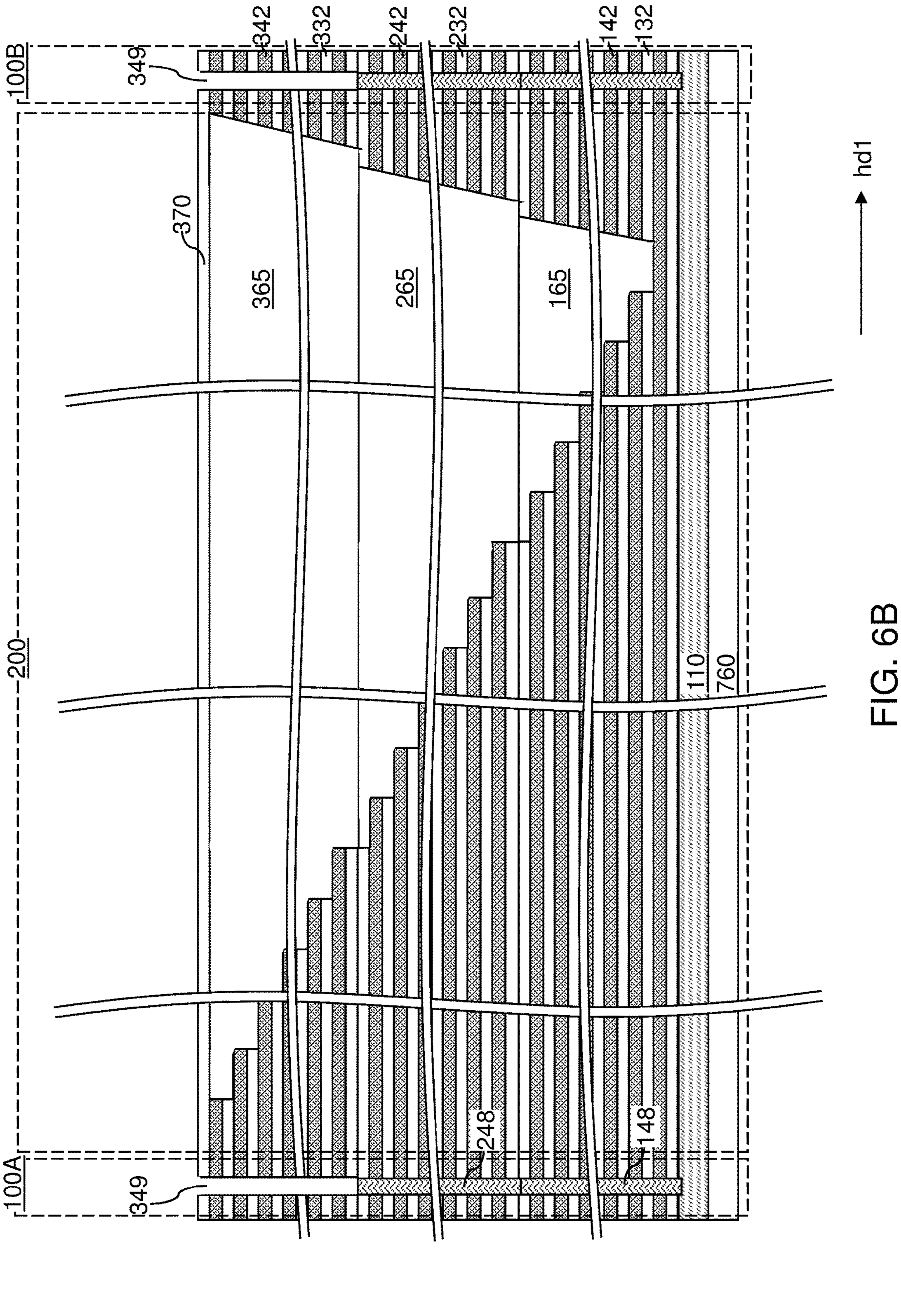
Figure 6C:
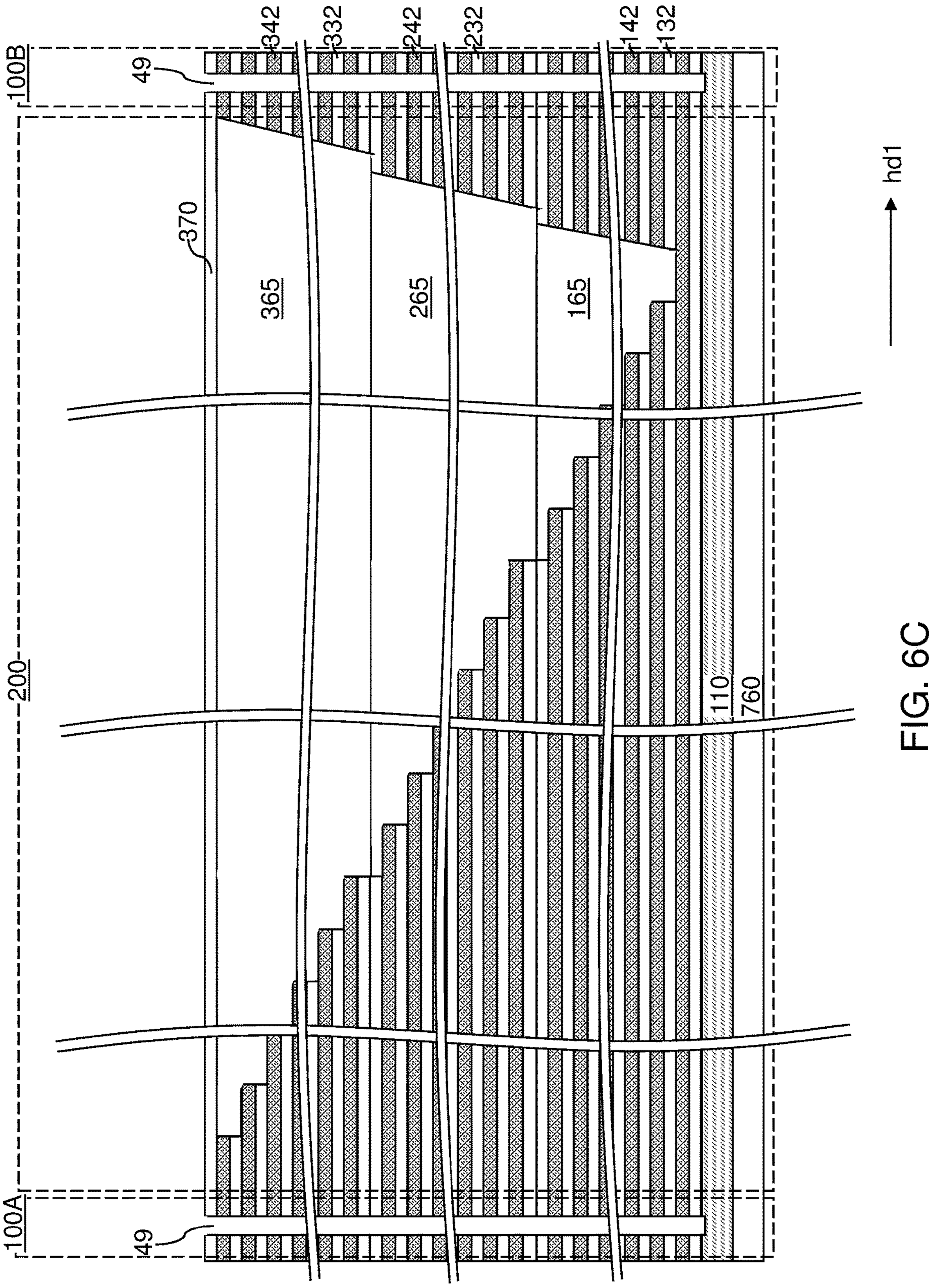

FIGS. 6A-6C are sequential vertical cross-sectional views of the exemplary structure during formation of inter-tier memory openings 49 according to an embodiment of the present disclosure.

Referring to FIG. 6A, the exemplary structure is illustrated at a processing step that corresponds to the processing steps of FIGS. 4A and 4B and FIGS. 5A-5E.

Referring to FIG. 6B, various third-tier openings may be formed through the third vertically alternating sequence (332, 342) and over the sacrificial first-tier opening fill portions. A photoresist layer (not shown) may be applied over the third vertically alternating sequence (332, 342), and may be lithographically patterned to form various openings therethrough. The pattern of openings in the photoresist layer may be transferred through the third vertically alternating sequence (332, 342) to form the various third-tier openings concurrently, i.e., during the third isotropic etch process.

The various third-tier openings may include third-tier memory openings formed in the memory array regions 100 and third-tier support openings formed in the inter-array region 200. Each third-tier opening may be formed within the area of a respective one of the sacrificial second-tier opening fill portions. Thus, a top surface of a sacrificial second-tier opening fill portion can be physically exposed at the bottom of each third-tier opening. Specifically, each third-tier memory openings 349 can be formed directly over a respective sacrificial second-tier memory opening fill portion 248, and each third-tier support opening can be formed directly over a respective sacrificial second-tier support opening fill portion. Each cluster of third-tier memory openings 349 may be formed as a two-dimensional array of third-tier memory openings 349. The third-tier support openings (not shown) are openings that are formed in the inter-array region 200, and are subsequently employed to form support pillar structures. A subset of the third-tier support openings may be formed through a respective horizontal surface of the third stepped surfaces.

Referring to FIG. 6C, the sacrificial first-tier fill material of the sacrificial second-tier opening fill portions 248 and the sacrificial first-tier opening fill portions 148 may be removed using an etch process that etches the sacrificial second-tier fill material and the sacrificial first-tier fill material selective to the materials of the insulating layers (132, 232, 332) and the sacrificial material layers (142, 242, 342). A memory opening, which is also referred to as an inter-tier memory opening 49, is formed in each combination of a third-tier memory openings 349 and volumes from which a sacrificial second-tier memory opening fill portions 248 and a sacrificial first-tier memory opening fill portion 148 are removed. A support opening, which is also referred to as an inter-tier support opening (not shown), is formed in each combination of a third-tier support openings and volumes from which a sacrificial second-tier support opening fill portion and a sacrificial first-tier support opening fill portion are removed. The inter-tier memory opening 49 extends through the third-tier structure, the second-tier structure, and the first-tier structure. Generally, memory openings 49 can be formed within each memory array region 100, in which each layer of the first vertically alternating sequence (132, 142), the second vertically alternating sequence (232, 242), and the third vertically alternating sequence (332, 342) is present.

FIGS. 7A-7E illustrate sequential vertical cross-sectional views of a memory opening 49 during formation of a memory opening fill structure 58 according to an embodiment of the present disclosure.

Figure 7B:
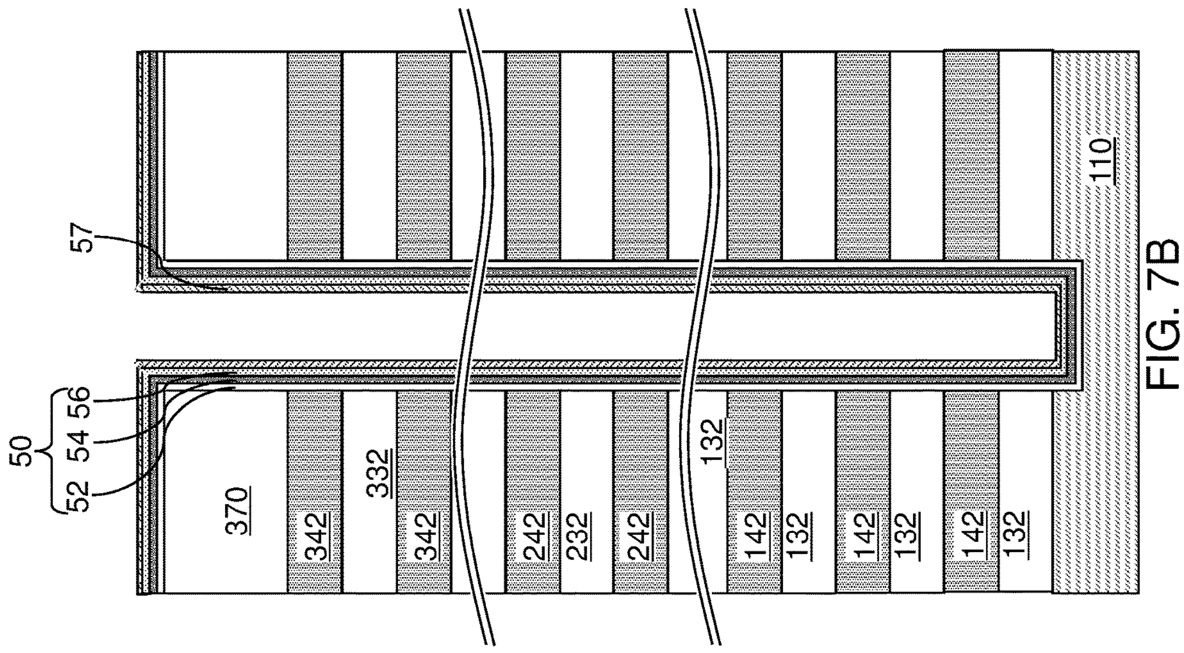
FIGS. 7A-7F illustrate sequential vertical cross-sectional views of a memory opening during formation of a memory opening fill structure according to an embodiment of the present disclosure.
Figure 7A:
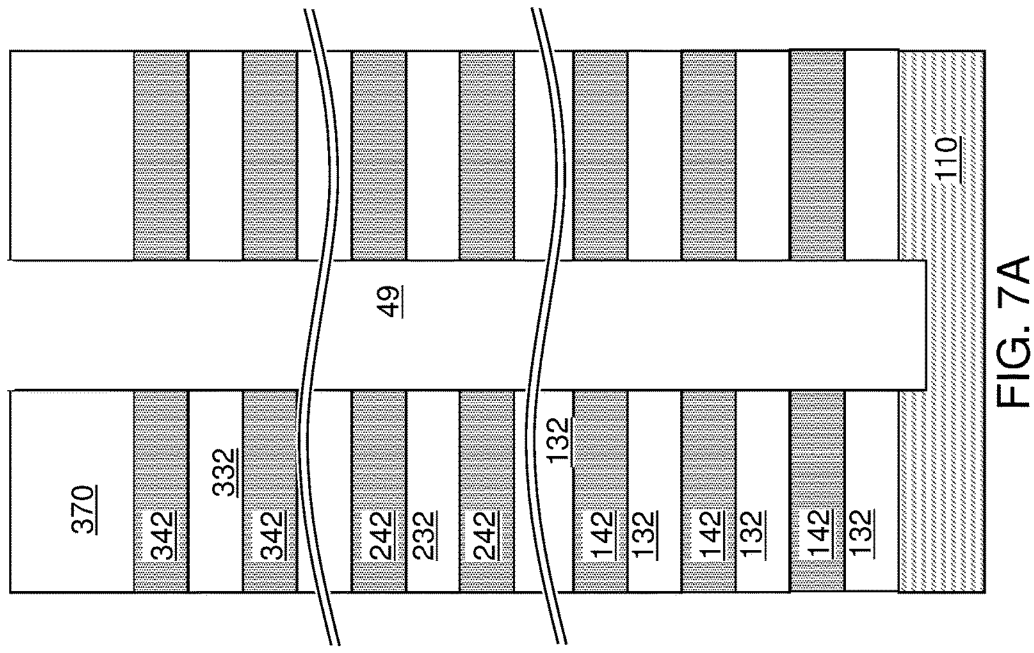

Referring to FIG. 7A, the inter-tier memory opening 49 at the processing steps of FIG. 6C is illustrated.

Referring to FIG. 7B, a stack of layers including a blocking dielectric layer 52, a charge storage layer 54, a tunneling dielectric layer 56, and an optional sacrificial cover layer 57 may be sequentially deposited in the inter-tier memory openings 49. The blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. Alternatively or additionally, the blocking dielectric layer 52 may include a dielectric semiconductor compound such as silicon oxide, silicon oxynitride, silicon nitride, or a combination thereof.

Subsequently, the charge storage layer 54 may be formed. In one embodiment, the charge storage layer 54 may be a continuous layer or patterned discrete portions of a charge trapping material including a dielectric charge trapping material, which may be, for example, silicon nitride. Alternatively, the charge storage layer 54 may include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242, 342). In one embodiment, the charge storage layer 54 includes a silicon nitride layer. In one embodiment, the sacrificial material layers (142, 242, 342) and the insulating layers (132, 232, 332) may have vertically coincident sidewalls, and the charge storage layer 54 may be formed as a single continuous layer. Alternatively, the sacrificial material layers (142, 242, 342) may be laterally recessed with respect to the sidewalls of the insulating layers (132, 232, 332), and a combination of a deposition process and an anisotropic etch process may be used to form the charge storage layer 54 as a plurality of memory material portions that are vertically spaced apart. The thickness of the charge storage layer 54 may be in a range from 2 nm to 20 nm, although lesser and greater thicknesses may also be used.

The tunneling dielectric layer 56 includes a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be used. The stack of the blocking dielectric layer 52, the charge storage layer 54, and the tunneling dielectric layer 56 constitutes a memory film 50 that stores memory bits.

The sacrificial cover layer 57 may comprise a sacrificial material that may be subsequently removed selective to the material of the tunneling dielectric layer 56. For example, the sacrificial cover layer may comprise a semiconductor material (e.g., amorphous silicon), silicon oxide, or a carbon-based material (such as amorphous carbon or diamond-like carbon). The thickness of the sacrificial cover layer may be in a range from 1 nm to 10 nm, although lesser and greater thicknesses may also be employed.

Figure 7C:
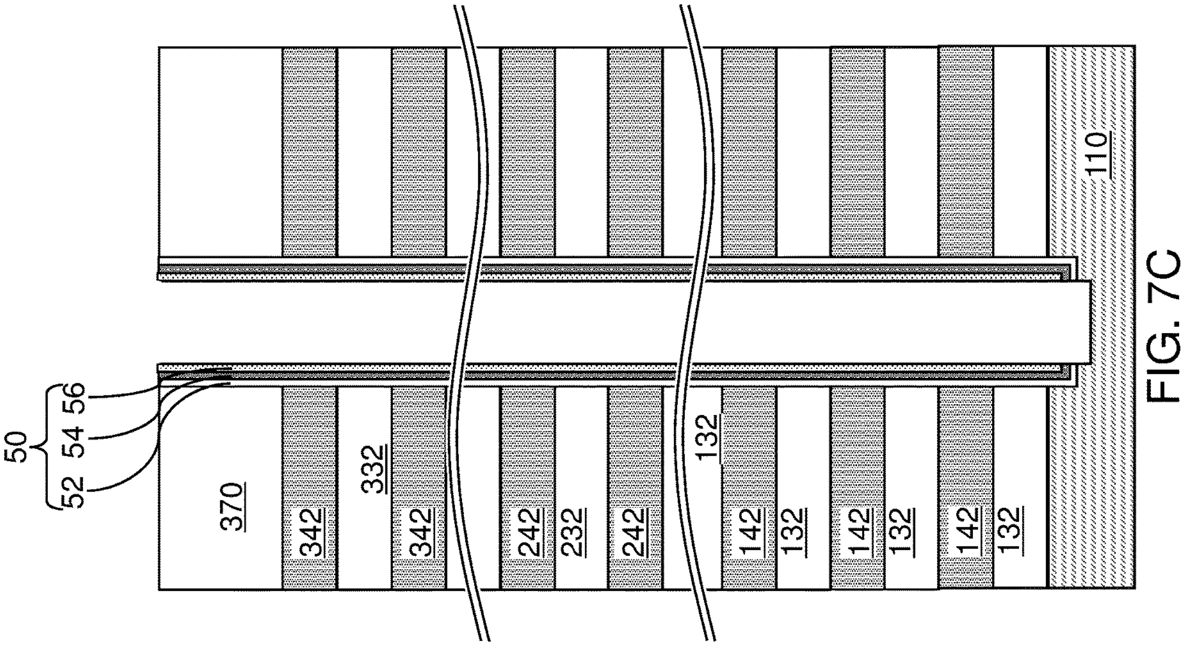

Referring to FIG. 7C, an anisotropic etch process may be performed to remove horizontal portions of the sacrificial cover layer 57, the tunneling dielectric layer 56, the charge storage layer 54, and the blocking dielectric layer 52. Remaining cylindrical portions of the sacrificial cover layer 57 may be removed selective to the material of the tunneling dielectric layer 56 during the anisotropic etch process, or by an isotropic etch process (such as a wet etch process) or by ashing. Alternatively, if the sacrificial cover layer 57 comprises a semiconductor material (e.g., amorphous silicon), then it may be retained.

Figure 7D:
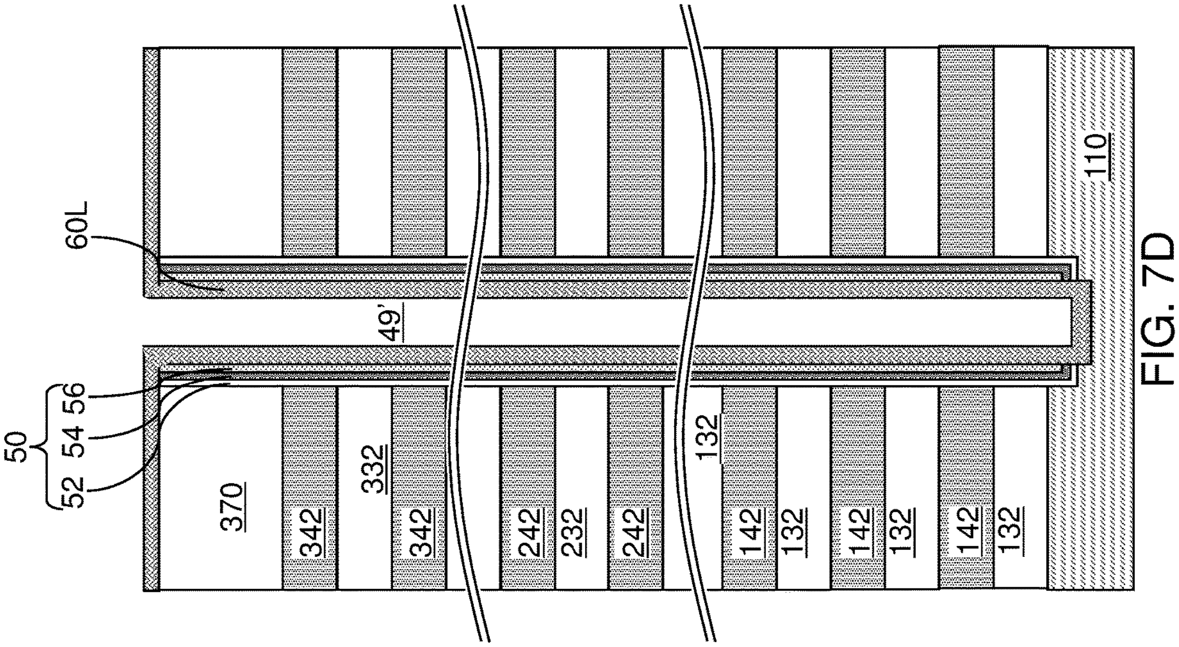

Referring to FIG. 7D, a semiconductor channel material layer 60L can be deposited by a conformal deposition process. The semiconductor channel material layer 60L includes a p-doped semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L may have a uniform doping. In one embodiment, the semiconductor channel material layer 60L has a p-type doping in which p-type dopants (such as boron atoms) are present at an atomic concentration in a range from $1.0\times10^{12}/cm^3$ to $1.0\times10^{18}/cm^3$, such as from $1.0\times10^{14}/cm^3$ to $1.0\times10^{17}/cm^3$. In one embodiment, the semiconductor channel material layer 60L includes, and/or consists essentially of, boron-doped amorphous silicon or boron-doped polysilicon. In another embodiment, the semiconductor channel material layer 60L has an n-type doping in which n-type dopants (such as phosphor atoms or arsenic atoms) are present at an atomic concentration in a range from $1.0\times10^{12}/cm^3$ to $1.0\times10^{18}/cm^3$, such as from $1.0\times10^{14}/cm^3$ to $1.0\times10^{17}/cm^3$. The semiconductor channel material layer 60L may be formed by a conformal deposition method such as low pressure chemical vapor deposition (LPCVD). The thickness of the semiconductor channel material layer 60L may be in a range from 2 nm to 10 nm, although lesser and greater thicknesses may also be used. A cavity 49' is formed in the volume of each inter-tier memory opening 49 that is not filled with the deposited material layers (52, 54, 56, 60L).

Figure 7F:
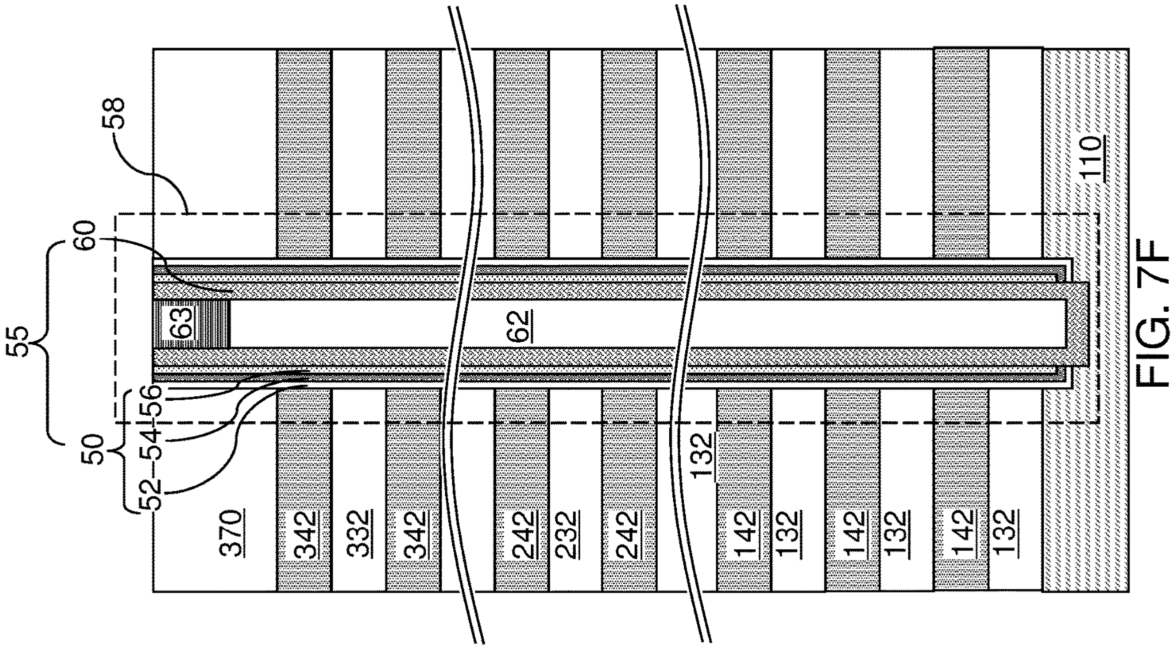
Figure 7E:
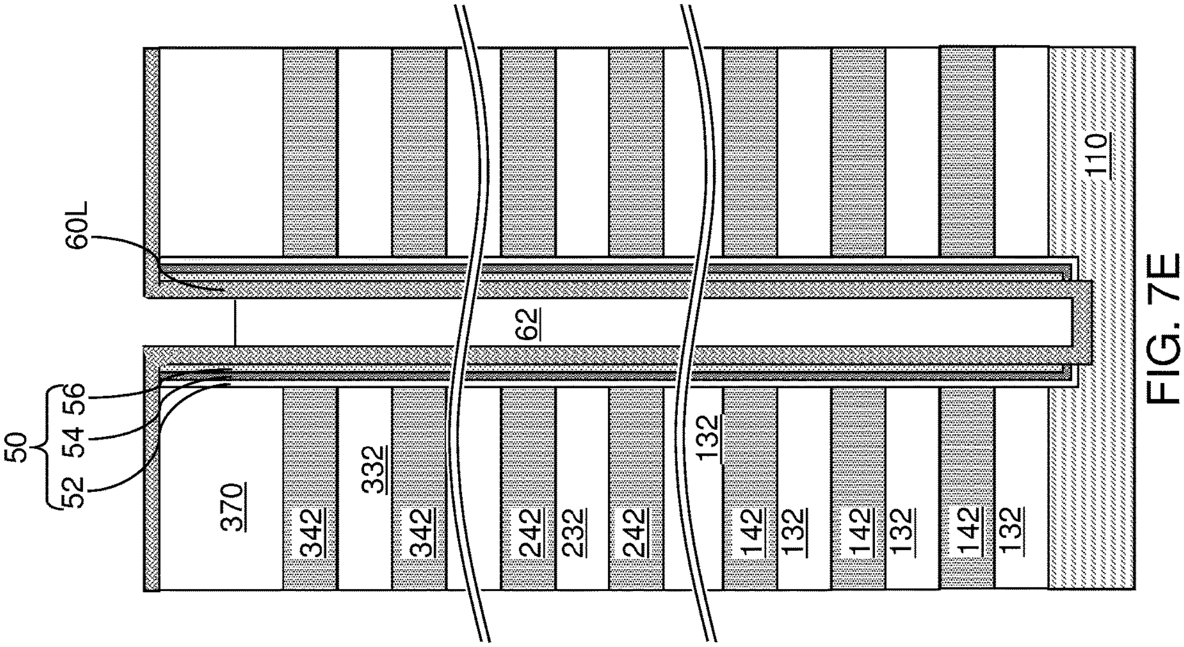

Referring to FIG. 7E, in case the cavity 49' in each memory opening is not completely filled by the semiconductor channel material layer 60L, a dielectric core layer may be deposited in the cavity 49' to fill any remaining portion of the cavity 49' within each memory opening. The dielectric core layer includes a dielectric material such as silicon oxide or organosilicate glass. The dielectric core layer may be deposited by a conformal deposition method such as low pressure chemical vapor deposition (LPCVD), or by a self-planarizing deposition process such as spin coating. The horizontal portion of the dielectric core layer overlying the top second insulating layer 232 may be removed, for example, by a recess etch. The recess etch continues until top surfaces of the remaining portions of the dielectric core layer are recessed to a height between the top and bottom surfaces of the topmost second insulating layer 232. Each remaining portion of the dielectric core layer constitutes a dielectric core 62.

Referring to FIG. 7F, a doped semiconductor material having a doping of a second conductivity type may be deposited in cavities overlying the dielectric cores 62. The second conductivity type is the opposite of the first conductivity type. For example, if the first conductivity type is p-type, the second conductivity type is n-type, and vice versa. Portions of the deposited doped semiconductor material, the semiconductor channel material layer 60L, the tunneling dielectric layer 56, the charge storage layer 54, and the blocking dielectric layer 52 that overlie the horizontal plane including the top surface of the topmost second insulating layer 232 may be removed by a planarization process such as a chemical mechanical planarization (CMP) process.

Each remaining portion of the doped semiconductor material of the second conductivity type constitutes a drain region 63. The dopant concentration in the drain regions 63 may be in a range from $5.0\times10^{18}/cm^3$ to $2.0\times10^{21}/cm^3$, although lesser and greater dopant concentrations may also be used. The doped semiconductor material may be, for example, doped polysilicon.

Each remaining portion of the semiconductor channel material layer 60L constitutes a vertical semiconductor channel 60 through which electrical current may flow when a vertical NAND device including the vertical semiconductor channel 60 is turned on. A tunneling dielectric layer 56 is surrounded by a charge storage layer 54, and laterally surrounds a vertical semiconductor channel 60. Each adjoining set of a blocking dielectric layer 52, a charge storage layer 54, and a tunneling dielectric layer 56 collectively constitute a memory film 50, which may store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 (which is a vertical semiconductor channel) within an inter-tier memory opening 49 constitutes a memory stack structure 55. The memory stack structure 55 is a combination of a vertical semiconductor channel 60, a tunneling dielectric layer 56, a plurality of memory elements comprising portions of the charge storage layer 54, and an optional blocking dielectric layer 52. The memory stack structures 55 can be formed through memory array regions 100 of the first and second vertically alternating sequences in which all layers of the first and second vertically alternating sequences are present. Each combination of a memory stack structure 55, a dielectric core 62, and a drain region 63 within an inter-tier memory opening 49 constitutes a memory opening fill structure 58. Generally, memory opening fill structures 58 are formed within the memory openings 49. Each of the memory opening fill structures 58 comprises a respective memory film 50 and a respective vertical semiconductor channel 60.

In one embodiment, each of the memory stack structures 55 comprises vertical NAND string including the respective vertical stack of memory elements (comprising portions of a charge storage layer 54 located at levels of the sacrificial material layers (142, 242, 342)) and a vertical semiconductor channel 60 that vertically extend through the sacrificial material layers (142, 242, 342) adjacent to the respective vertical stack of memory elements.

Figure 8A:
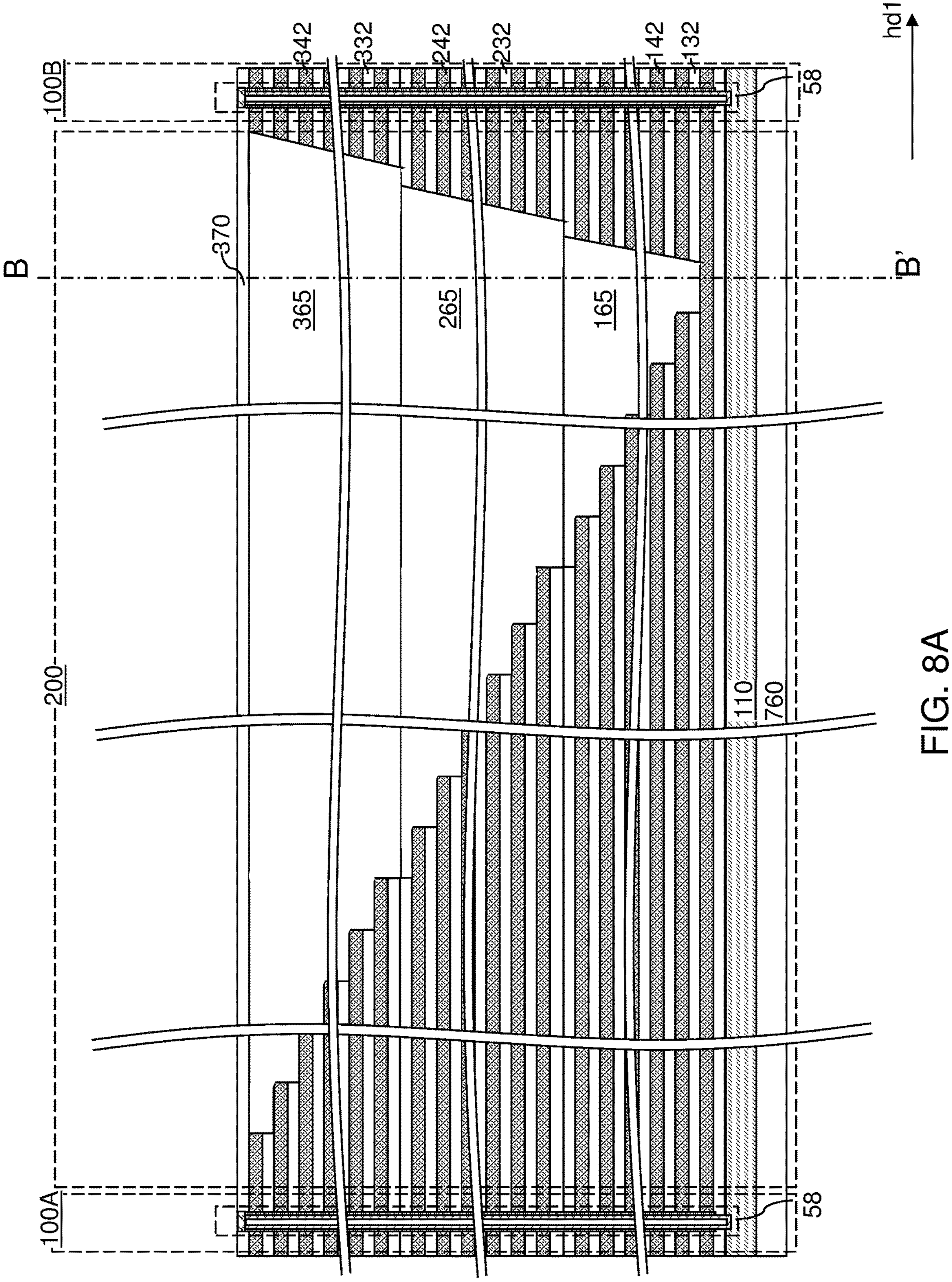
FIG. 8A and FIG. 8B are schematic vertical cross-sectional views of an exemplary structure after formation of memory opening fill structures and backside trenches according to an embodiment of the present disclosure.
Figure 8B:
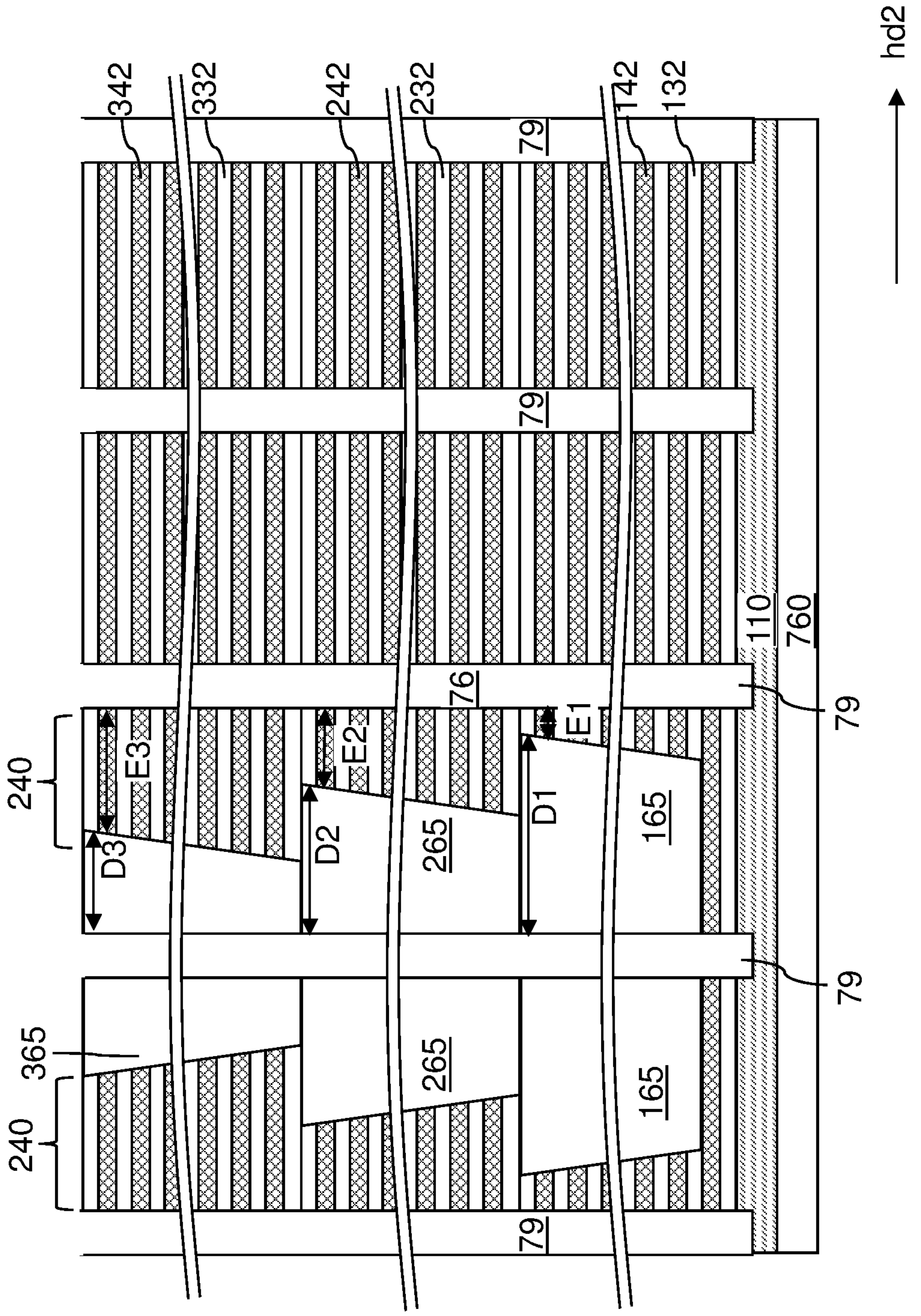

Referring to FIGS. 8A and 8B, an exemplary structure is illustrated after the processing steps of FIG. 7F, i.e., after formation of the memory opening fill structures 58 in the memory openings 49. In one embodiment, support pillar structures (not shown) may be formed in the support openings. Generally, each of the memory opening fill structures 58 comprises a respective vertical stack of memory elements located at levels of the electrically conductive layers (146, 246, 346) within the plurality of tier structures, and further comprises a respective vertical semiconductor channel 60 that vertically extends through the plurality of tier structures.

Subsequently, backside trenches 79 laterally extending along a first horizontal direction hd1 through the plurality of tier structures can be formed, as shown in FIG. 8B. The locations of the backside trenches 79 may be the same as the locations of the backside trench fill structures 76 illustrated in FIGS. 1A and 1E. Each of the vertically alternating sequences is divided into a respective set of alternating stacks {(132, 142), (232, 242), (332, 342)} of insulating layers (132, 232, 332) and sacrificial material layers (142, 242, 342) that are laterally spaced apart along a second horizontal direction hd2.

In one embodiment, a first backside trench 79 divides each dielectric material portion (165, 265, 365) into a pair of retro-stepped dielectric material portions (such as first-tier retro-stepped dielectric material portions 265, second-tier retro-stepped dielectric material portions 265 and/or third-tier retro-stepped dielectric material portions 365). Generally, a plurality of tier structures that are vertically stacked can be formed over a substrate 8. Each tier structure within the plurality of tier structures comprises a respective set of alternating stacks of insulating layers (132, 232, 332) and sacrificial material layers (142, 242, 342). A first tier structure within the plurality of tier structures comprises a pair of first retro-stepped dielectric material portions (such as first-tier retro-stepped dielectric material portions 165) that overlies a respective first alternating stack of first insulating layers 132 and first sacrificial material layers 142, and a second tier structure overlies the first tier level and comprises a pair of second retro-stepped dielectric material portions 265 having a partial areal overlap with a respective pair of the first retro-stepped dielectric material portions 165 in a plan view along a vertical direction that is perpendicular to a top surface of the substrate 8.

Figure 9:
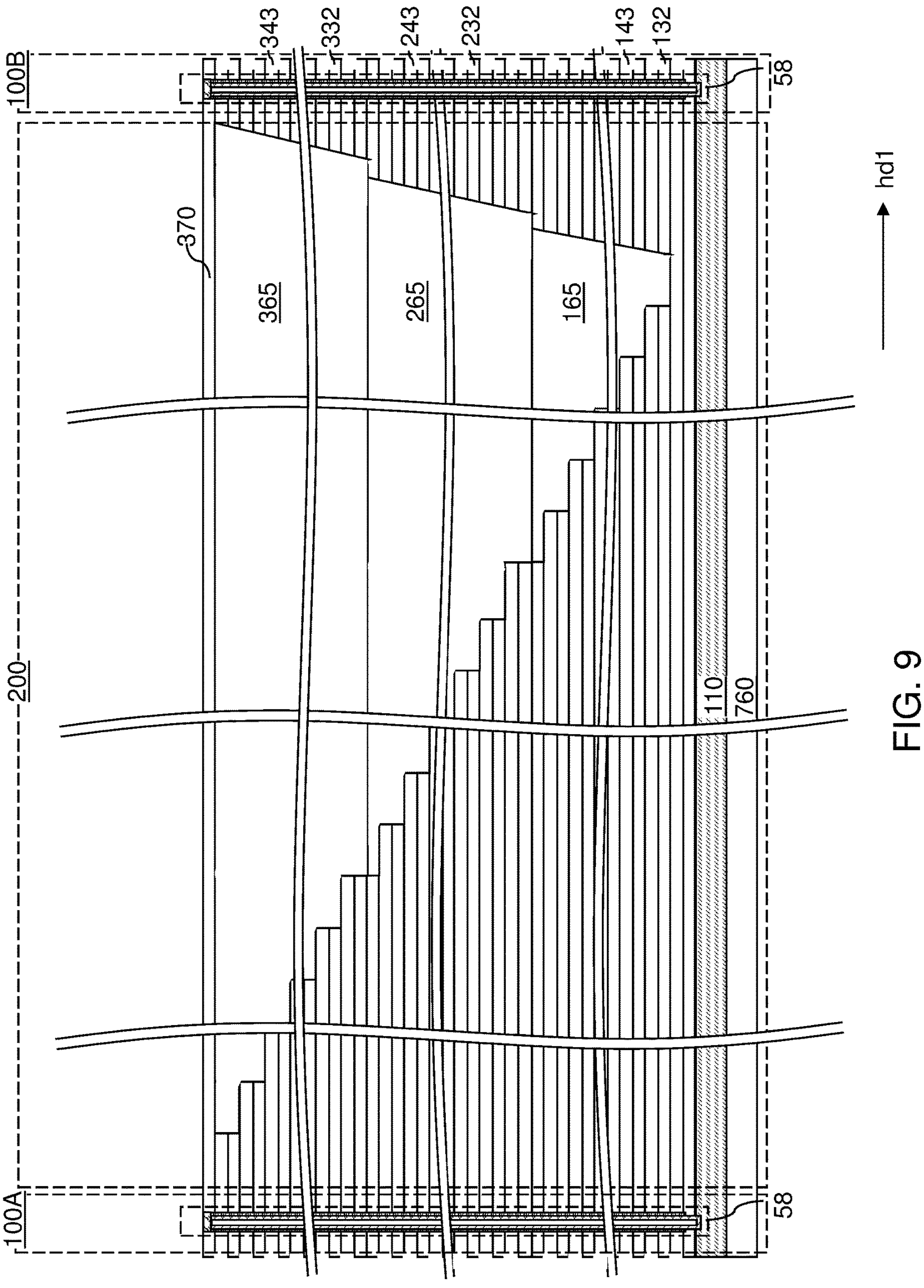
FIG. 9 is a schematic vertical cross-sectional view of an exemplary structure after formation of backside recesses according to an embodiment of the present disclosure.

Referring to FIG. 9, the sacrificial material layers (142, 242, 342) may be isotropically etched selective to the insulating layers (132, 232, 332), first retro-stepped dielectric material portions (such as first-tier retro-stepped dielectric material portions 165 or the second-tier retro-stepped dielectric material portions 265), second retro-stepped dielectric material portions (such as second-tier retro-stepped dielectric material portions 265 or the third-tier retro-stepped dielectric material portions 365), and any additional retro-stepped dielectric material portions by supplying an isotropic etchant into the backside trenches 79.

Generally, the sacrificial material layers (142, 242, 342) may be isotropically etched selective to the insulating layers (132, 232, 332), the retro-stepped dielectric material portions (165, 265, 365), and the semiconductor material layer 110 by supplying an isotropic etchant into the backside trenches. For example, an etchant that selectively etches the materials of the sacrificial material layers (142, 242, 342) with respect to the materials of the insulating layers (132, 232, 332), the retro-stepped dielectric material portions (165, 265, 365), and the material of the outermost layer of the memory films 50 may be introduced into the backside trenches, for example, using an isotropic etch process. For example, the sacrificial material layers (142, 242, 342) may include silicon nitride, the materials of the insulating layers (132, 232, 332), the retro-stepped dielectric material portions (165, 265, 365), and the outermost layer of the memory films 50 may include silicon oxide materials.

The isotropic etch process may be a wet etch process using a wet etch solution, or may be a gas phase (dry) etch process in which the etchant is introduced in a vapor phase into the backside trench. For example, if the sacrificial material layers (142, 242, 342) include silicon nitride, the etch process may be a wet etch process in which the exemplary structure is immersed within a wet etch tank including phosphoric acid, which etches silicon nitride selective to silicon oxide, silicon, and various other materials used in the art.

Backside recesses (143, 243, 343) are formed in volumes from which the sacrificial material layers (142, 242, 342) are removed. The backside recesses (143, 243, 343) include first backside recesses 143 that are formed in volumes from which the first sacrificial material layers 142 are removed, second backside recesses 243 that are formed in volumes from which the second sacrificial material layers 242 are removed, and third backside recesses 343 that are formed in volumes from which the third sacrificial material layers 342 are removed. Each of the backside recesses (143, 243, 343) may be a laterally extending cavity having a lateral dimension that is greater than the vertical extent of the cavity. In other words, the lateral dimension of each of the backside recesses (143, 243, 343) may be greater than the height of the respective backside recess. A plurality of backside recesses (143, 243, 343) may be formed in the volumes from which the material of the sacrificial material layers (142, 242, 342) is removed. Each of the backside recesses (143, 243, 343) may extend substantially parallel to the top surface of the semiconductor material layer 110. A backside recess (143, 243, 343) may be vertically bounded by a top surface of an underlying insulating layer (132, 232, 332) and a bottom surface of an overlying insulating layer (132, 232, 332). In one embodiment, each of the backside recesses (143, 243, 343) may have a uniform height throughout.

Figure 10A:
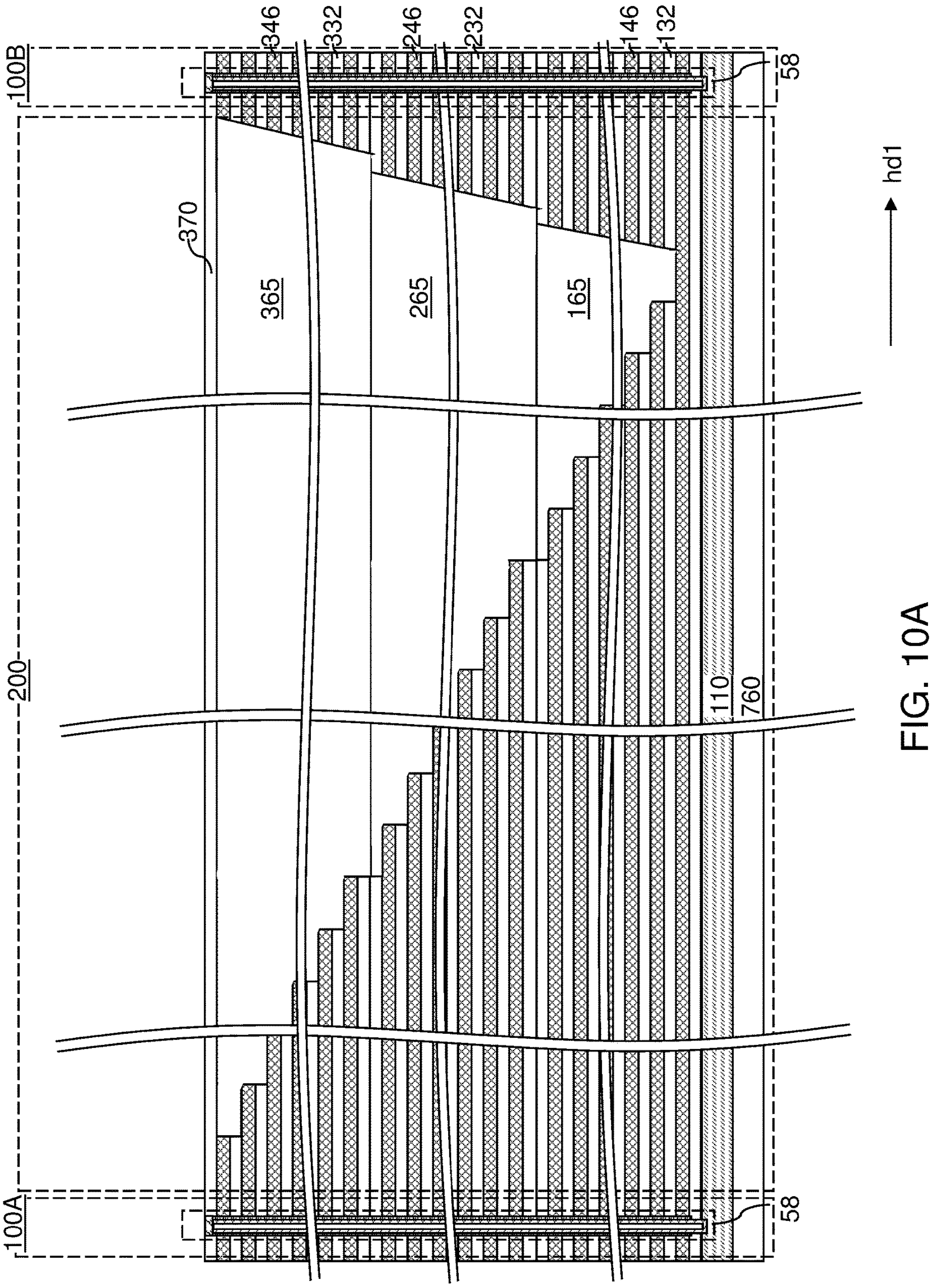
FIG. 10A is a schematic vertical cross-sectional view of an exemplary structure after formation of electrically conductive layers according to an embodiment of the present disclosure.
Figure 10B:
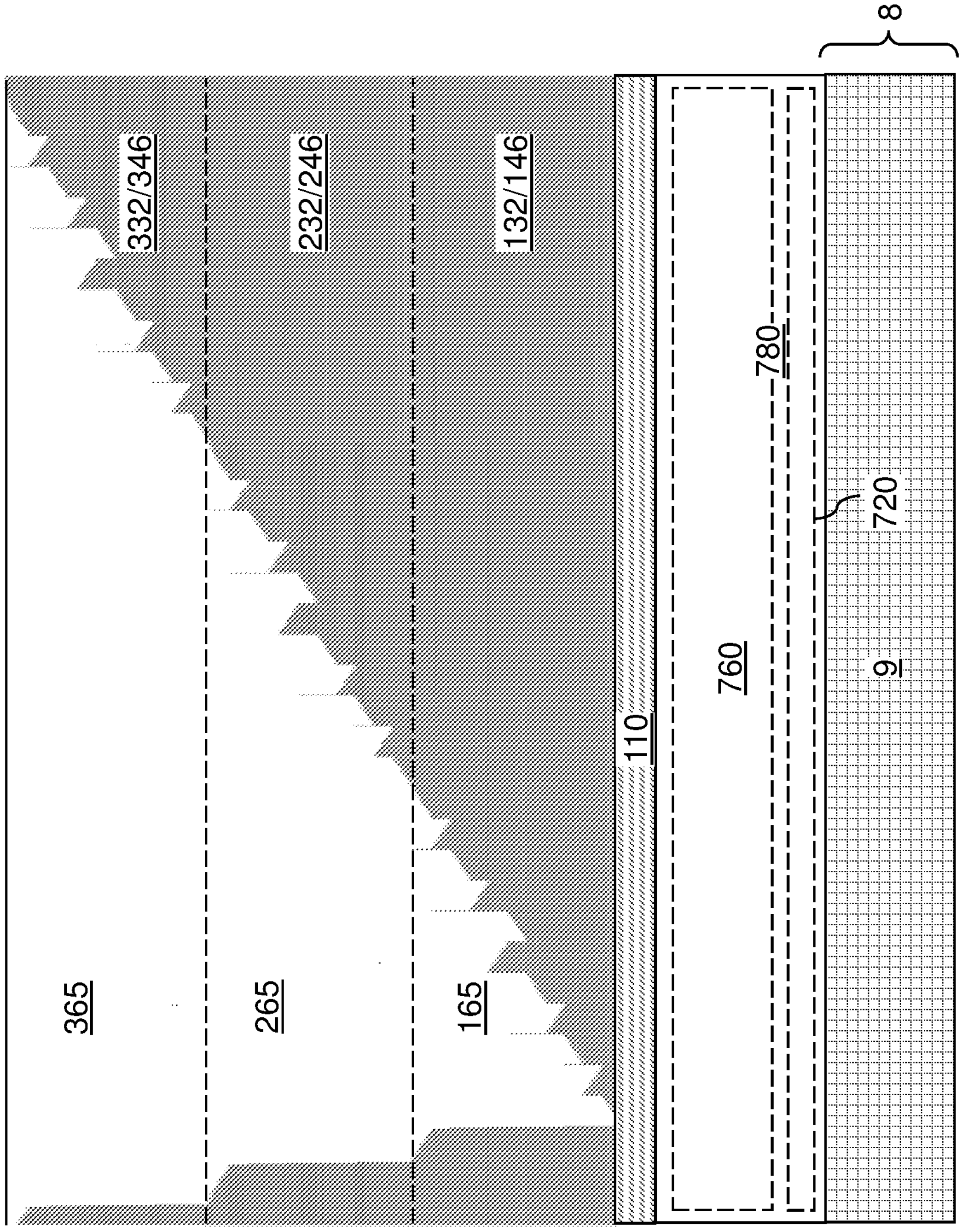
FIG. 10B is another schematic vertical cross-sectional view of the exemplary structure of FIG. 10A.

Referring to FIGS. 10A and 10B, an optional backside blocking dielectric layer (not shown) may be optionally deposited in the backside recesses (143, 243, 343) and the backside trenches. The backside blocking dielectric layer includes a dielectric material such as a dielectric metal oxide (e.g., aluminum oxide), silicon oxide, or a combination thereof.

Electrically conductive layers (146, 246, 346) may be deposited in remaining volumes of the backside recesses (143, 243, 343) by performing a conformal deposition process in which a precursor gas for a conductive material of the electrically conductive layers (146, 246, 346) is supplied into the backside recesses (143, 243, 343) through the backside trenches 79. At least one conductive material may be deposited in the plurality of backside recesses (143, 243, 343), on the sidewalls of the backside trenches, and over the topmost tier structure. The at least one conductive material may be deposited by a conformal deposition method, which may be, for example, chemical vapor deposition (CVD), atomic layer deposition (ALD), electroless plating, electroplating, or a combination thereof. The at least one conductive material may include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material may include at least one metallic material, i.e., an electrically conductive material that includes at least one metallic element. Non-limiting exemplary metallic materials that may be deposited in the backside recesses (143, 243, 343) include tungsten, tungsten nitride, titanium, titanium nitride, tantalum, tantalum nitride, cobalt, and ruthenium. For example, the at least one conductive material may include a conductive metallic nitride liner that includes a conductive metallic nitride material such as TiN, TaN, WN, or a combination thereof, and a conductive fill material such as W, Co, Ru, Mo, Cu, or combinations thereof. In one embodiment, the at least one conductive material for filling the backside recesses (143, 243, 343) may be a combination of titanium nitride layer and a tungsten fill material.

Electrically conductive layers (146, 246, 346) may be formed in the backside recesses (143, 243, 343) by deposition of the at least one conductive material. A plurality of first electrically conductive layers 146 may be formed in the plurality of first backside recesses 143, a plurality of second electrically conductive layers 246 may be formed in the plurality of second backside recesses 243, a plurality of third electrically conductive layers 346 may be formed in the plurality of third backside recesses 343, and a continuous metallic material layer (not shown) may be formed on the sidewalls of each backside trench and over the topmost tier structure. Each of the electrically conductive layers (146, 246, 346) may include a respective conductive metallic nitride liner and a respective conductive fill material. Thus, the sacrificial material layers (142, 242, 342) may be replaced with the electrically conductive layers (146, 246, 346), respectively. Specifically, each first sacrificial material layer 142 may be replaced with an optional portion of the backside blocking dielectric layer and a first electrically conductive layer 146, each second sacrificial material layer 242 may be replaced with an optional portion of the backside blocking dielectric layer and a second electrically conductive layer 246, and each third sacrificial material layer 342 may be replaced with an optional portion of the backside blocking dielectric layer and a third electrically conductive layer 346. A backside cavity is present in the portion of each backside trench that is not filled with the continuous metallic material layer.

The continuous metallic material layer is formed at peripheral regions of the backside trenches 79 and over the plurality of tier structures during formation of the electrically conductive layers (146, 246, 346).

Residual conductive material of the continuous metallic material layer may be removed from inside the backside trenches 79 and from above the plurality of tier structures. Specifically, the deposited metallic material of the continuous metallic material layer may be etched back from the sidewalls of each backside trench and from above the topmost tier structure, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Each remaining portion of the deposited metallic material in the third backside recesses constitutes a third electrically conductive layer 346. Sidewalls of the electrically conductive layers (146, 246, 346) may be physically exposed to a respective backside trench 79.

Each electrically conductive layer (146, 246, 346) may be a conductive sheet including openings therein. A first subset of the openings through each electrically conductive layer (146, 246, 346) may be filled with memory opening fill structures 58. A second subset of the openings through each electrically conductive layer (146, 246, 346) may be filled with the support pillar structures 20.

A subset of the electrically conductive layers (146, 246, 346) may comprise word lines for the memory elements. The semiconductor devices in the underlying semiconductor devices 720 may comprise word line switch devices configured to control a bias voltage to respective word lines, and/or bit line driver devices, such as sense amplifiers. The memory-level assembly is located over the substrate semiconductor layer 9. The memory-level assembly includes at least one alternating stack (132, 146, 232, 246, 332, 346) and memory stack structures 55 vertically extending through the at least one alternating stack (132, 146, 232, 246, 332, 346). Each of the memory stack structures 55 comprises a vertical stack of memory elements located at each level of the electrically conductive layers (146, 246, 346).

FIGS. 11A-11D are schematic vertical cross-sectional view of various configurations of the exemplary structure of FIGS. 10A and 10B. Referring to FIGS. 11A-11D, backside trench fill structures 76 are formed in the volumes of the backside trenches 79 after removal of the continuous metallic material layer.

A backside trench fill structure 76 can be formed in each backside trench 79. In one embodiment, an insulating liner layer including a dielectric material (such as silicon oxide) can be conformally deposited at a periphery of each backside trench, and can be anisotropically etched to form an insulating spacer within each backside trench. At least one conductive material can be deposited in remaining volumes of the backside trenches, and excess portions of the at least one conductive material can be removed from above the topmost tier structure by a planarization process. Each remaining portion of the at least one conductive material contacting a source region and laterally surrounded by a respective insulating spacer constitutes a backside contact via structure, which laterally extends along the first horizontal direction hd1. Each contiguous combination of an insulating spacer and a backside contact via structure that fills a backside trench constitutes a backside trench fill structure 76.

Alternatively, at least one dielectric material, such as silicon oxide, may be conformally deposited in the backside trenches by a conformal deposition process. Each portion of the deposited dielectric material that fills a backside trench constitutes a backside trench fill structure 76. In this case, each backside trench fill structure may fill the entire volume of a backside trench and may consist essentially of at least one dielectric material. In this alternative embodiment, the source region may be omitted, and a horizontal source line (e.g., a direct strap contact layer) may contact a side of the lower portion of the semiconductor channel 60.

Various contact via structures can be subsequently formed. The various contact via structures can include drain contact via structures (not shown) that are formed in the memory array regions 100 on a top surface of a respective drain region 63. The various contact via structures can include layer contact via structures (86A, 86B, 86C) that are formed in the inter-array region 200 as illustrated in FIGS. 1A-1E. The layer contact via structures (86A, 86B, 86C) can include first contact via structures 86A that contact a respective first electrically conductive layer 146, second contact via structures 86B that contact a respective second electrically conductive layer 246, and third contact via structures 86C that contact a respective third electrically conductive layer 346.

Figure 11A:
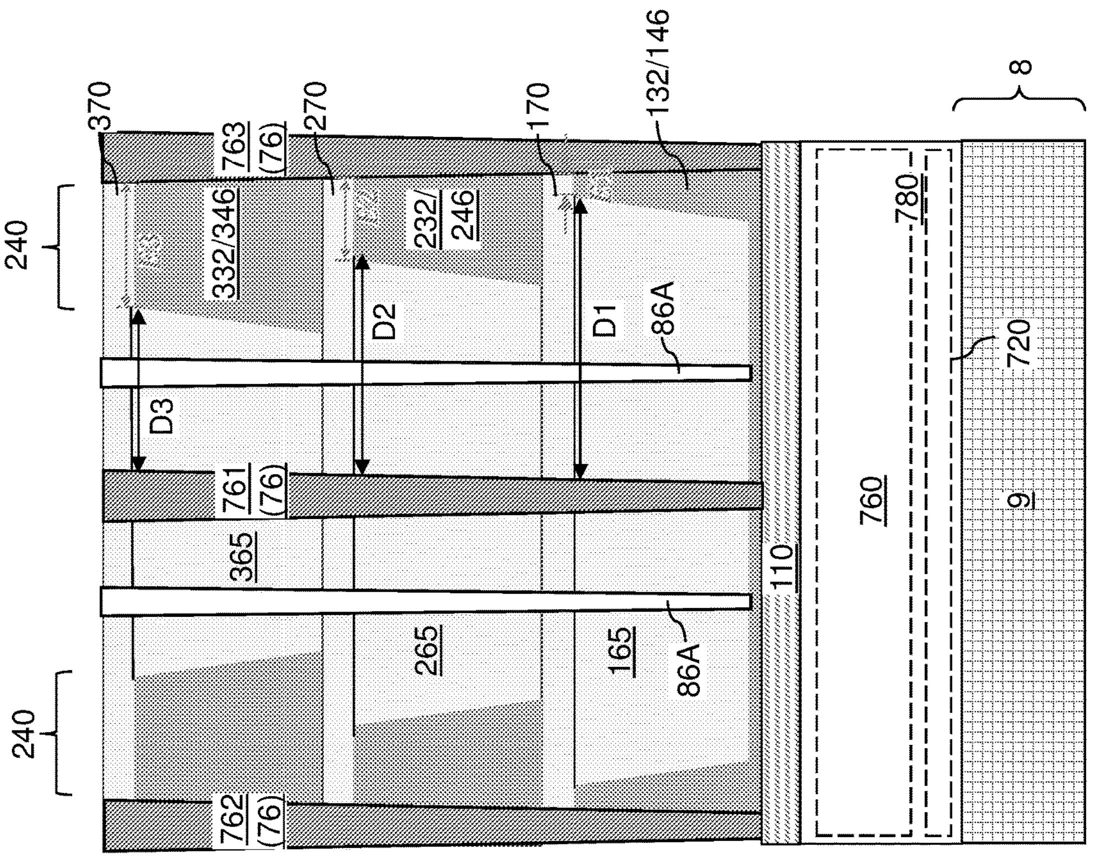
FIGS. 11A-11D are schematic vertical cross-sectional view of various configurations of the exemplary structure of FIGS. 10A and 10B.
Figure 11B:
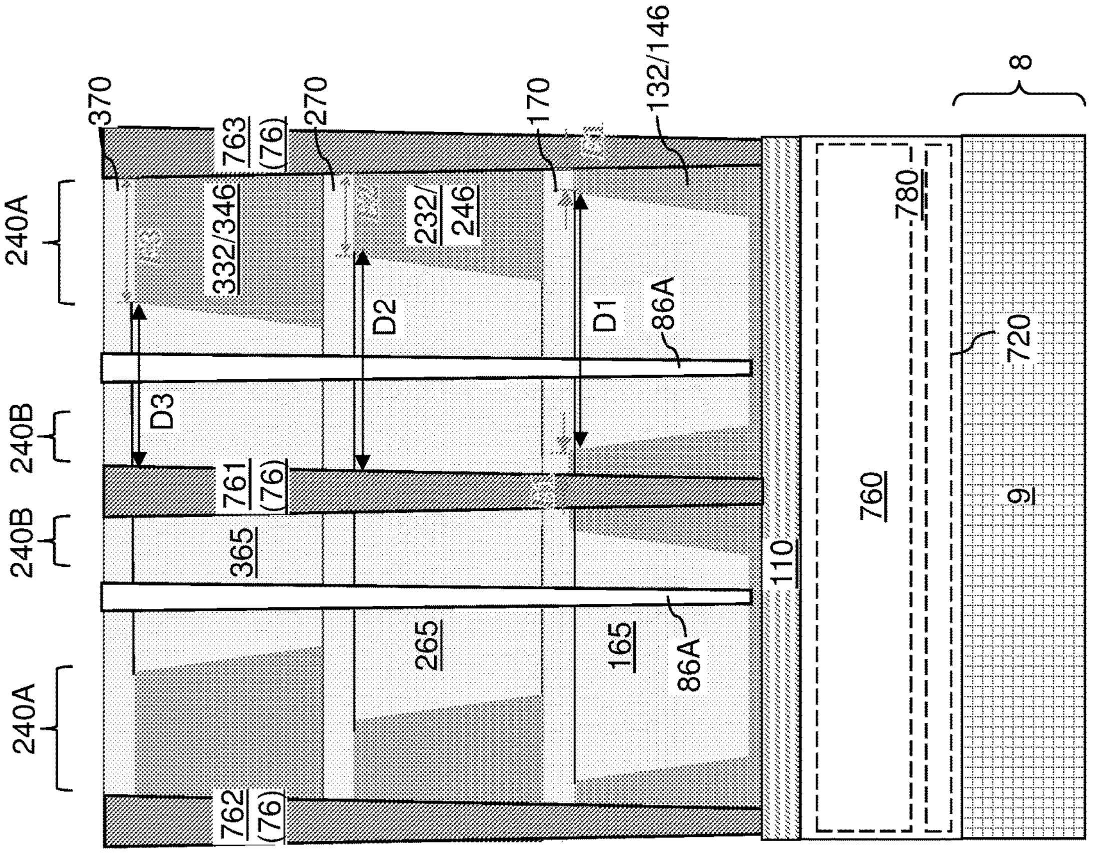
Figure 11C:
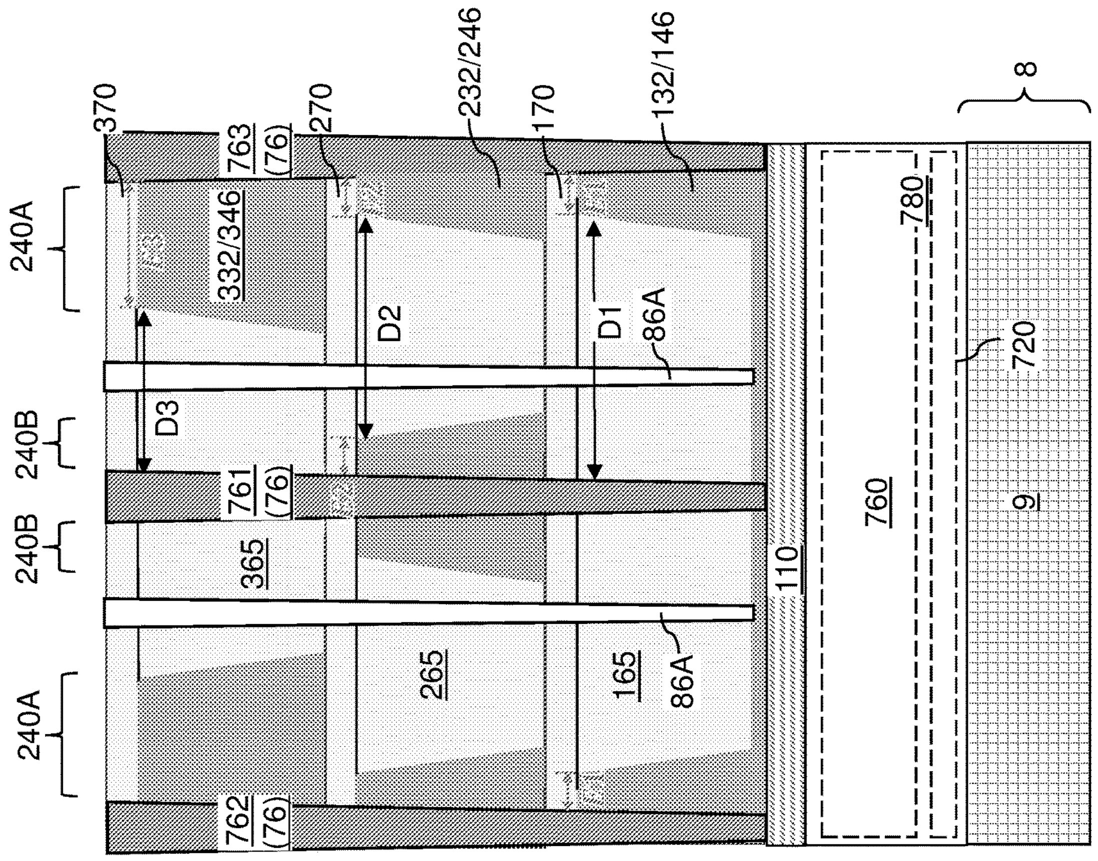
Figure 11D:
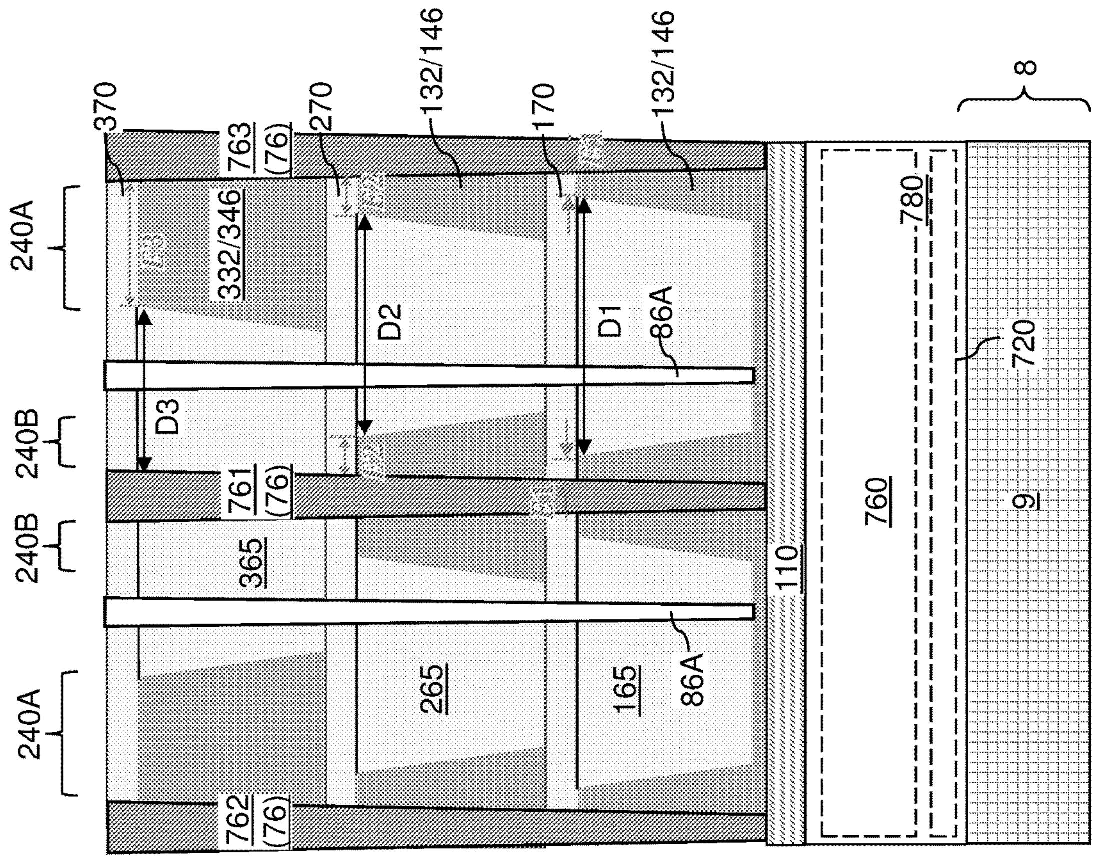
Figure 11E:
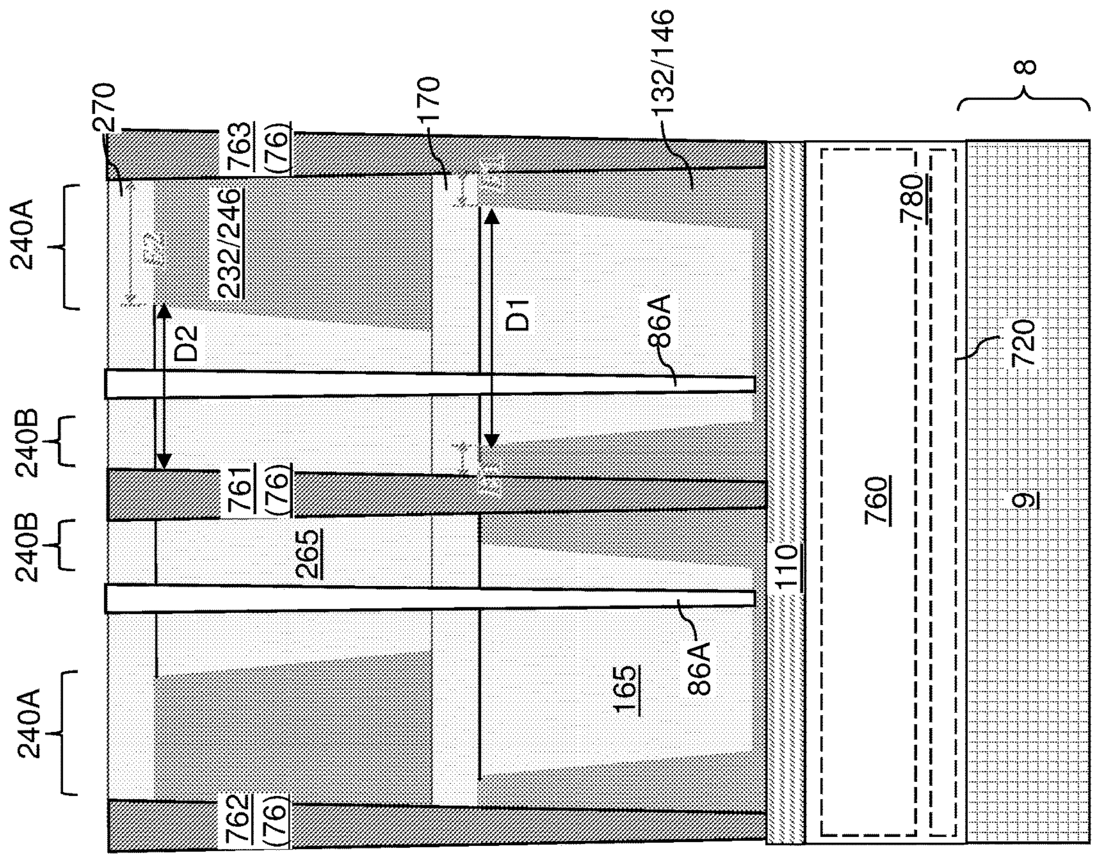
FIG. 11E is a schematic vertical cross-sectional view of another exemplary structure according to an embodiment of the present disclosure.

Referring collectively to FIGS. 11B, 11D and 11E, first retro-stepped dielectric material portions 165 are not physically exposed to any of the backside trenches 79 upon formation of the backside trenches. In some embodiments, second retro-stepped dielectric material portions (such as second-tier retro-stepped dielectric material portions 265 and/or third-tier retro-stepped dielectric material portions 365) are cut through during formation of the backside trenches 79 by a first subset of the backside trenches, and the cut portions of the second retro-stepped dielectric material portions are physically exposed to the first subset of the backside trenches, and are not physically exposed to a second subset of the backside trenches. Thus, each cut portion of the second retro-stepped dielectric material portions (such as second-tier retro-stepped dielectric material portions 265 and/or third-tier retro-stepped dielectric material portions 365) may be physically exposed only to a respective first backside trench, and is not physically exposed to any other backside trench other than the respective first backside trench.

In one embodiment, each of the first-tier retro-stepped dielectric material portions 165 may have a first width D1 along the second horizontal direction hd2 at a topmost surface, each of the second-tier retro-stepped dielectric material portions 265 may have a second width D2 along the second horizontal direction hd2 at a topmost surface, and each of the third-tier retro-stepped dielectric material portions 365 may have a third width D3 along the second horizontal direction hd2 at a topmost surface. The first width D1 is greater than the second width D2, and the second width D2 is greater than the third width D3.

Referring to all drawings and according to various embodiments of the present disclosure, a multi-tier memory device comprises a substrate 8, and a plurality of tier structures located at multiple-tier levels that are vertically spaced from the substrate 8 by different vertical spacings. Each of the plurality of tier structures comprises backside trench fill structures 76 laterally extending through each of the plurality of tier structures along the first horizontal direction hd1, and are laterally spaced apart from each other along the second horizontal direction hd2. Each of the plurality of tier structures also comprises alternating stacks of insulating layers (132, 232, 332) and electrically conductive layers (146, 246, 346) that are laterally spaced apart from each other along the second horizontal direction hd2 by the backside trench fill structures 76, laterally extend along the first horizontal direction hd1 through the inter-array region 200, the first memory array region 100A and the second memory array region 100B that is laterally spaced apart along the first horizontal direction hd1 from the first memory array region 100A by the inter-array region 200. Each of the plurality of tier structures further comprises memory opening fill structures 58 that vertically extend through each of the plurality of tier structures. Each of the memory opening fill structures 58 comprises a respective vertical semiconductor channel 60 and vertical stack of memory elements (e.g., portions of the charge storage region 54 of the memory film) located at levels of the electrically conductive layers (146, 246, 346).

Each of the alternating stacks includes stepped surfaces in the inter-array region 200. Each electrically conductive layer (146, 246, 346) within the alternating stacks has a respective bridge region 240 having a respective strip width (E1, E2, E3) along the second horizontal direction hd2 within the inter-array region 200, and has a respective uniform width along the second horizontal direction hd2 greater than the strip width in the first memory array region 100A, the second memory array region 100B, and portions of the inter-array region 200 located outside the bridge region 240. The strip width E1 of a topmost electrically conductive layer 146 in a first-tier alternating stack (132, 146) is smaller than the strip width E2 of a topmost electrically conductive layer 246 in a second-tier alternating stack (232, 246) which overlies the first-tier alternating stack (132, 146).

In some embodiments shown in FIGS. 11A-11D, the strip width E2 of a topmost electrically conductive layer 246 in the second-tier alternating stack (232, 246) is smaller than the strip width E3 of a topmost electrically conductive layer 346 in a third-tier alternating stack (332, 346) which overlies the second-tier alternating stack (232, 246).

In one embodiment, each of the backside trench fill structures 76 comprises a dielectric material portion that continuously extends from a top surface of the substrate to a topmost surface of the plurality of tier structures. In one embodiment, each of the plurality of tier structures further comprises a respective retro-stepped dielectric material portion (165, 265, 365) which contacts the stepped surfaces of the respective alternating stacks in the inter-array region 200.

In some embodiments shown in FIGS. 11B and 11E a pair of first retro-stepped dielectric material portions 165 is located at a first-tier level, and comprises a respective pair of bottommost surfaces that are laterally spaced from a first backside trench fill structure 761 of the backside trench fill structures 76 along the second horizontal direction hd2. A pair of second retro-stepped dielectric material portions 265 is located at a second-tier level that overlies the first-tier level, and comprises a respective pair of bottommost surfaces contacting a respective lengthwise sidewall of the first backside trench fill structure 761.

In the embodiments shown in FIGS. 11B and 11E, each of the electrically conductive layers 146 within the first-tier alternating stack (132, 146) has a respective first bridge region 240A having a first part of the respective strip width E1 and a respective second bridge region 240B having a second part of the respective strip width E1. For example, if E3 equals to a width Y, then E2=⅔Y, E1=⅓Y and the first and second parts of E1 equal to ⅙Y (in case the first and second parts have an equal width). The first bridge region 240A is located between the first backside trench fill structure 761 and a second backside trench fill structure 762 of the trench fill structures 76 along the second horizontal direction hd2. A first one (e.g., the left side one) of the pair of first retro-stepped dielectric material portions 165 is located between the first and the second bridge regions (761, 762) along the second horizontal direction hd2. In contrast, each of the electrically conductive layers 246 within the second-tier alternating stack (232, 246) has one bridge region 240A having the respective strip width E2 between the first and the second backside trench fill structures (761, 762) along the second horizontal direction hd2.

In the alternative embodiment of FIG. 11C, the electrically conductive layers 246 of the second-tier alternating stacks have the split bridge regions 240A and 240B, while the electrically conductive layers (146, 346) of the first and third-tier alternating stacks have a single bridge region 240A.

In the alternative embodiment of FIG. 11D, the electrically conductive layers (146, 246) of the first and second-tier alternating stacks have the split bridge regions 240A and 240B, while the electrically conductive layers 346 of the third-tier alternating stack have a single bridge region 240A.

In the embodiments shown in FIGS. 11B and 11E, each of the pair of second retro-stepped dielectric material portions 265 contacts the respective lengthwise sidewall of the first backside trench fill structure 761 between a horizontal plane including bottommost surfaces of the pair of second retro-stepped dielectric material portions and a horizontal plane including topmost surfaces of the pair of second retro-stepped dielectric material portions. In contrast, each of the pair of first retro-stepped dielectric material portions 165 is laterally spaced from and does not contact the first backside trench fill structure 761.

In the embodiments shown in FIGS. 11B and 11E, the backside trench fill structures 76 comprise a second backside trench fill structure 762 and a third backside trench fill structure 763 that are nearest neighboring backside trench fill structures of the first backside trench fill structure 761. Each of the pair of first retro-stepped dielectric material portions 165 is not in contact with and is laterally spaced along the second horizontal direction hd2 from the second backside trench fill structure 762 and the third backside trench fill structure 763. Each of the pair of second retro-stepped dielectric material portions 265 is not in contact with and is laterally spaced along the second horizontal direction hd2 from the second backside trench fill structure 762 and the third backside trench fill structure 763.

In one embodiment, a width D1 of one of the pair of first retro-stepped dielectric material portions 165 along the second horizontal direction h2 is greater than a width D2 of one of the pair of second retro-stepped dielectric material portions 265 along the second horizontal direction hd2.

In one embodiment, a pair of third retro-stepped dielectric material portions 365 of the retro-stepped dielectric material portions is located at a third-tier level that overlies the second-tier level, and comprises a respective pair of bottommost surfaces that are in direct contact with the first backside trench fill structure 761.

In one embodiment, layer contact via structures 86A vertically extend through the retro-stepped dielectric material portions (165, 265, 365), and contact a respective one of the electrically conductive layers 146.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A multi-tier memory device, comprising:

a substrate; and a plurality of tier structures located at multiple-tier levels that are vertically spaced from the substrate by different vertical spacings, wherein each of the plurality of tier structures comprises:

backside trench fill structures laterally extending through each of the plurality of tier structures along a first horizontal direction, and are laterally spaced apart from each other along a second horizontal direction;

alternating stacks of insulating layers and electrically conductive layers that are laterally spaced apart from each other along the second horizontal direction by the backside trench fill structures, laterally extend along the first horizontal direction through an inter-array region, a first memory array region and a second memory array region that is laterally spaced apart along the first horizontal direction from the first memory array region by the inter-array region; and memory opening fill structures that vertically extend through each of the plurality of tier structures, wherein each of the memory opening fill structures comprises a respective vertical semiconductor channel and vertical stack of memory elements located at levels of the electrically conductive layers, wherein:

each of the alternating stacks includes stepped surfaces in the inter-array region;

each electrically conductive layer within the alternating stacks has a respective bridge region having a respective strip width along the second horizontal direction within the inter-array region, and has a respective uniform width along the second horizontal direction greater than the strip width in the first memory array region, the second memory array region, and portions of the inter-array region located outside the bridge region; and the strip width of a topmost electrically conductive layer in a first-tier alternating stack is smaller than the strip width of a topmost electrically conductive layer in a second-tier alternating stack which overlies the first-tier alternating stack;

wherein:

each of the plurality of tier structures further comprises a respective retro-stepped dielectric material portion which contacts the stepped surfaces in the inter-array region;

a pair of first retro-stepped dielectric material portions of the retro-stepped dielectric material portions is located at a first-tier level, and comprises a respective pair of bottommost surfaces that are laterally spaced from a first backside trench fill structure of the backside trench fill structures along the second horizontal direction; and a pair of second retro-stepped dielectric material portions of the retro-stepped dielectric material portions is located at a second-tier level that overlies the first-tier level, and comprises a respective pair of bottommost surfaces contacting a respective lengthwise sidewall of the first backside trench fill structure.

2. The multi-tier memory device of claim 1, wherein:

each of the electrically conductive layers within the first-tier alternating stack has a respective first bridge region having a first part of the respective strip width and a respective second bridge region having a second part of the respective strip width;

the first bridge region is located between the first backside trench fill structure and a second backside trench fill structure of the trench fill structures along the second horizontal direction;

a first one of the pair of first retro-stepped dielectric material portions is located between the first and the second bridge regions along the second horizontal direction; and each of the electrically conductive layers within the second-tier alternating stack has one bridge region having the respective strip width between the first and the second backside trench fill structures along the second horizontal direction.

3. The multi-tier memory device of claim 1, wherein:

each of the pair of second retro-stepped dielectric material portions contacts the respective lengthwise sidewall of the first backside trench fill structure between a horizontal plane including bottommost surfaces of the pair of second retro-stepped dielectric material portions and a horizontal plane including topmost surfaces of the pair of second retro-stepped dielectric material portions; and each of the pair of first retro-stepped dielectric material portions is laterally spaced from and does not contact the first backside trench fill structure.

4. The multi-tier memory device of claim 3, wherein:

the backside trench fill structures comprise a second backside trench fill structure and a third backside trench fill structure that are nearest neighboring backside trench fill structures of the first backside trench fill structure;

each of the pair of first retro-stepped dielectric material portions is not in contact with and is laterally spaced along the second horizontal direction from the second backside trench fill structure and the third backside trench fill structure; and each of the pair of second retro-stepped dielectric material portions is not in contact with and is laterally spaced along the second horizontal direction from the second backside trench fill structure and the third backside trench fill structure.

5. The multi-tier memory device of claim 1, wherein a width of one of the pair of first retro-stepped dielectric material portions along the second horizontal direction is greater than a width of one of the pair of second retro-stepped dielectric material portions along the second horizontal direction.

6. The multi-tier memory device of claim 1, wherein a pair of third retro-stepped dielectric material portions of the retro-stepped dielectric material portions is located at a third-tier level that overlies the second-tier level, and comprises a respective pair of bottommost surfaces that are in direct contact with the first backside trench fill structure.

7. The multi-tier memory device of claim 1, further comprising layer contact via structures vertically extending through the retro-stepped dielectric material portions, and contacting a respective one of the electrically conductive layers.

* * * * *